(12) United States Patent
Kawabata

(10) Patent No.: US 8,330,095 B2
(45) Date of Patent: Dec. 11, 2012

(54) SAFETY PHOTOELECTRIC SWITCH

(75) Inventor: Shinji Kawabata, Osaka (JP)

(73) Assignee: Keyence Corporation, Osaka (JP)

( * ) Notice: Subject to any disclaimer, the term of this patent is extended or adjusted under 35 U.S.C. 154(b) by 485 days.

(21) Appl. No.: 12/644,447

(22) Filed: Dec. 22, 2009

(65) Prior Publication Data

US 2010/0194583 A1    Aug. 5, 2010

(30) Foreign Application Priority Data

Jan. 31, 2009  (JP) .................................. 2009-021046

(51) Int. Cl.
*H01J 40/14* (2006.01)

(52) U.S. Cl. ................... 250/221; 250/559.38; 356/5.01; 340/512; 340/555

(58) Field of Classification Search .................. 250/221, 250/222.1, 222.2, 206.1, 559.29, 559.38; 356/3.01, 4.01, 4.07, 5.01, 5.05; 340/506, 340/512, 555, 556, 557

See application file for complete search history.

(56) References Cited

U.S. PATENT DOCUMENTS

| | | | |
|---|---|---|---|
| 4,464,014 A | | 8/1984 | Sick et al. |
| 4,662,707 A | | 5/1987 | Teach et al. |
| 4,668,859 A | | 5/1987 | Winterer |
| 4,738,529 A | | 4/1988 | Hug |
| 4,830,489 A | | 5/1989 | Cain et al. |
| 5,137,354 A | | 8/1992 | deVos et al. |
| 5,180,922 A | | 1/1993 | Hug |
| 5,455,669 A | | 10/1995 | Wetteborn |
| 5,805,468 A | * | 9/1998 | Blohbaum ................... 702/176 |
| 6,753,776 B2 | | 6/2004 | Drinkard |
| 6,894,623 B2 | | 5/2005 | Hama et al. |
| 6,979,814 B2 | | 12/2005 | Kudo et al. |
| 7,135,672 B2 | | 11/2006 | Land |
| 7,598,484 B2 | | 10/2009 | Yamaguchi |
| 8,069,007 B2 | | 11/2011 | Oh |
| 2008/0296474 A1 | * | 12/2008 | Yamaguchi ................. 250/206.1 |

(Continued)

FOREIGN PATENT DOCUMENTS

DE          3606594 A1       9/1987

(Continued)

OTHER PUBLICATIONS

Kumekawa et al., "'Safety confirmation-type' measures for AGV collision prevention," Proceedings of the 5th International Conference Automated Guided Vehicle Systems, Oct. 1987, pp. 207-218 (13 pages).

(Continued)

*Primary Examiner* — Kevin Pyo
(74) *Attorney, Agent, or Firm* — Kilyk & Bowersox, P.L.L.C.

(57) ABSTRACT

There is provided an optical scanning type photoelectric switch capable of preventing interference with another photoelectric switch by use of its own capability, wherein, as for light projection pulse periods of the first and second optical scanning type photoelectric switches, the period is set to 30 μs in the first optical scanning type photoelectric switch while the period is set to 33 μs in the second optical scanning type photoelectric switch 1B, the light projection pulses have the same pulse width, and by setting the light projection periods different between the first and second optical scanning type photoelectric switches, even if mutual interference occurs between any optical axes, a phase difference of 36 degrees in rotation period is generated therebetween in a next scan, thereby preventing occurrence of the interference in succession in a plurality of times of scanning.

6 Claims, 43 Drawing Sheets

U.S. PATENT DOCUMENTS

| | | |
|---|---|---|
| 2009/0283666 A1 | 11/2009 | Tagashira |
| 2009/0287453 A1 | 11/2009 | Oh |
| 2009/0289791 A1 | 11/2009 | Onishi |
| 2009/0295577 A1 | 12/2009 | Yamaguchi |
| 2009/0295580 A1 | 12/2009 | Inoue et al. |
| 2010/0193668 A1 | 8/2010 | Kawabata |
| 2010/0198365 A1 | 8/2010 | Kawabata et al. |

FOREIGN PATENT DOCUMENTS

| | | |
|---|---|---|
| DE | 3735905 A1 | 5/1989 |
| JP | H1-158376 | 6/1989 |
| JP | H036408 | 1/1991 |
| JP | 03-175390 | 7/1991 |
| JP | 04-310890 | 11/1992 |
| JP | H04310890 | 11/1992 |
| JP | 2002-296361 | 10/2002 |
| JP | 2003-020147 | 1/2003 |
| JP | 2009-276164 | 11/2009 |
| WO | 9205455 A1 | 4/1992 |

OTHER PUBLICATIONS

Nishide et al., "Automatic Position Findings of Vehicle by Means of Laser," Proceedings 1986 IEEE International Conference on Robotics and Automation, Apr. 1986, pp. 1343-1348 (7 pages).

Office Action issued by the U.S. Patent and Trademark Office in co-pending U.S. Appl. No. 12/645,748 dated Jun. 25, 2012 (12 pages).

* cited by examiner

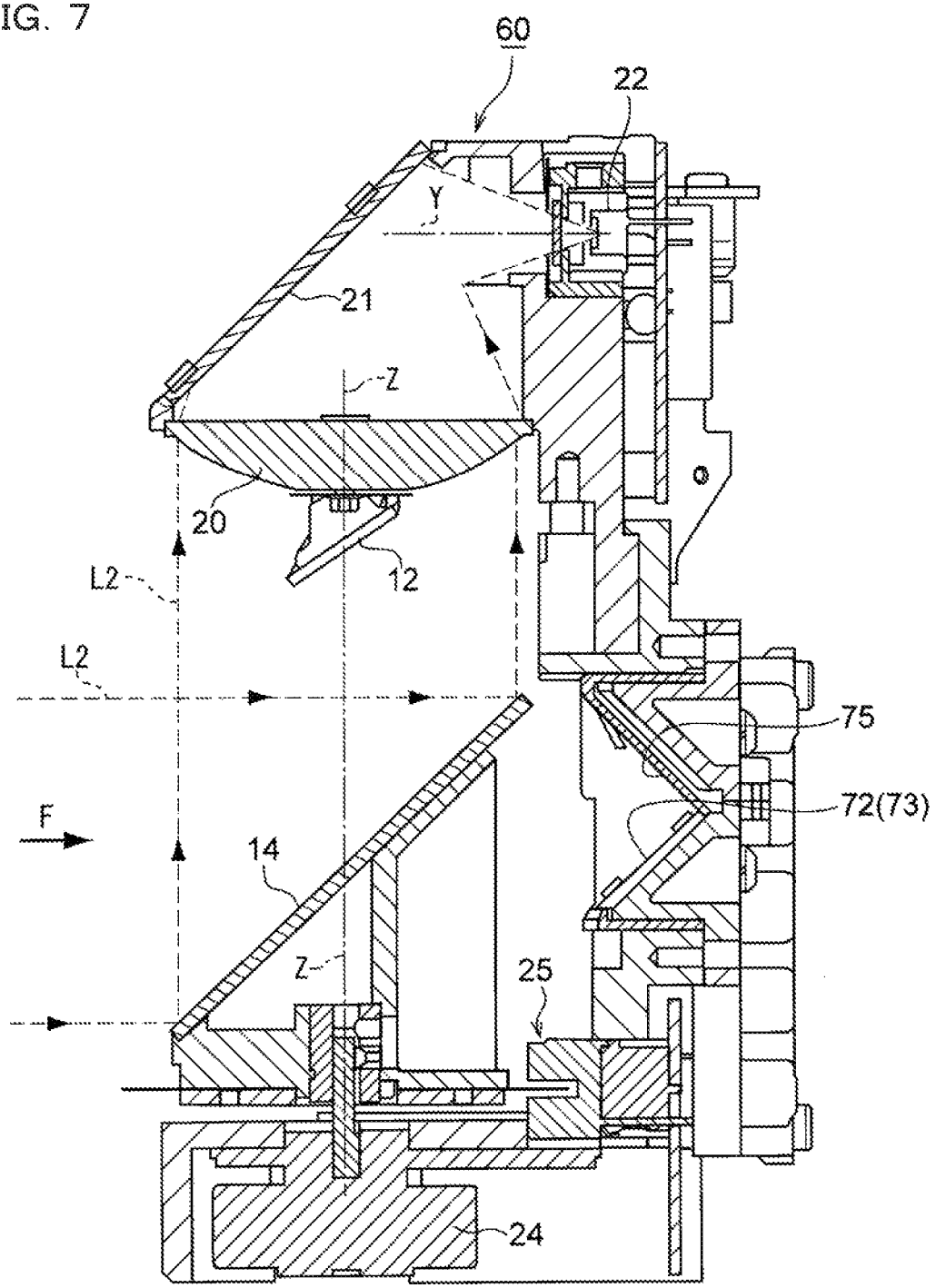

MEASUREMENT AREA

FIG. 20

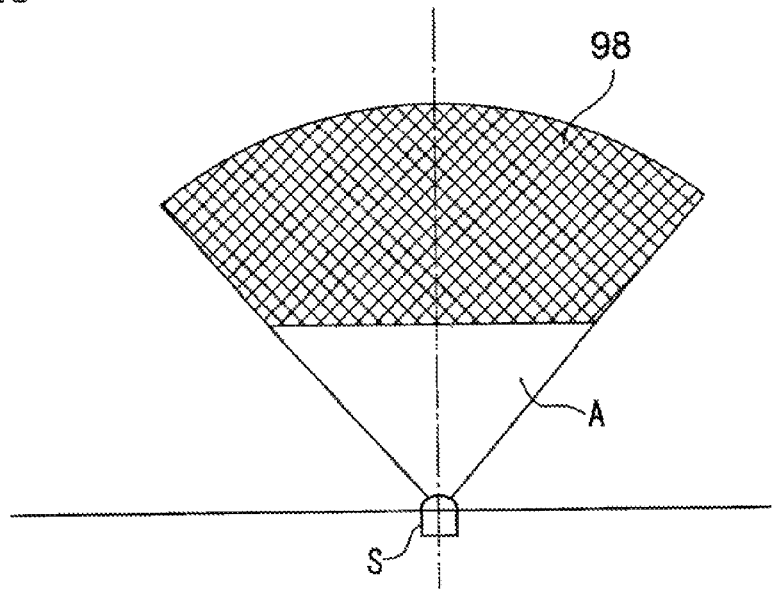

FIG. 21

```
ADDITIONAL FUNCTIONS
  ○ NOT USED
  ○ BANK FUNCTION
  ⊙ MUTING FUNCTION
  ○ SUSPENSION FUNCTION ON TEACH MODE

SETTING OF MUTING START CONDITIONS
  ORDER OF MUTING INPUTS   | MUTING INPUT 1 → MUTING INPUT 2 (INITIAL VALUE) |
  TIME DIFFERENCE IN MUTING INPUT  0.04 SECONDS TO | 3 SECONDS     ▽ |
                                                   | (INITIALIZED)   |

SETTING OF MUTING RESET CONDITIONS
  TIME LIMIT FOR MUTING CONTINUATION        | NO LIMIT             ▽ |
                                            | 1 MINUTE               |
                                            | 5 MINUTES (INITIALIZED)|
                                            | 10 MINUTES             |
                                            | NO LIMIT               |
SETTING OF OVERWRITING RESET CONDITIONS
  TIME LIMIT FOR OVERWRITING CONTINUATION   | 1 MINUTE (INITIALIZED)▽|
```

SAFETY PHOTOELECTRIC SWITCH

CROSS REFERENCE TO RELATED APPLICATIONS

The present application claims foreign priority based on Japanese Patent Application No. 2009-021046, filed Jan. 31, 2009, the contents of which is incorporated herein by reference.

BACKGROUND OF THE INVENTION

1. Field of the Invention

The present invention relates to a safety photoelectric switch.

2. Description of the Background Art

As seen in Japanese Patent Application Laid-Open No. H4-310890 and Japanese Patent Application Laid-Open No. H3-175390, an optical scanning type photoelectric switch is known which two-dimensionally performs scanning with light to detect an object while detecting a position of this object. As also referred to as a safety scanner, a safety laser scanner, and the like, this optical scanning type photoelectric switch provides a protection area around a machine, a robot or the like as a danger source, and outputs to the danger source a safety signal not permitting its operation when an operator or the like enters this protection area.

Since this optical scanning type photoelectric switch scans a two-dimensional plane in a broad range, when another photoelectric switch is present adjacently thereto, a problem of interference with this another photoelectric switch tends to occur. Since the optical scanning type photoelectric switch measures a distance to the object based upon a time difference between a light projection timing of a light projection pulse and a light reception timing of reflected light from the object, when interference with another photoelectric switch occurs, the optical scanning type photoelectric switch may measure a distance to the object, which is different from an actual distance thereto. Needless to say, the optical scanning type photoelectric switch is safety equipment, and supplies the danger source with an operation non-permitting signal when the operator enters the protection area set around the danger source. Accordingly, for the optical scanning type photoelectric switch, the occurrence of the interference with another photoelectric switch is a problem that should be avoided, and in the conventional techniques, an installed height or an installed position of the optical scanning type photoelectric switch is adjusted, thereby to avoid this interference problem.

SUMMARY OF THE INVENTION

Although adjusting the installed height or the like of the optical scanning type photoelectric switch as a measure against the interference with another photoelectric switch is one effective measure, when a light curtain is wished to be formed by the optical scanning type photoelectric switch at a desired height, another adjustment measure needs to be adopted for preventing the interference with another photoelectric switch.

An object of the present invention is to provide an optical scanning type photoelectric switch capable of preventing interference with another photoelectric switch by use of its own capability.

According to the present invention, the technical problem is accomplished by providing an optical scanning type photoelectric switch, which performs two-dimensional scanning with light projection pulse to detect an object, and also measures a distance to the object to sense a two-dimensional position of the object, the switch having: a storage device for accepting and storing a change in a light projection period of the light projection pulse, a scanning period for scanning with the light projection pulse or a phase of the light projection pulse with respect to the light projection period; a light projection/reception controlling device for controlling light projection/reception based upon the light projection period or the scanning period stored in the storage device; and a safety signal output controlling device for switching a safety signal from a permission signal to a non-permission signal when light reflected by the object is received and it is determined that a position of the object is inside a protection area at least twice in succession.

Even when the interference with another photoelectric switch occurs once, the light projection period, the scanning period or the phase of the light projection pulse with respect to the light projection period is changed, so as to prevent the interference from occurring twice in succession. Therefore, when it is determined at least twice in succession that the position of the object is inside the protection area, the non-permission signal is outputted, so that a problem concerning the interference with another photoelectric switch can be solved.

In a preferred embodiment of the present invention, the light projection pulse has a predetermined pulse width, and the light projection period or the scanning period is changed without changing the pulse width of the light projection pulse. Accordingly, even when the light projection period or the scanning period is changed, an influence by the change upon a detection sensitivity can be suppressed.

The other objects and action effects of the present invention are made obvious from detailed descriptions of working examples.

BRIEF DESCRIPTION OF THE DRAWINGS

FIG. 7 is a vertical sectional view for explaining an internal structure of the optical scanning type photoelectric switch related to the present invention;

FIG. 20 is a diagram for explaining the protection area with the muting area set therein;

FIG. 21 is a muting setting screen for setting a variety of functions and the muting time in the muting area;

FIG. 55 is a flowchart for explaining a processing procedure for shifting the optical scanning type photoelectric switch to a safety state by detecting a contamination or the like of the reference object built in the optical scanning type photoelectric switch by means of the reference light reception intensity stored into the memory by the procedure of FIG. 53 upon generation of the contamination or the like.

DETAILED DESCRIPTION OF THE PREFERRED EMBODIMENTS

Examples

Figure 1:
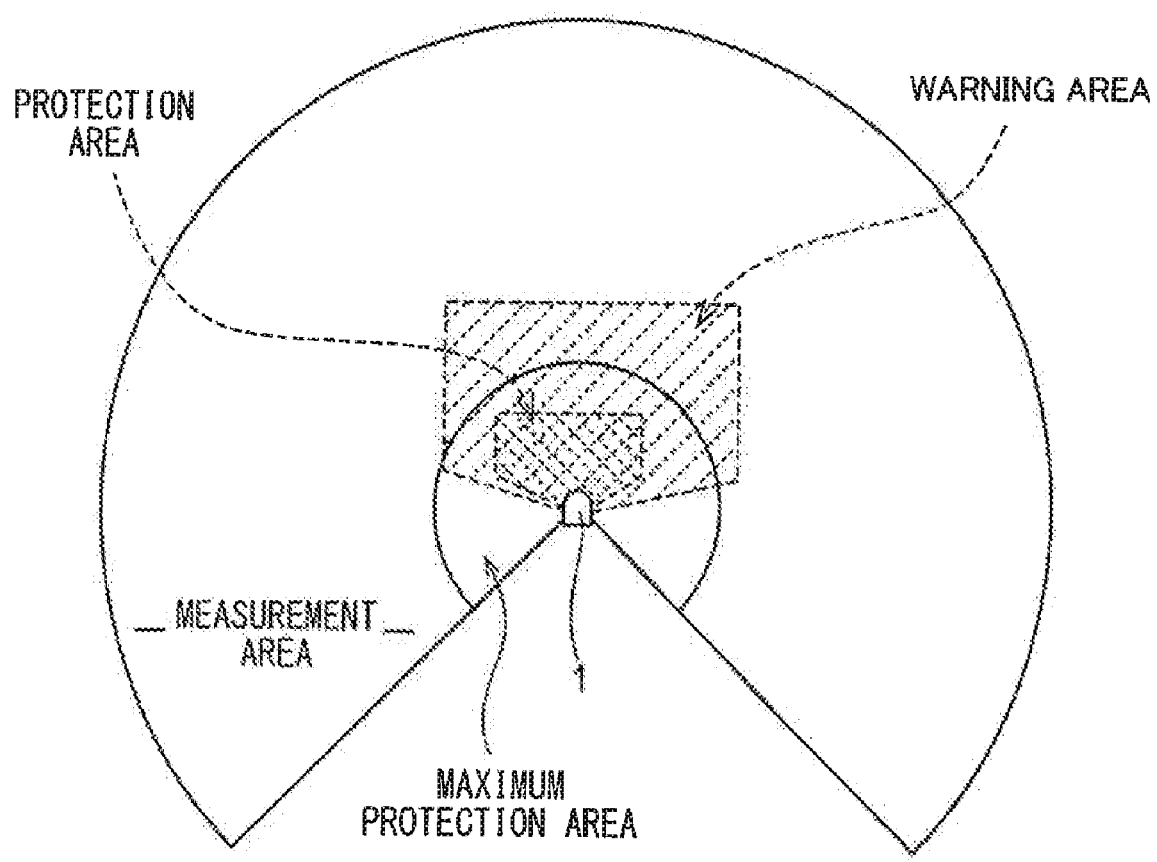
FIG. 1 is a view for explaining basic terms of an optical scanning type photoelectric switch.

With reference to FIG. 1, as generalities, basic terms of an optical scanning type photoelectric switch: "measurement area"; "maximum protection area"; "warning area"; and "protection area", are described. The "maximum protection area" means a region where objects having a variety of reflection factors from a low reflection factor object to a high reflection factor object, which are stipulated by the safety standard, are detectable by the optical scanning type photoelectric switch. The "measurement area" means a region where an object having a standard reflection factor is detectable by the optical scanning type photoelectric switch, and this "measurement area" completely includes the "maximum protection area".

As is known, the optical scanning type photoelectric switch is used to two-dimensionally scan the maximum protection area with light such as laser light and monitor scanning light reflected from the maximum protection area, thereby to monitor safety inside the area.

The "measurement area" and "maximum protection area" are ones specific to each optical scanning type photoelectric switch, and are not areas settable by the user. On the other hand, the "protection area" and the "warning area" are areas settable by the user. The "protection area" can be settable only inside the "maximum protection area". Meanwhile, the "warning area" is settable inside the "measurement area".

Figure 2:
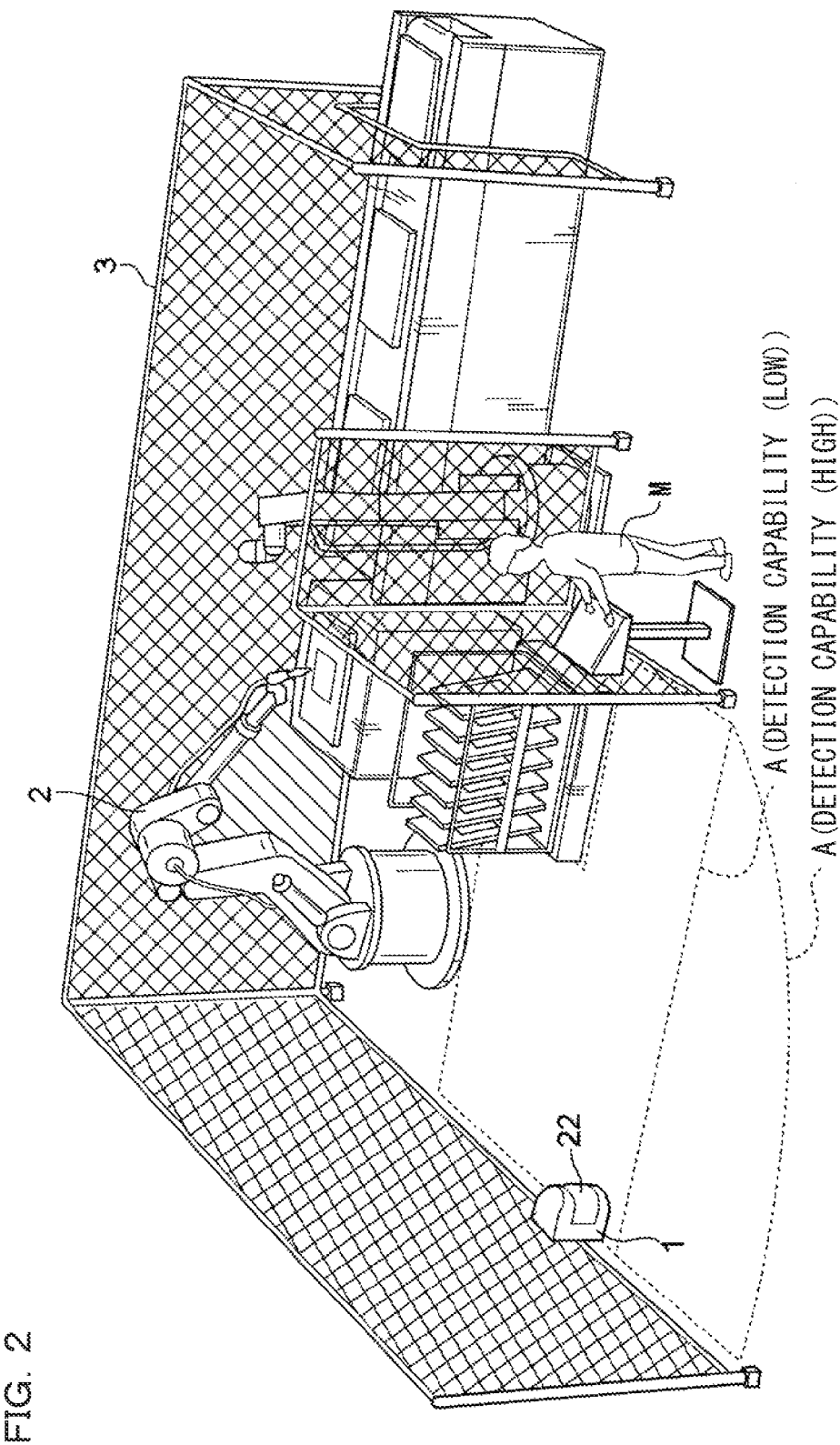
FIG. 2 is a view for explaining an example of applying an optical scanning type photoelectric switch related to the present invention.

With reference to FIG. 2, the maximum protection area of the optical scanning type photoelectric switch 1 to which the present invention has been applied is an area having a radial distance of about 4 meters, and as described above, the "protection area" is settable by the user with a restriction to the inside of this maximum protection area having the radial distance of about 4 meters.

The "protection area" is made to correspond to a safety output for halting a startup and an operation of a machine (e.g. robot), and for example when an operator enters this "protection area", the optical scanning type photoelectric switch 1 supplies the machine with a safety output indicating non permission of operation, namely an OFF-state output.

The "warning area" is not made to correspond to the safety output, but made to correspond to a non-safety output (normal output) issuing an alert about getting closer to the machine. Further, a scan angle of the optical scanning type photoelectric switch 1 is 270 degrees at the maximum, and the protection area and the warning area can be settable to an area in the rear of the optical scanning type photoelectric switch 1.

In the example of FIG. 2, an operation area of a robot 2 and an area installed with a conveyance apparatus are partitioned by a protective fence 3, and an area adjacent to the operation area of the robot 2 in the area defined by this protective fence 3 is set as a protection area A. The optical scanning type photoelectric switch 1 is installed for monitoring this protection area A. For example when an operator M enters the protection area A, the entry is immediately sensed by the optical scanning type photoelectric switch 1. It is to be noted that as for the protection area A illustrated in FIG. 2, a protection area A (low) having a relatively low detection capability and a protection area A (high) having a relatively high detection capability are prepared. These two kinds of protection areas having different detection capabilities, the protection area A (low) and the protection area A (high), are effective in the case of the optical scanning type photoelectric switch 1 being provided with a plurality of output systems which are described later.

Figure 3:
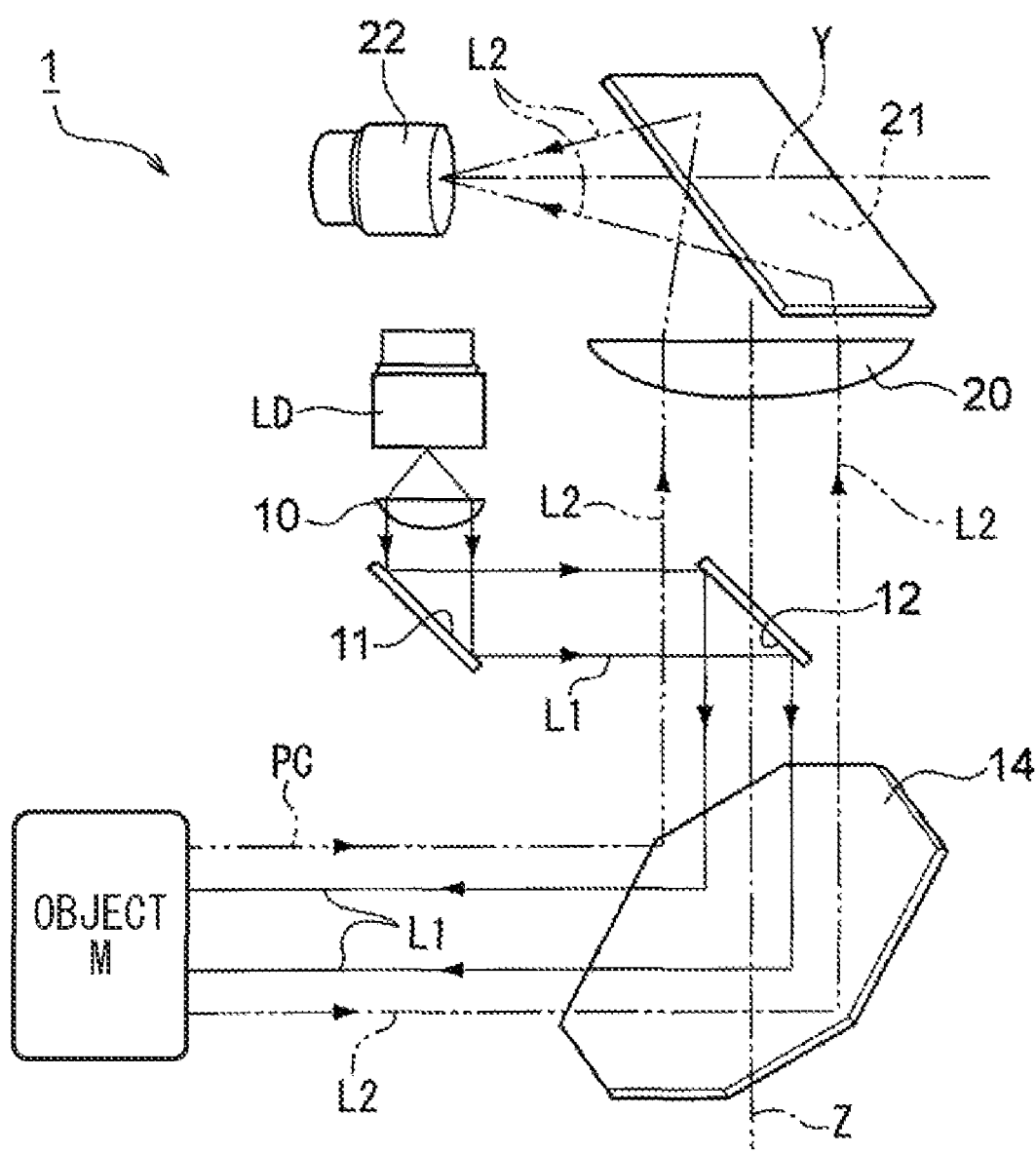
FIG. 3 is a view for explaining a configuration of an optical system of the optical scanning type photoelectric switch related to the present invention.

FIG. 3 is a view for explaining a basic structure of an optical system of the optical scanning type photoelectric switch 1. With reference to FIG. 3, elements of the optical system of the optical scanning type photoelectric switch 1 are described.

Light Path:

The optical scanning type photoelectric switch 1 executes detection with laser light having a wavelength included in an infrared ray region. The optical scanning type photoelectric switch 1 scans a horizontal surface with laser light at a predetermined pitch and receives reflected light therefrom, to detect an entry person or an object M.

Light Irradiation Device:

In FIG. 3, reference symbol LD denotes a light projecting element. Laser light L1 emitted by the light projecting element LD passes through a light projecting lens 10, polarized by first and second mirrors (reflection mirrors) 11, 12 for light projection, and travels downward in a direction along a predetermined vertical first axis line Z. Therefore, the light projecting lens 10 and the first and second mirrors 11, 12 for light projection constitute a light irradiation device for performing irradiation with the laser light L1 along the vertical first axis line Z. The light projecting element LD emits the laser light L1 in pulse form intermittently in a fixed period, and this laser light is emitted from the light projecting element LD at every 0.36 degrees.

It is to be noted that, as would been understood by the skilled person in the art from the following description, a detection theory of the optical scanning type photoelectric switch 1 does not utilize a characteristic specific to laser light such as light coherence. It thus goes without saying that a laser light source as a light projecting source of the optical scanning type photoelectric switch 1 is merely an example, and the light source is not restricted to this laser light, but a variety of light sources can be adopted. Incidentally, a laser diode is a high-luminance point light source, and excellent in high-speed response at the time of pulse light emission. Therefore, the laser diode can be preferably adopted as the light source of the optical scanning type photoelectric switch 1.

Optical Scanning Device 14:

The laser light L1 polarized by the second mirror 12 for light projection in the direction along the vertical first axis line Z travels toward an optical scanning device 14 located below the second mirror 12. The optical scanning device 14 is configured of a scanning mirror arranged in the state of being inclined from the vertical first axis line Z by substantially 45 degrees. This scanning mirror 14 is rotationally driven with the vertical first axis line Z at the center. The optical scanning device (scanning mirror) 14 is rotationally driven by a motor 24 (FIG. 7) (not shown in FIG. 3). As shown by dotted lines in FIG. 4B, the laser light L1 scans the horizontal surface orthogonal to the vertical first axis line Z by a rotational operation of the scanning mirror 14 with the vertical first axis line Z at the center. Reference symbol A shown in FIG. 4B denotes a "protection area" exemplarily set, and reference symbol B denotes a "maximum protection area".

It is to be noted that, although the scanning mirror 14 is configured of an axis rotational mirror used in both light projection and light reception in the illustrated example, as a modified example, such a configuration may be adopted where light projection and light reception are constituted of individual scanning mirrors, the scanning mirror for light projection and the scanning mirror for light reception are arranged at the same axis and also arranged so as to face the same direction, and then synchronously rotated.

Received Light Reflecting Body 21, Photoelectric Conversion Element 22:

When the object M is present in the warning area or the protection area A, reflected light L2 reflected by this object M is inputted into the optical scanning type photoelectric switch 1, and this reflected light L2 is reflected by the scanning mirror 14, and then collected by a light receiving lens 20 (FIG. 3). The light receiving lens 20 has an optical axis agreeing with the vertical first axis line Z, and the reflected light L2 collected by the light receiving lens 20 is polarized by a received light reflecting body 21, and collected into a photoelectric conversion element 22 as a light receiving element.

Continuously referring to FIG. 3, the received light reflecting body 21 is arranged as being inclined from the vertical first axis line Z by substantially 45 degrees, and the optical axis of the reflected light L2 collected by the light receiving lens 20 is polarized by this received light reflecting body 21 in a direction along a second axis line Y in a lateral direction substantially orthogonal to the vertical first axis line Z, and the reflected light L2 after this polarization is received by the photoelectric conversion element 22. Upon receipt of the reflected light L2, the photoelectric conversion element 22 performs photoelectric conversion, to generate a light reception signal.

Figure 4A:
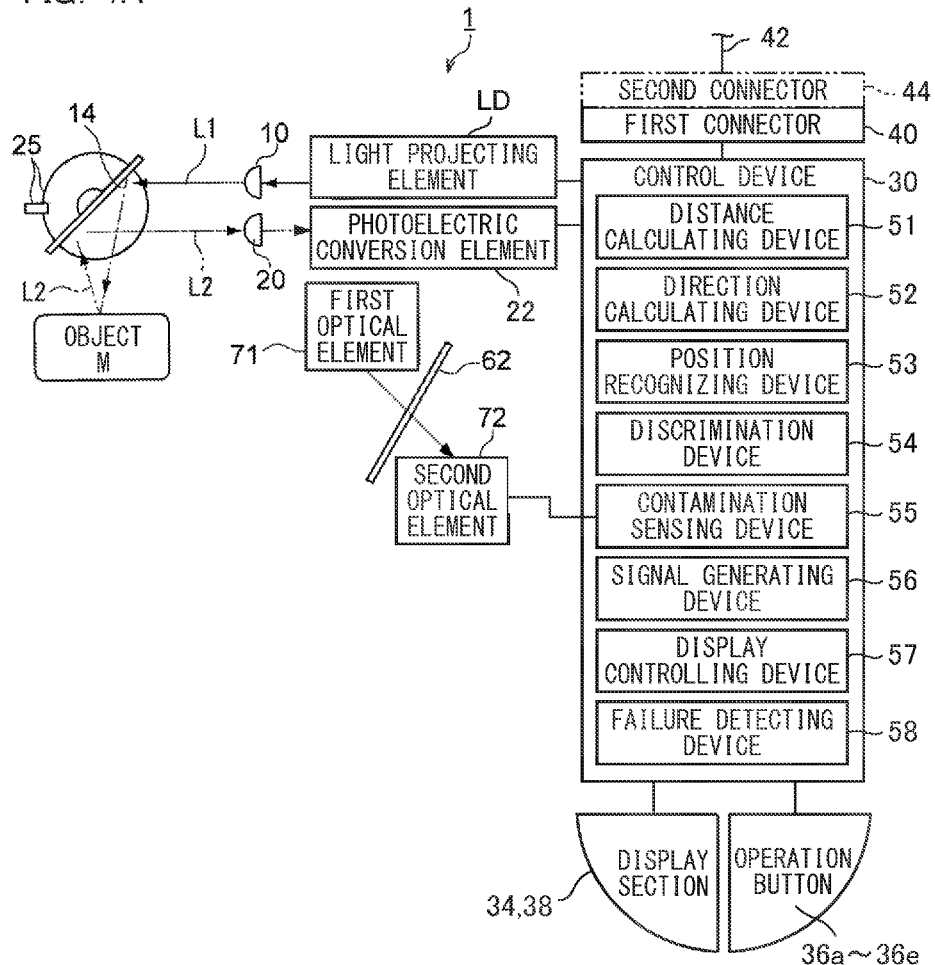
FIG. 4A is a diagram showing a whole configuration of the optical scanning type photoelectric switch of FIG. 3.
Figure 4B:
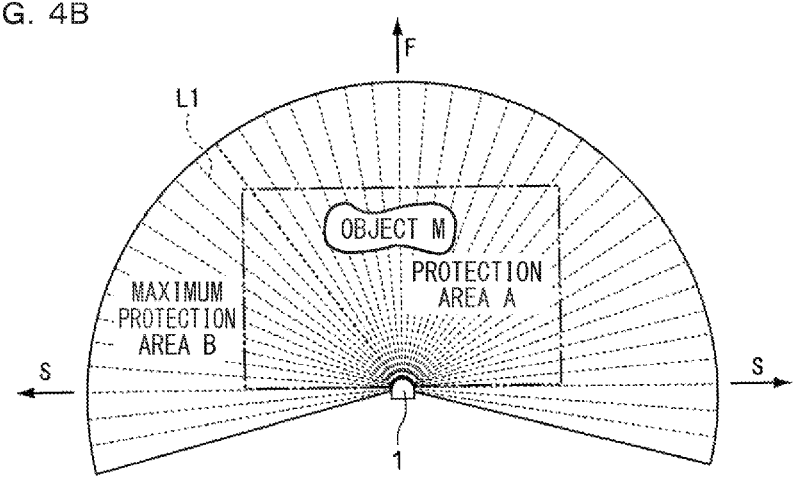
FIG. 4B is a view for explaining a protection area and an warning area.

With reference to FIG. 4A, the optical scanning type photoelectric switch 1 has a control device 30 configured of a CPU, a microcomputer including a memory, an FPGA, and the like. FIG. 4A shows a total system of the optical scanning type photoelectric switch 1 in terms of a block diagram. The light projecting element LD is controlled by the control device 30, and a signal of the photoelectric conversion element 22 is inputted into the control device 30.

Figure 5:
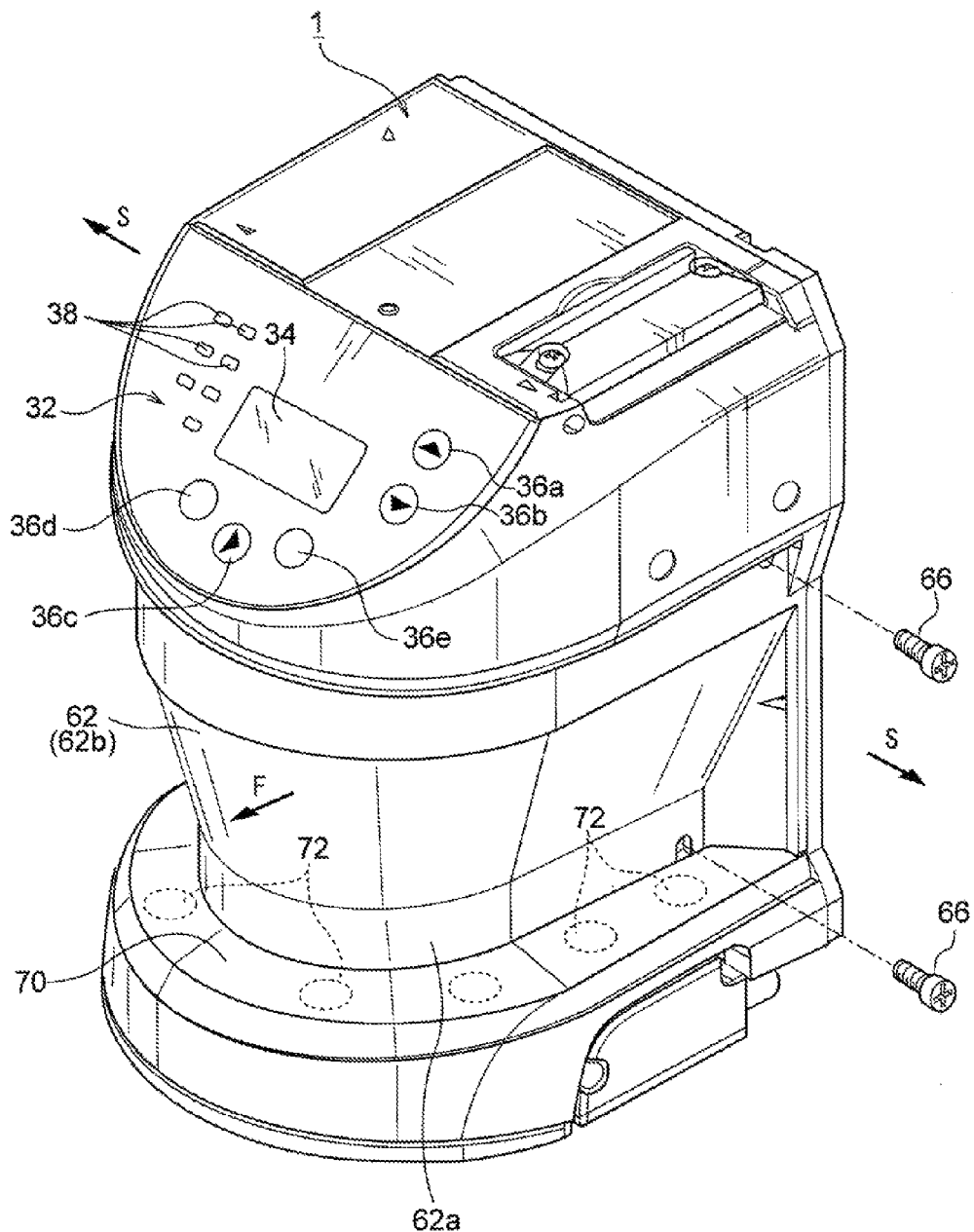
FIG. 5 is an external view of the optical scanning type photoelectric switch related to the present invention.

External Configuration of Optical Scanning Type Photoelectric Switch 1:

With reference to FIG. 5, the optical scanning type photoelectric switch 1 has a user interface section 32 located as inclined toward the front surface of the top end of the switch. With the user interface section 32 arranged as inclined, an area of the user interface section 32 can be expanded and also becomes easily accessible by the user.

In the inclined user interface section 32, a rectangular liquid crystal display section 34 is provided at its center portion, and a plurality of touch-tone operation buttons 36 are arranged on one side to and below the liquid crystal display section 34. Further, on the other side to the liquid crystal display section 34, a plurality of LED indicators 38 are arranged while separated vertically into lateral two columns, and an operating state of the optical scanning type photoelectric switch 1 is indicated by these plurality of the LED indicators 38.

Figure 6A:
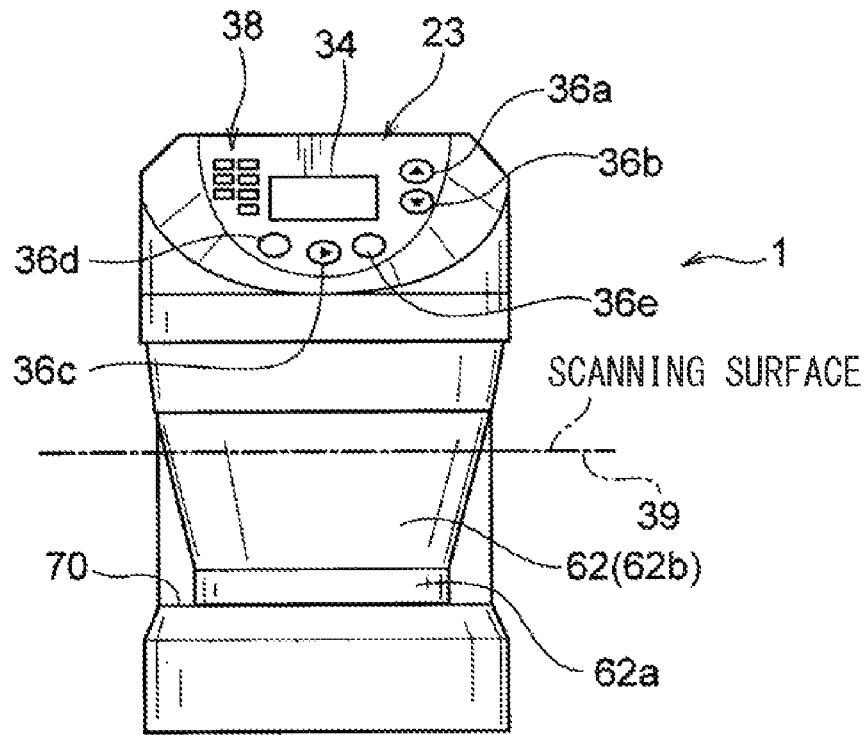
FIG. 6A is a front view of the optical scanning type photoelectric switch related to the present invention.
Figure 6B:
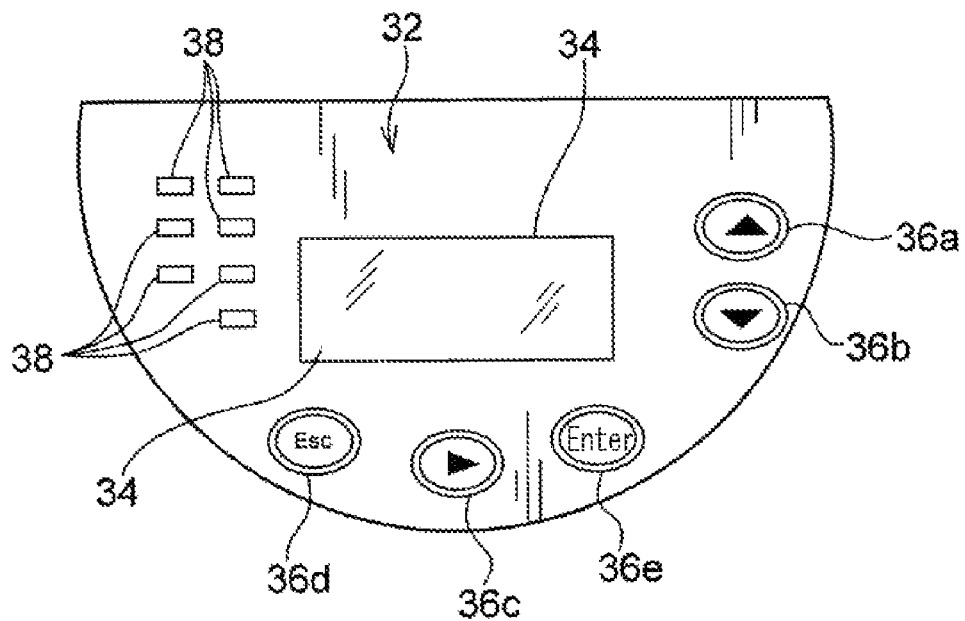
FIG. 6B is a view of a user interface section having been extracted and seen from the user side.

In FIG. 6B, the user interface section 32 is extracted and then two-dimensionally illustrated. On the right side to the liquid crystal display section 34 when seen from a position facing the user interface section 32, buttons 36a, 36b provided with up and down marks are arranged. Below the liquid crystal display section 34, a button 36d provided with letters of Esc is arranged on the left side and a button 36e provided with letters of Enter is arranged on the right side, sandwiching therebetween a center button 36c provided with a right arrow.

Obliquely inclining the user interface section 32 to expand its area can arrange the relatively large liquid crystal display section 34. On top of this, the plurality of touch-tone operation buttons 36 can be arranged in the user interface section 32, and with these operation buttons 36 installed on the optical scanning type photoelectric switch 1, a design can be made where a setting operation for a setting required by the user can be performed directly on the optical scanning type photoelectric switch 1 without an external personal computer as a terminal with a display. Here, the liquid crystal display section 34 can be displayed with 12 letters by four rows, and information necessary for the user is provided by means of the liquid crystal display section 34 capable of displaying relatively a large amount of information as thus described, thereby allowing the user to perform a necessary setting operation only by operating the operation buttons 36 while looking at the liquid crystal display section 34 without the external personal computer.

Especially in the case of setting a function directly related to the safety, for example in setting the "protection area", it is necessary to make the user verify whether a setting is correctly performed, and the setting of the function directly related to the safety, namely the setting of the "protection area" in this case, is reflected only after completion of a verifying operation by the user. The verifying operation by the user is executed in the following procedure. The optical scanning type photoelectric switch 1 is designed such that, successively to a setting input, setting contents, which were inputted by a user and have not been reflected, are displayed in the liquid crystal display section 34 by means of letters, figures, symbols, and the like. While it is as described above that the user is made to verify whether or not the contents displayed in the liquid crystal display section 34 agree with contents to be set, it is designed so as to request for the user to make an OK instruction accompanied by an operation of the operation button 36 when the user determines the agreement. The optical scanning type photoelectric switch 1 then completes verification of the contents displayed in the liquid crystal display section 34 by receiving the OK instruction, and when there are unverified contents, the optical scanning type photoelectric switch 1 displays the contents in the liquid crystal display section 34 and waits for an OK instruction from the user. The optical scanning type photoelectric switch 1 completes the state of the verifying operation by receiving OK instructions concerning all the contents, and reflects the contents, the verifying operations on which have been completed, to the setting. On the other hand, when the user determines that the contents displayed in the liquid crystal display section 34 do not agree with the contents to be set, the user can instruct cancellation with the operation button 36. By accepting the cancellation instruction, the optical scanning type photoelectric switch 1 completes the verifying operation without reflecting all the inputted contents to the setting, and subsequently transits to the state of accepting a setting input. However, verification of inputted contents concerning a position and an area of the protection area A and the like is insufficient only by verification of agreement of displayed contents, and hence the user practically performs a verifying operation for the inputted contents concerning the position and the area of the protection area A and the like by holding a test body in a location corresponding to a position and an area to be set by the user after validating a distance measuring function that includes the optical system of the optical scanning type photoelectric switch 1. It is thus preferable to display in the liquid crystal display section 34 not only a screen for acceptance of setting of the function directly related to the safety but also a screen for making the user verify set contents, and execute the foregoing verification by the user with this verification screen.

FIG. 6A is a front view of the optical scanning type photoelectric switch 1, where a horizontal surface that is scanned with laser light, namely a scanning surface 39, is indicated by a lateral line. As seen from FIG. 7 illustrating an internal configuration of the optical scanning type photoelectric switch 1, the optical scanning type photoelectric switch 1 has an apparatus body 60 (FIG. 9) formed by unitizing mechanical components such as the optical scanning device (scanning mirror) 14 and the motor 24 for driving this, and at the bottom of the apparatus body 60, the motor 24 is arranged. At the rotational axis of the motor 24, for example, a photoelectric rotary encoder 25 is provided. The rotary encoder 25 has a plurality of slits equally spaced in a circumferential direction, and based upon an output depending upon light passing through these slits, a rotational angle of the optical scanning mirror 14 is calculated, so as to obtain polarized directions of the projected/received lights L1, L2.

Returning to FIG. 4A, the control device 30 is connected with the liquid crystal display section 34, the LED indicators 38 and the operation buttons 36. Further, the control device 30 is connected with a first connector 40, and this first connector 40 can be coupled with a connector 44 of an external cable 42 extending from external equipment.

The control device 30 is provided with a distance calculating device 51, a direction calculating device 52, a position recognizing device 53, a discrimination device 54, a contamination sensing device 55, a signal generating device 56, a display controlling device 57, a failure sensing device 58, and the like.

Distance Calculating Device 51:

The distance calculating device 51 calculates a distance to the object M based upon a light reception signal from the photoelectric conversion element 22 in each polarized direction. Namely, a distance to the object M can be calculated by multiplying a difference between the light projection timing of the scanning light L1 from the light projecting element LD and the light reception timing of the photoelectric conversion element 22 having received the reflected light L2 reflected by the object M by a known speed of light. The light projection timing is a predetermined period, and a production of this light projection timing and an angular speed of the motor 24 defines a space density of optical axes, namely an angle between optical axes. It is to be noted that the light projection timing may be defined with the "time", or may be defined with the "direction" or the "space density (angle between optical axes). The calculation of the distance based upon the light projection/reception timing may be repeatedly performed once every predetermined minute time, or may, for example, be executed in every light projection/reception in synchronous with the light projection timing.

Direction Calculating Device 52:

The direction calculating device 52 calculates in the light projection and the light reception an irradiated direction (polarized direction) of the scanning light L1 polarized by the optical scanning device 14 toward the measurement area and an incoming direction of the reflected light L2 from the object M. However, since the travelling time of light to and from the object M inside the "measurement area" is relatively sufficiently small with respect to the angular speed of the motor 24 and the irradiated direction and the incoming direction can thus be regarded as identical, either one of the irradiated direction and the incoming direction may be calculated. This polarized direction of the projected/received light L1, L2, namely the direction on the scanning surface (scanning direction), can be obtained by calculating the rotational angle of the optical scanning device 14 based upon the foregoing output from the rotary encoder 25. It is to be noted that in the case of defining the light projection timing with the direction or the space density (angle between optical axes), the polarized direction (scanning direction) is preferably set as the irradiated direction. Further, this direction is equivalent to an optical axis number.

Position Recognizing Device 53:

The position recognizing device 53 recognizes a position of the object M. Namely, the position recognizing device 53 calculates the position of the object M based upon the polarized direction (scanning direction) calculated by the direction calculating device 52 at every light projection/reception timing and the distance to the object M calculated by the distance calculating device 51 in this polarized direction, so as to recognize the position of this object M.

Discrimination Device 54:

The discrimination device 54 discriminates whether or not the object M is present inside the previously set protection area A based upon the position of the object M calculated by the position recognizing device 53. In addition, the discrimination device 54 may be configured so as to supply information indicating "present" when discriminating the presence of the object M inside the protection area even just once (in one period), or to supply information indicating "present" only after discriminating the presence of the object M inside the protection area over a plurality of periods.

Figure 8:
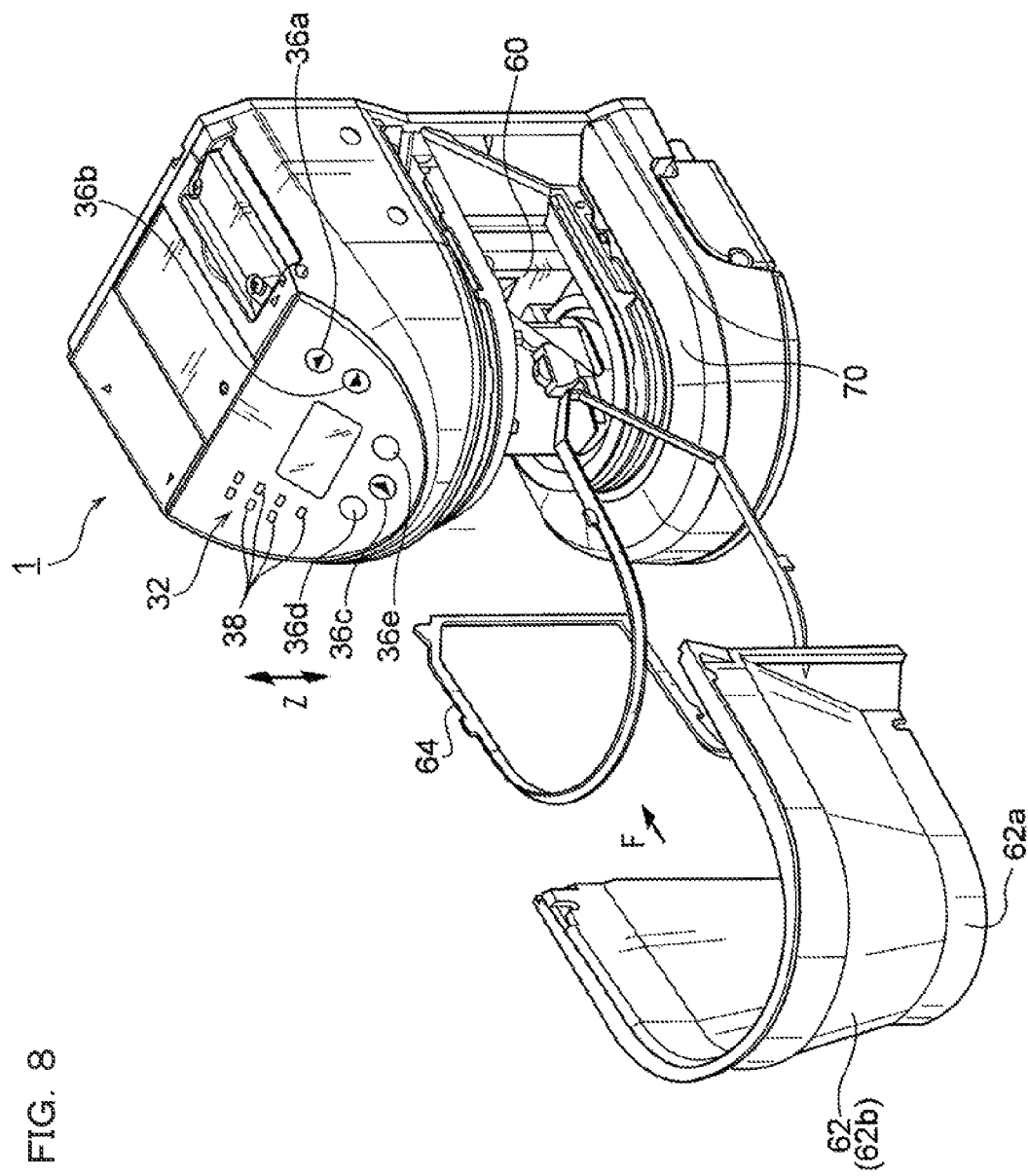
FIG. 8 is a view related to FIG. 5, with a light transmittance cover that forms a light projection window detached from the optical scanning type photoelectric switch.

The optical system of the optical scanning type photoelectric switch 1 is sealed by a light transmitting cover 62 with a U-shaped lateral cross section surrounding the front surface and both side surfaces of the lower half of the optical scanning type photoelectric switch 1, and this light transmitting cover 62 forms a light projection window. FIG. 8 illustrates a state where the light transmitting cover 62 has been detached. The light transmitting cover 62 is attached through a sealing member 64, and can be detached from the optical scanning type photoelectric switch 1 by unscrewing a plurality of bolts 66 (FIG. 5). The light transmitting cover 62 of the light projection window is an optical filter, and removes wavelength components other than laser light emitted by the optical scanning type photoelectric switch 1. Although the light transmitting cover 62 is made of an arbitrary material, here, it is made of an elastic transformable synthetic resin material.

As best seen from FIG. 7 as a sectional view of the apparatus body 60, the optical scanning device (scanning mirror) 14 is arranged at the front end apart from the rear surface section at the bottom of the apparatus body 60, and thereby, the vertical first axis line Z as the rotational axis line of the scanning mirror 14 is positioned as being offset relatively in front. On the other hand, the light transmitting cover 62 surrounds the front and both sides of the apparatus body 60, and both right and left ends of this light transmitting cover 62 extend to the rear surface of the optical scanning type photoelectric switch 1. Adopting such a configuration allows designing of the right and left areas and the front area, except for a portion interfering with the rear surface, of the optical scanning type photoelectric switch 1 as the scanning area (measurement area). The same applies to a case where the scanning mirror for light projection and the scanning mirror for light reception, which mutually synchronously rotate, are arranged at the same axis as well as being arranged so as to face the same direction, as described above as the modified example of the scanning mirror 14.

In this regard, as described above, the scanning range (measurement area) of the optical scanning type photoelectric switch 1 is 270 degrees, expanded to the rear from 180 degrees. The scanning range of the optical scanning type photoelectric switch 1 can be expanded to the rear in this manner basically by combination of two configurations: (1) a configuration is adopted where, on the scanning surface 39 (FIG. 6A), a width of the rear surface of the optical scanning type photoelectric switch 1 that interferes with the scanning surface 39 is restricted to a range of 90 degrees; and further, (2) the first axis line Z as the rotational axis line of the scanning mirror 14 is spaced from the rear surface of the optical scanning type photoelectric switch 1 and both side surfaces, mutually in parallel, of the light transmitting cover 62 with a U-shaped cross section are extended to the rear so that the whole area of the side areas and the front area, except for the rear surface, of the optical scanning type photoelectric switch 1 are surrounded by the light transmitting cover 62. In other words, the optical scanning type photoelectric switch 1 is slim and has a small height as compared with a conventional article, has a volume about half that of the conventional article, and has a size to such an extent as to be able to be easily placed on one's palm.

The shape of the light transmitting cover 62, namely a shape gradually expanded upward (FIGS. 5, 8), should also be noted. Further, as best seen from FIG. 4, a bottom section 62a of the light transmitting cover 62 is configured of a vertical wall, and a portion gradually expanding outward toward the top has an overhung shape. In the vertically intermediate portion of this overhung-shape portion 62b, the horizontal scanning surface 39 is set (FIG. 6).

It should be noted that, as best seen from FIG. 5, a portion in contact with the bottom of the light transmitting cover 62 is configured of a horizontal step section 70 protruding outside. First and second optical elements 71, 72 are arranged with the light transmitting cover 62 sandwiched therebetween (FIG. 4), and the second optical element 72 located outside the light transmitting cover 62 is arranged in the horizontal step section 70. In other words, the first optical element 71 is arranged inside the light transmitting cover 62, and this first optical element 71 is installed downward (toward the second optical element 72). Namely, the first and second optical elements 71, 72 in pairs are positioned as mutually opposed, and a plurality of sets of the first and second optical elements 71, 72 are provided on the periphery of the light transmitting cover 62 at appropriate spacings.

First and Second Optical Elements 71, 72:

The light transmitting cover 62 of the optical scanning type photoelectric switch 1 serves as a filter for blocking visible light. Naturally, a material that allows the scanning light L1 and the reflected light L2 to pass therethrough has been selected. When this light transmitting cover 62 is contaminated or deteriorates with time, its light transmittance decreases, causing a decrease in light amount of the reflected light L2 incident on the photoelectric conversion element 22. Needless to say, this phenomenon is undesirable since it causes deterioration in sensitivity for detecting a position of the object M.

Each set of the first and second optical elements 71, 72, which are mutually opposed with the light transmitting cover 62 sandwiched therebetween, continuously monitor a contamination state of the light transmitting cover 62. Light emitted by the first optical element 71 enters the second optical element 72 through the light transmitting cover 62, and an amount of this light received by the second optical element 72 is supplied to the control device 30.

Contamination Sensing Device 55:

By means of the amount of light received by the second optical element 72, the contamination sensing device 55 verifies that the light transmitting cover 62 holds a predetermined transmittance. A decrease in transmittance due to deterioration with time in light transmitting cover 62 constituting the light projection window, contamination thereof, or the like, can be sensed based upon the amount of light received by the second optical element 72. Here, when the amount of light received by the second optical element 72 is not larger than a predetermined threshold, the user may be notified by means of the liquid crystal display section 34 or the LED indicator 38 that it is the time for replacing the light transmitting cover 62. Further, the contamination sensing device 55 constitutes a failure detecting device for detecting whether or not the optical scanning type photoelectric switch 1 is out of order, namely a device for verifying whether or not the optical scanning type photoelectric switch 1 is in such a safe state as to be able to perform an intended detection or the like, and if the contamination sensing device 55 determines that the optical scanning type photoelectric switch 1 is out of order, the user is alerted by means of the liquid crystal display section 34 or the LED indicator 38 while an operation non-permitting signal is transmitted toward the external equipment through the signal generating device 56.

It is to be noted that, although the example was described where the first and second optical elements 71, 72 are arranged as mutually opposed with the light transmitting cover 62 sandwiched therebetween for detecting contamination and deterioration of the light transmitting cover 62, for example, a reflection mirror may be arranged on the horizontal step section 70 in place of the second optical element 72, light emitted by the first optical element 71 may be reflected by the reflection mirror, and the reflected light may be received by the second optical element 72 arranged adjacently to the first optical element 71. According to this example, the first and second optical elements 71, 72 are mutually closely arranged inside the light transmitting cover 62.

Signal Generating Device 56:

The signal generating device 56 generates a safety signal based upon a result of discrimination by the discrimination device 54. For example, on a predetermined mode, when a normal operation of the optical scanning type photoelectric switch 1 is verified and the discrimination device 54 determines that the object M is not present in the protection area A, the signal generating device 56 generates an ON signal (operation permitting signal) as a safety output, and this safety output is transmitted toward the external equipment via the control device 30 and the first connector 40 through the external cable 42, so that an operation of the external equipment is allowed.

The failure sensing device 58 serves to verify that the optical scanning type photoelectric switch 1 is in proper operation, and when the normal operation cannot be verified, the optical scanning type photoelectric switch 1 is regarded as being out of order.

Figure 9:
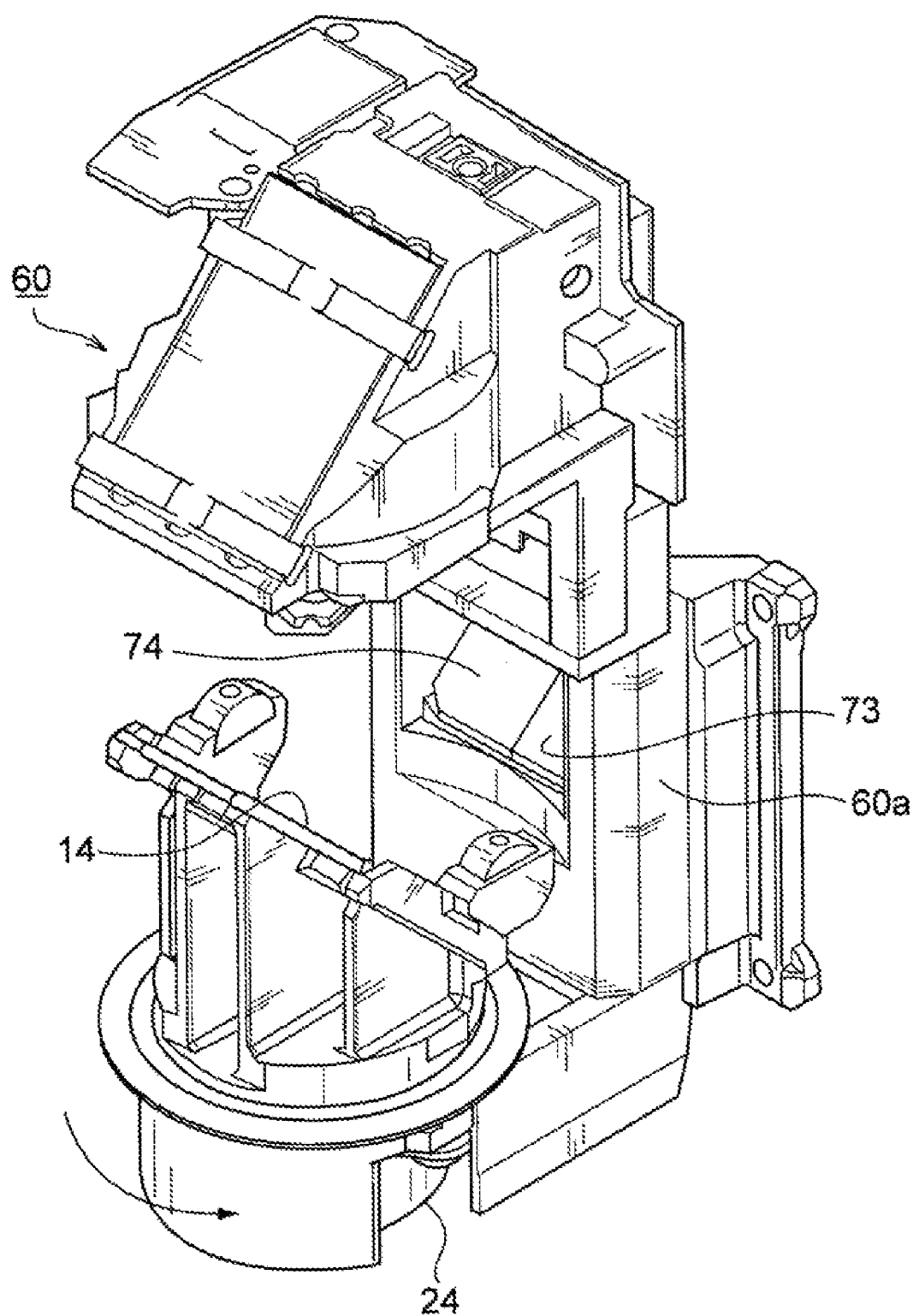
FIG. 9 is a perspective view of an apparatus body constituting the internal structure of the optical scanning type photoelectric switch related to the present invention, as well as a view showing a state where a scanning mirror faces the opposite side to a measurement area.
Figure 10:
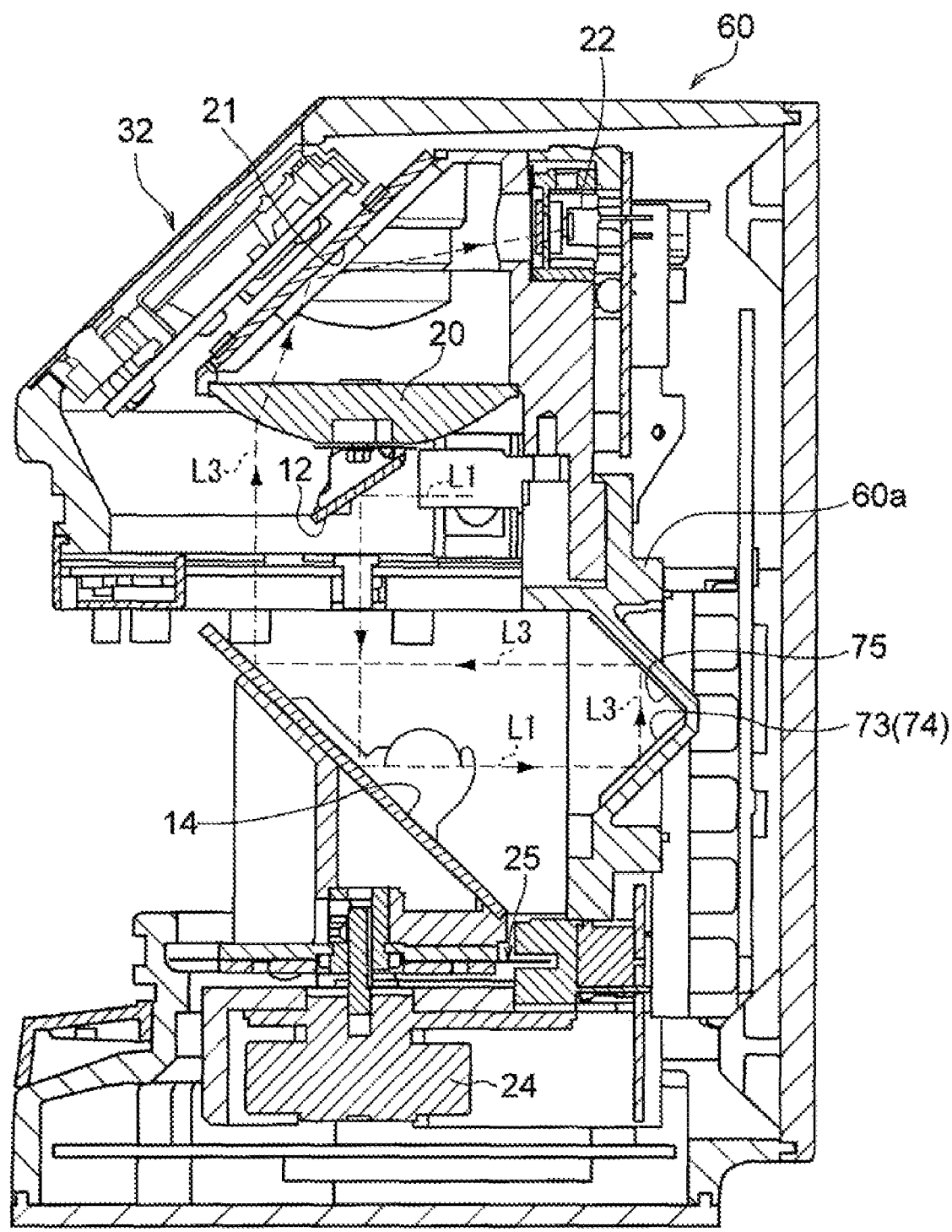
FIG. 10 is a sectional view of the apparatus body of FIG. 9.

Detection Sensitivity Holding/Adjusting Mechanism of Optical Scanning Type Photoelectric Switch 1:

FIGS. 9 and 10 each show a state where the optical scanning means, namely the scanning mirror 14, faces the rear surface of the optical scanning type photoelectric switch 1. Needless to say, in this state, detection by the optical scanning type photoelectric switch 1 is impossible. In a rising column portion 60a of the apparatus body 60, the two reflection surfaces, the first and second reflection surfaces 73, 74, as reference objects are arranged at positions where those reflection surfaces can face the scanning mirror 14 respectively on the lagging side and the leading side in the rotational direction of the scanning mirror 14, namely on the right and left, and these first and second reflection surfaces 73, 74 are arranged in the state of facing obliquely upward while being inclined by about 45 degrees. Further, as opposed to these first and second reflection surfaces 73, 74, a fixed mirror 75 inclined obliquely downward by about 45 degrees is arranged in the column portion 60a. That is, in the rising column portion 60a of the apparatus body 60, the first and second reflection surfaces 73, 74 are arranged in the state of facing obliquely upward at the positions to which the scanning mirror 14 is opposed when turning backward, and the fixed mirror 75 is arranged in the state of facing obliquely downward above the first and second reflection surfaces 73, 74.

The first and second reflection surfaces 73, 74 as the reference objects are made of materials with different reflection factors or have colors with different reflection factors. As a specific example, the first reflection surface 73 is made of a black material or colored black, and the second reflection surface 74 is made of a white material or colored white.

The laser pulse light L1 emitted by the light projecting element LD hits the scanning mirror 14 by means of the light projecting lens 10 and the first and second mirrors (reflection mirrors) 11, 12 for light projection, and the light is made by the scanning mirror 14 to become light that travels in a horizontal direction. When the scanning mirror 14 faces forward or sideward, this laser pulse light L1 is guided to the measurement area. Even when the scanning mirror 14 turns backward, in the midst of its 360-degree turn, by emission of the laser pulse L1, the laser pulse light L1 is first guided to the black first reflection surface 73 by the scanning mirror 14 facing backward, and subsequently guided to the white second reflection surface 74. This laser pulse light L1 is reflected by the first and second reflection surfaces 73, 74 facing obliquely upward and travels upward in a vertical direction (L3), and this reflected pulse light L3 is reflected by the fixed mirror 75 arranged above the first and second reflection surfaces 73, 74. With this fixed mirror 75 arranged in a posture facing obliquely downward by about 45 degrees, the reflected pulse light L3 reflected by the fixed mirror 75 returns to the scanning mirror 14, is reflected by this scanning mirror 14 and travels upward, to be collected by the photoelectric conversion element 22 through the light receiving lens 20 and the received light reflection body 21. That is, the pulse light L3 reflected by each of the first and second reflection surfaces 73, 74 is inputted into the photoelectric conversion element 22 as the light receiving element through the same elements 14, 20, 21 as in the case of the light L2 that is reflected by the object M in the warning area or the protection area A.

In the rear of the scanning mirror 14, the first reflection surface 73 (black) and the second reflection surface 74 (white) with different reflection factors are provided adjacently on the lagging side and the leading side in the rotational direction (scanning direction) of the scanning mirror 14, and the fixed mirror 75 also fixed to the column portion 60a is provided, whereby the reflected pulse light L3 reflected by each of the first reflection surface (black) 73 and the second reflection surface (white) 74 is inputted into the photoelectric conversion element 22 as the light receiving element through the same elements 14, 20, 21 as in the case of the light L2 reflected by the object M in the warning area or the protection area A.

Incidentally, a light reception intensity at the time of irradiating the reference object with laser pulse light and receiving the reflected pulse light can be expressed by the following formula:

Light reception intensity={Light projection intensity×
 optical characteristic of light projection path×
 reflection factor of reference object÷
 (distance to reference object)$^2$×
 optical characteristic of light reception path×
 light reception gain} (Formula 1)

Further, in the case of scanning with laser light, the detection sensitivity can be expressed by the following formula without relying upon the reflection factor of the object and the distance to the object:

Detection sensitivity={Light projection intensity×
 optical characteristic of light projection path×
 optical characteristic of light reception path×
 light reception gain} (Formula 2)

According to the above Formulas 1 and 2, when the reflection factor of the reference object and the distance to the reference object are constant, following Formula 3 is established:

Detection sensitivity={light reception intensity×
 fixed value} (Formula 3)

Since inclusion of the reference object inside the optical scanning type photoelectric switch 1 using laser light facilitates to make the reflection factor of the reference object and the distance to the reference object constant, holding the light reception sensitivity, obtained in projecting light to the reference object, constant can make the detection sensitivity remain constant. From this viewpoint, for example in factory shipment of the optical scanning type photoelectric switch 1, a light reception intensity of the optical scanning type photoelectric switch 1 is measured when its detection sensitivity is in an optimal state, which is then stored into a storage element of the optical scanning type photoelectric switch 1, and when the optical scanning type photoelectric switch 1 is in operation, a light projection intensity and/or a light reception gain is adjusted such that a light reception intensity becomes the light reception intensity stored in the storage element, whereby it is possible to hold the detection sensitivity of the optical scanning type photoelectric switch 1 in the optimal state.

Figure 11:
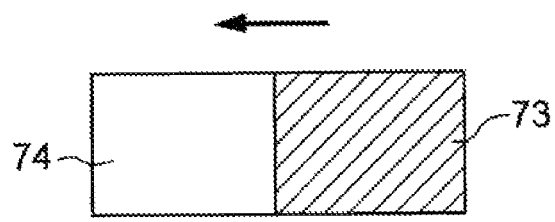
FIG. 11 is a plan view of two kinds a white and black, reflected surfaces as reference objects, having different reflection factors and built in the optical scanning type photoelectric switch.
Figure 12:
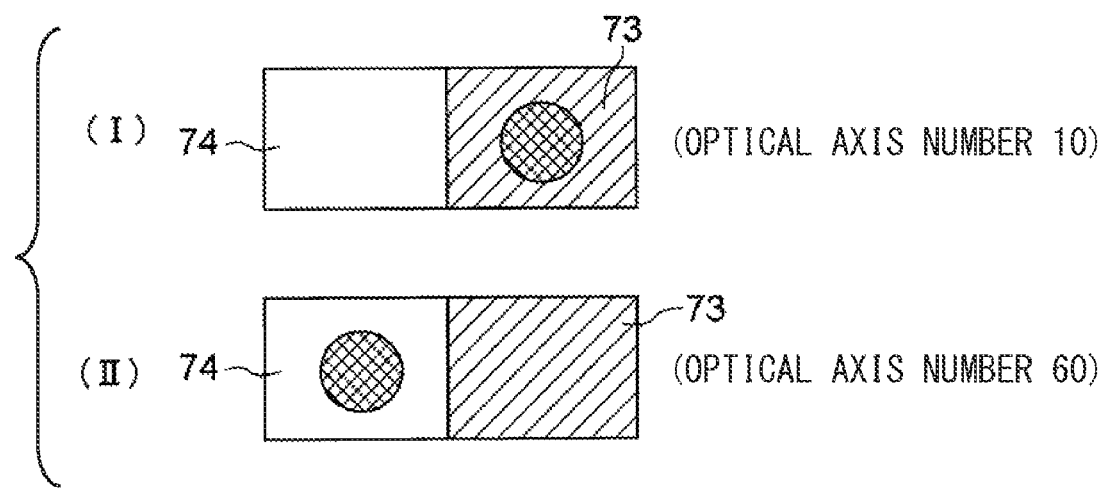
FIG. 12 is a view showing a state where laser pulse light is projected to the two reflected surfaces as the reference objects of FIG. 11.

FIG. 11 is a view where the first and second reflection surfaces 73, 74 have been extracted, and an arrow indicates the rotational direction, namely the scanning direction, of the scanning mirror 14. FIG. 12 illustrates a state where laser pulse light is hitting the first and second reflection surfaces 73, 74 in a time sequence.

It is assumed that the light reception intensity is "100" when the laser pulse light is hitting the black reflection surface 73 as one of the reference objects (FIG. 12(I)), and the light reception intensity is "600" when the laser pulse light is hitting the white reflection surface 74 as the other of the reference objects (FIG. 12(II)). Although the expressions of "black" and "white" are used here with respect to the first and second reflection surfaces 73, 74, those should be understood as expressions for the sake of convenience. "Black" means a low reflection factor with respect to a wavelength of laser light as a light projecting source, and "white" means a high reflection factor with respect to the wavelength of the laser light as the light projecting source. Further, since adopting a surface with a sufficiently low reflection factor as the black reflection surface 73 makes a reflection factor of a material constituting contamination equivalent or not smaller than the reflection factor of the black reflection surface 73, the black reflection surface 73 tends to have an increased reflection factor when contaminated. On the other hand, adopting a surface with a sufficiently high reflection factor as the white reflection surface 74 makes the second reflection surface 74 tend to have a decreased reflection factor when contaminated.

In the case of adjusting the light projection intensity and/or the light reception gain so as to hold the light reception intensity at "600" on the white second reflection surface 74, when the white second reflection surface 74 is contaminated and its reflection factor thus decreases, adjustment of the light projection intensity and/or the light reception gain is executed so as to hold the light reception intensity at "600" on the second reflection surface 74. In this case, the light reception intensity on the first reflection surface 73 increases due to an increase in light reception intensity with the reflection factor and the distance remaining constant. In order to cope with this phenomenon, the light reception intensities on the first and second reflection surfaces 73, 74 are continuously monitored, an allowable range (e.g. 80 to 120) is set to a value of the light reception intensity on the black first reflection surface 73, and when the light reception intensity on the black first reflection surface 73 exceeds the allowable range, it is regarded that contamination has been generated on the white second reflection surface 74. When contamination is generated on the white second reflection surface 74, appropriate sensitivity adjustment becomes impossible, to prevent accurate monitoring of the protection area A, and hence the optical scanning type photoelectric switch 1 brings the safety output into an OFF state, to halt power of a danger source. Further, the optical scanning type photoelectric switch 1 may be configured so as to give the user an indication that the safety cannot be verified (the safety output is in the OFF state) and also an indication of reasons for the safety being not verifiable (error contents) by means of the liquid crystal display section 34 or the LED indicator 38. Moreover, the optical scanning type photoelectric switch 1 may be configured so as to output occurrence of an error to the external equipment by means of a non-safety output signal other than the safety output, or transmit an error factor and the safety output being in the OFF state to an external personal computer PC through a communication cable 80.

Similarly, when the reflection factor increases due to contamination on the black first reflection surface 73, the reflected light on the first reflection surface 73 is intensified, and a phenomenon of an increase in light reception intensity on the black first reflection surface 73 thus appears. Also at this time, when the light reception intensity exceeds the allowable range on the black first reflection surface 73, it is regarded that contamination has been generated on the black first reflection surface 73 as one of the reference objects, and an alert can be given to the user by means of the liquid crystal display section 34 or the LED indicator 38.

By building the first and second reflection surfaces 73, 74 with different reflection factors as the reference objects into the optical scanning type photoelectric switch 1 and sharing the optical system of the optical scanning type photoelectric switch 1, it is possible to continuously monitor the light reception intensity and adjust the light projection intensity and/or the light reception gain, so as to make the light reception intensity constant. It is therefore not necessary in designing the optical scanning type photoelectric switch 1 to expect aged deterioration and variations in ambient temperature in use, regard the variations as being in the allowable range, and define a large margin as a specification. Further, it is possible to establish a predetermined detection sensitivity by making the margin small and initially setting the light projection intensity and/or the light reception gain high, thereby to facilitate reduction in size of the optical scanning type photoelectric switch 1. Additionally, since it has been configured such that contamination of the adjustment device made up of the first and second reflection surfaces 73, 74 is detected as a failure, it is possible to make a margin of a detection performance for ensuring the safety small, so as to provide the optical scanning type photoelectric switch 1 capable of performing a long-range detection on top of ensuring the safety despite its small size.

Figure 13:
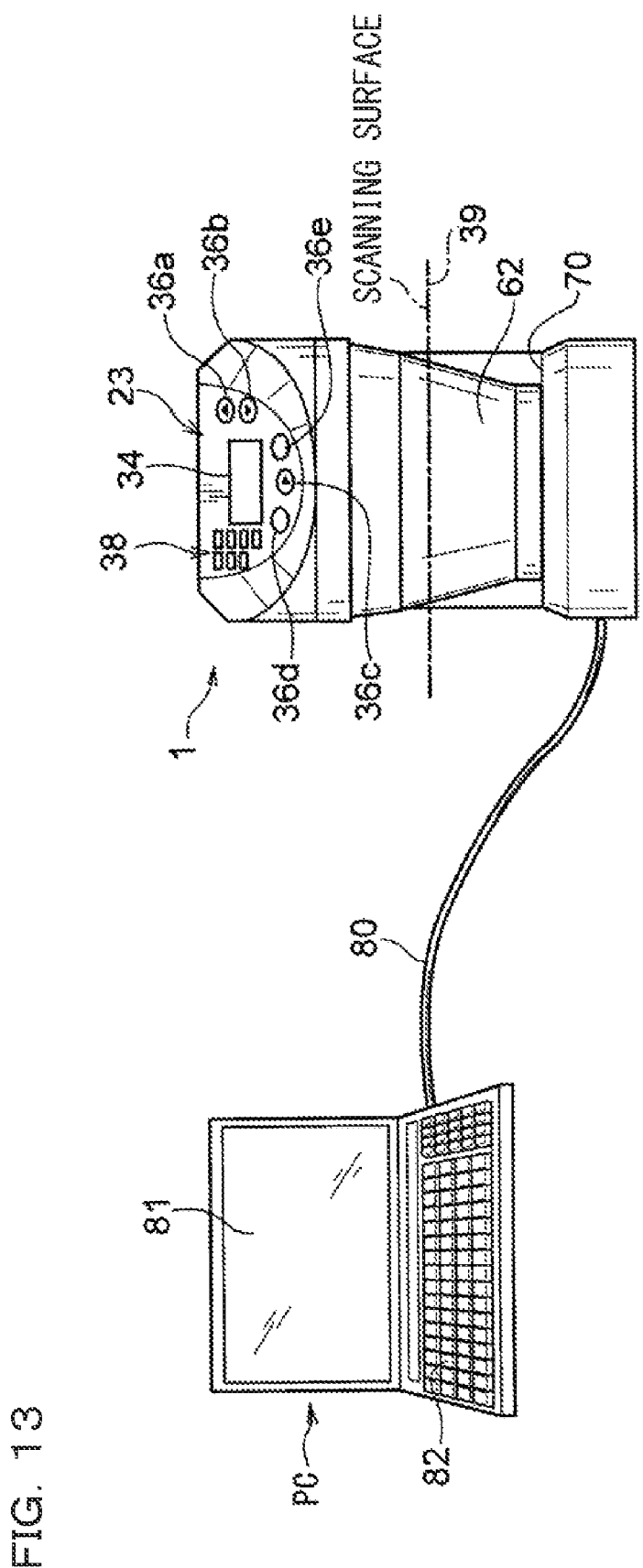
FIG. 13 is a view showing the optical scanning type photoelectric switch connected with a personal computer installed with a program for setting the protection area and the warning area.

Setting of Protection Area A:

The setting of the protection area A by the optical scanning type photoelectric switch 1 is performed using the personal computer PC, aside from whether or not it is configured so as to allow only the optical scanning type photoelectric switch 1 to make a simple setting, as shown in FIG. 13. The personal computer PC and the optical scanning type photoelectric switch 1 are mutually connected through the communication cable 80. As known, the personal computer PC has a display 81 and an input operating section 82.

In the personal computer PC, an application program for previously setting the protection area A is installed, and using this program, the protection area A of the optical scanning type photoelectric switch 1 can be edited.

Figure 14:
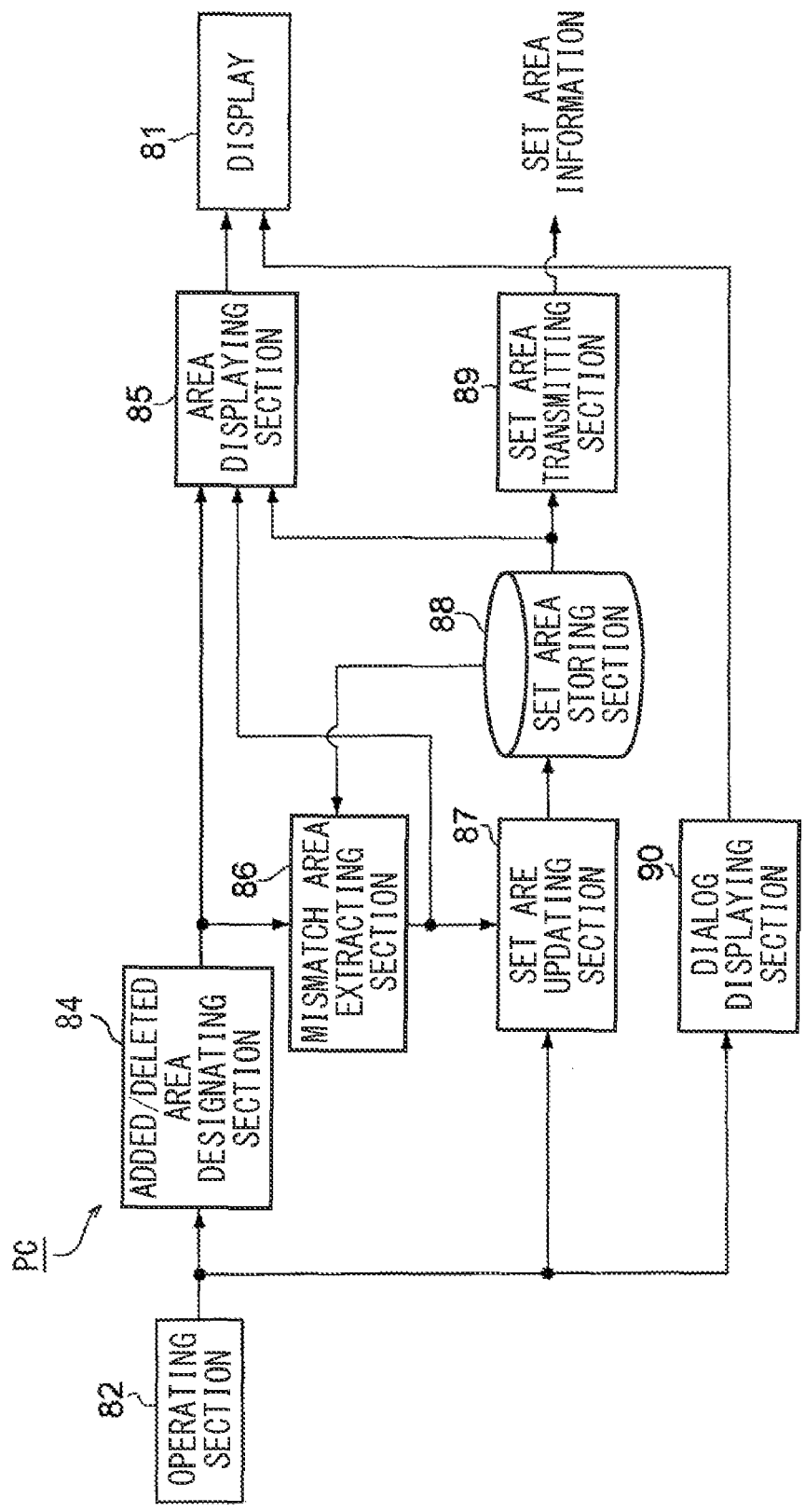
FIG. 14 is a functional block diagram for setting the protection area.

FIG. 14 is a block diagram representing a configuration of the personal computer PC as a protection area editing system. The personal computer PC is provided by the application program with functions of an added/deleted area designating section 84, a mismatch area extracting section 86, a set area updating section 87, a set area storing section 88, a set area transferring section 89, and a dialog displaying section 90.

The set area storing section 88 is configured of a memory that stores set area information for designating the protection area A to the optical scanning type photoelectric switch 1. The added/deleted area designating section 84 performs an operation of designating an additional area, a deleting area and a line segment based upon an input signal from the input operating section 82.

In the case of adding an area to the protection area A already set in the optical scanning type photoelectric switch 1, an area designated by the user is designated as the added area. Further in the case of deleting an area from the already set protection area A, an area designated by the user is designated as a deleted area.

The mismatch area extracting section 86 performs an operation of automatically extracting an area, located between the protection area A and the added area as seen from the optical scanning type photoelectric switch 1, as a mismatch area. Namely, when there is an area, which cannot be designated as a sensed area, between the protection area A and the area designated as the added area as seen from the optical scanning type photoelectric switch 1, an operation of extracting the above area as the mismatch area is performed.

In the mismatch area extracting section 86, when a line segment is designated during area-addition, an area located between the protection area A and the line segment as seen from the optical scanning type photoelectric switch 1 is extracted as the mismatch area. Here, the mismatch area extracted during the area-addition is referred to as an interpolation area.

Further, the mismatch area extracting section 86 performs an operation of automatically extracting an area, which is located in the rear of the deleted area as well as being in the protection area A as seen from the optical scanning type photoelectric switch 1, as the mismatch area. Namely, when there is an area designated as the protection area A in the rear of the area designated as the deleted area as seen from the optical scanning type photoelectric switch 1, an operation of extracting the above area as the mismatch area is performed.

In the mismatch area extracting section 86, when a line segment is designated during area-deletion, an area located in the rear of the line segment as well as being inside the protection area A as seen from the optical scanning type photoelectric switch 1 is extracted as the mismatch area. Here, the mismatch area extracted during the area-deletion is referred to as a "shadow area".

The area displaying section 85 controls the display 81, and performs an operation of visually identifiably displaying the protection area A, the added area, the deleted area, and the mismatch areas (the interpolation area and the shadow area) based upon set area information stored in the set area storing section 88. Namely, in the case of adding an area to the already set protection area A, the interpolation area is identifiably displayed with respect to the protection area A and the added area, and at that time, the interpolation area is identifiably displayed with respect to the protection area A before being addition of the added area and the interpolation area on the display 81.

Further, in the case of deleting an area from the already set protection area A, the shadow area is identifiably displayed with respect to the protection area A and the deleted area, and at that time, the shadow area is identifiably displayed with respect to the protection area A before deletion of the deleted area and the shadow area on the display 81.

The set area updating section 87 performs an operation of updating the protection area A stored in the set area storing section 88 based upon an input signal from the input operating section 82. Namely, in the case of adding an area to the already set protection area A, the protection area A added with the added area and the interpolation area is updated as a new protection area A.

When the line segment is designated during the area-addition, the set area information is updated such that the protection area A added with the interpolation area becomes a new protection area A.

Further, in the case of deleting an area from the already set protection area A, the set area information is updated so as to set the protection area A with the deleted area and the shadow area deleted therefrom as a new protection area A.

When the line segment is designated during the area-deletion, the set area information is updated such that the protection area A with the shadow area deleted therefrom becomes a new protection area A.

The dialog displaying section 90 controls the display 81, and displays a verification dialog based upon an input signal from the input operating section 82. Namely, in the case of adding an area to the already set protection area A, an inquiry dialog 93 for inquiring about whether or not to add the added area and the interpolation area to the protection area A is displayed as a verification dialog on the display 81.

Similarly, in the case of deleting an area from the already set protection area A, an inquiry dialog 93 for inquiring about whether or not to delete the deleted area and the shadow area from the protection area A is displayed as a verification dialog on the display 81.

In the set area updating section 87, based upon an input signal from the input operating section 82 after display of the above inquiry dialog, namely an operational input of change permission by the user, the set area information in the set area storing section 88 is updated.

The set area transferring section 89 performs an operation of transferring information of the protection area A stored in the set area storing section 88 to the optical scanning type photoelectric switch 1. Further, such a configuration is adopted to the set area transferring section 89 where, after transferring of the information of the protection area A to the optical scanning type photoelectric switch 1, a return of the information of the protection area A is accepted from the optical scanning type photoelectric switch 1 before the transferred protection area A is reflected to the optical scanning type photoelectric switch 1, so that the returned information can be used for the operation of verifying the protection area A performed by the user. Reflection of the transferred protection area A to the optical scanning type photoelectric switch 1 is executed following the protection area A verifying operation by the user.

Figure 15:
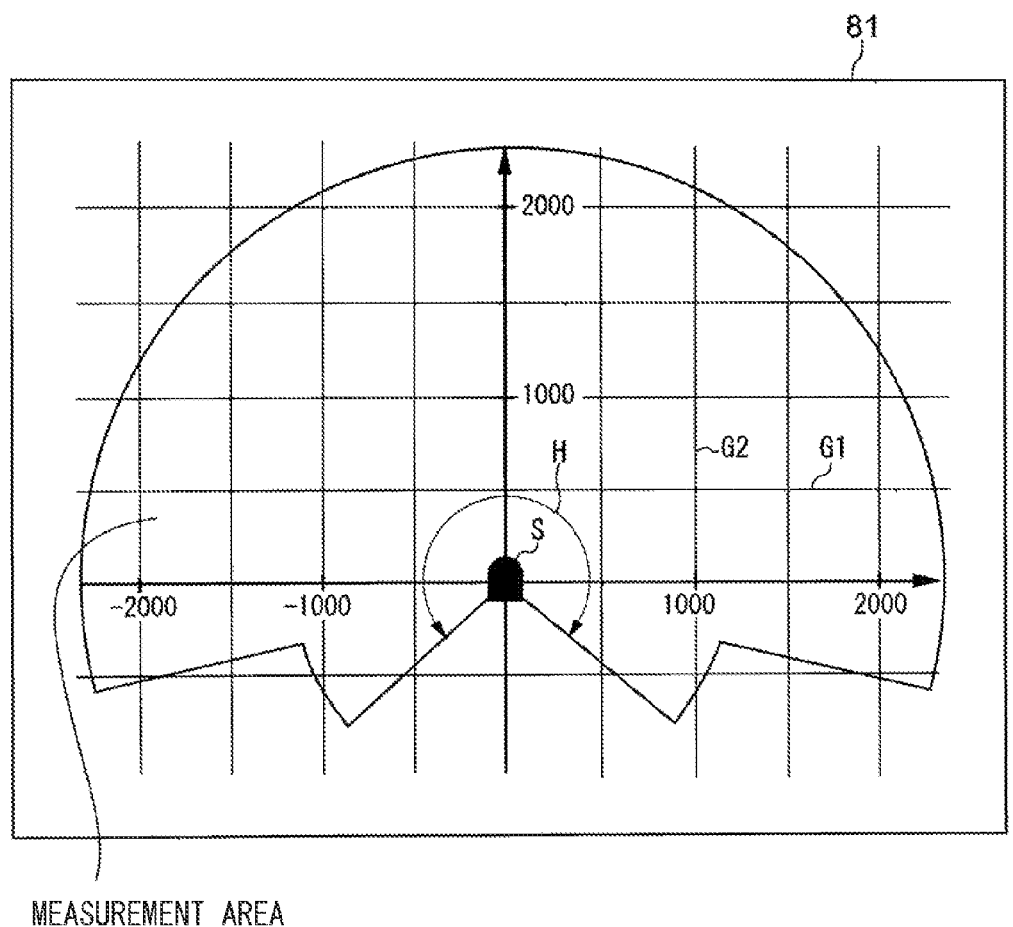
FIG. 15 is a region setting screen displayed on a display of the personal computer.

FIG. 15 shows a displayed area setting screen on the display 81 of the personal computer PC. This area setting screen is an input screen for use in newly designating the protection area A or editing the already set protection area A.

In the area setting screen displayed on the display 81, a maximum detection area (measurement area) is displayed with respect to an orthogonal coordinate with a symbol S showing the optical scanning type photoelectric switch 1 at the center, and grid lines G1 in parallel with an abscissa axis are arranged at a spacing of 500 mm, while grid lines G2 in parallel with an ordinate axis are arranged at a spacing of 500 mm.

In the rear of the symbol S, an upper limit of a distance that can be sensed changes based upon an emission angle of scanning laser light, and a range H of an angle that can be sensed is not smaller than −45 degrees and not smaller than +225 degrees. An area in a range other than this angle range H is a blind range, and cannot be designated as the protection area A.

Figure 16:
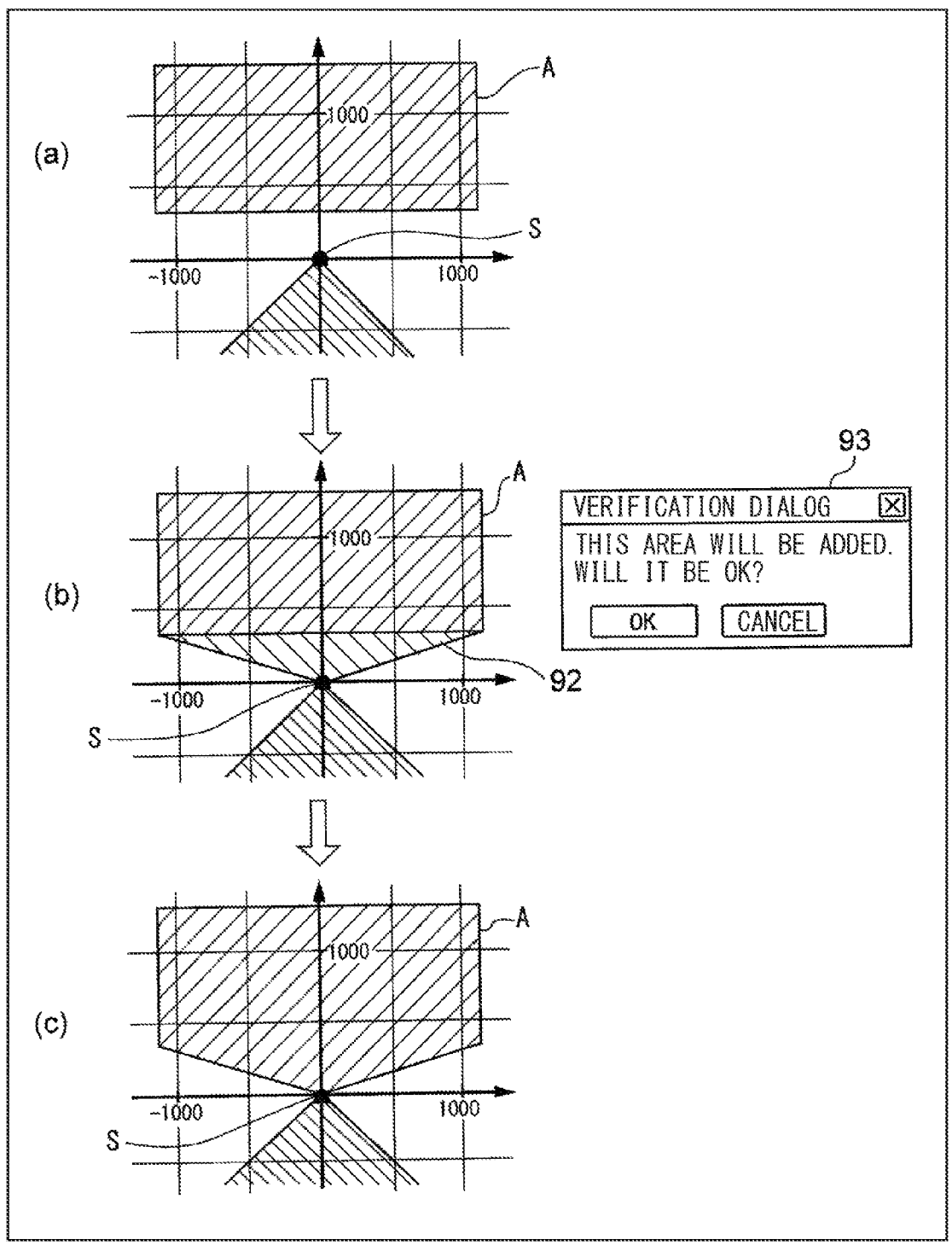
FIGS. 16A to 16C are views each for explaining a process of setting the protection area.

FIG. 16 shows a screen in the case of adding an area 92 to a rectangular protection area A. Other than the rectangular shape, the protection area A can be designated to have a polygonal shape, a circular shape with the symbol S showing the optical scanning type photoelectric switch 1 at the center, a sectoral shape, or the like, and an closed area with a line, which was drawn while a mouse pointer was moved, taken as a border can also be designated as the protection area A.

Assuming that the protection area A is designated in the area setting screen displayed on the display 81, for example when a decision key is operated by the user, the protection area A is decided, and an area, which is needed adding at the minimum for making this protection area A an object to be sensed, is automatically extracted as the interpolation area 92. Namely, as seen from the optical scanning type photoelectric switch 1, the interpolation area 92 is extracted as an area not designated as the object to be sensed between the region designated as the protection area A and the optical scanning type photoelectric switch 1. A verification dialog 93 for inquiring about whether or not the interpolation area 92 may be added to the protection area A is displayed, and when the addition is permitted by the user, an area obtained by adding the interpolation area 92 to the protection area A, set by the user, is set as a new protection area A, and information is updated based upon this new protection area A.

Figure 17:
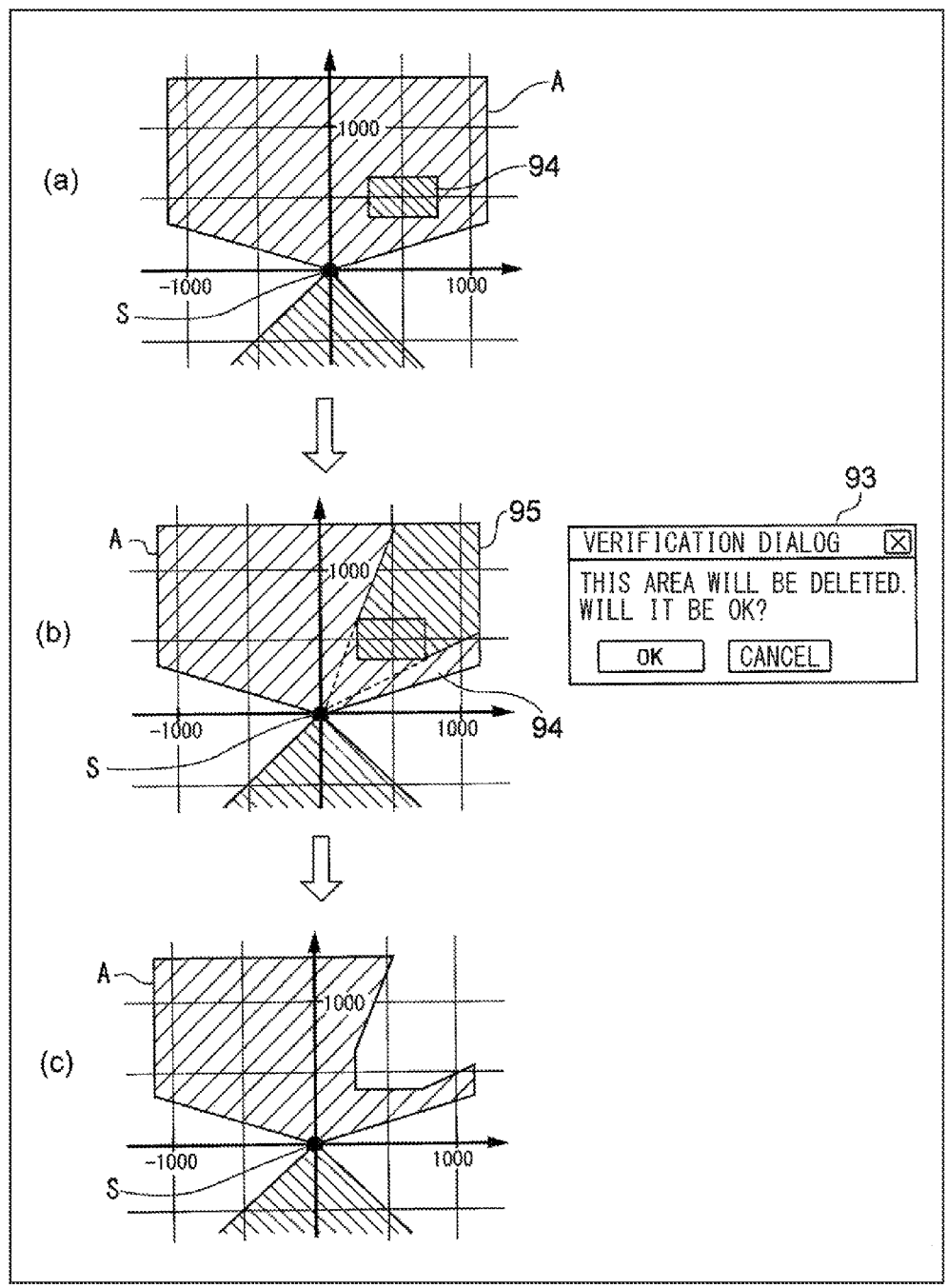
FIGS. 17A to 17C are views each for explaining another process of setting the protection area.

FIG. 17 shows an example of deleting part of the protection area A. An area deleted from the protection area A can be arbitrarily designated, and reference numeral 94 denotes a deleted area designated by the user. Other than the rectangular shape, the deleted area can be designated to have a polygonal shape, a circular shape with the optical scanning type photoelectric switch 1 at the center, a sectoral shape, or the like. Further, a closed area with a curved line taken as a border can also be designated, the curved line having been drawn while the mouse pointer on the screen was moved.

An area 94 included in the protection area A is designated as the deleted area, and for example when the decision key is operated by the user, the deleted area 94 is decided as the area to be deleted. In deleting this deleted area 94 from the protection area A, the deleted area 94 is made a non-detected area so that an area to be deleted at the minimum is automatically extracted as a shadow area 95. Namely, as seen from the optical scanning type photoelectric switch 1, an area to be sensed in the rear of the area 94 designated as the deleted area is extracted as the shadow area 95.

When the shadow area 95 is automatically extracted, a verification dialog 93 for inquiring about whether or not the shadow area 95 may be deleted from the protection area A. When a change in the protection area A including the shadow area 95 is then permitted by the user, an area obtained by deleting the deleted area 94 and the shadow area 95 from the protection area A is set as a new protection area A, and zone information of this new protection area A is updated. FIG. 17C shows the new protection area A.

Muting function and switching of muting area:

The optical scanning type photoelectric switch 1 has a muting function which sets a single or a plurality of muting areas in part or the whole of the protection area A and invalidating a previously set sensing function in the muting area when a predetermined condition is established. The case of setting part of the protection area A as the muting area is referred to as "partial mute", and the case of setting the whole of the protection area A as the muting area is referred to as "full mute". The optical scanning type photoelectric switch 1 is capable of making a switch to a different muting area by other sensing device or timings. In the following description, a switching control on the muting area is described centering on the partial mute, but one muting area out of the plurality of muting areas may be set as the whole of the protection area A ("full mute").

Settings of the muting function and the muting area can be made using the personal computer PC as in the foregoing setting of the protection area A, and the application program used in setting of the protection area A has been added with a function concerning muting.

Figure 18:
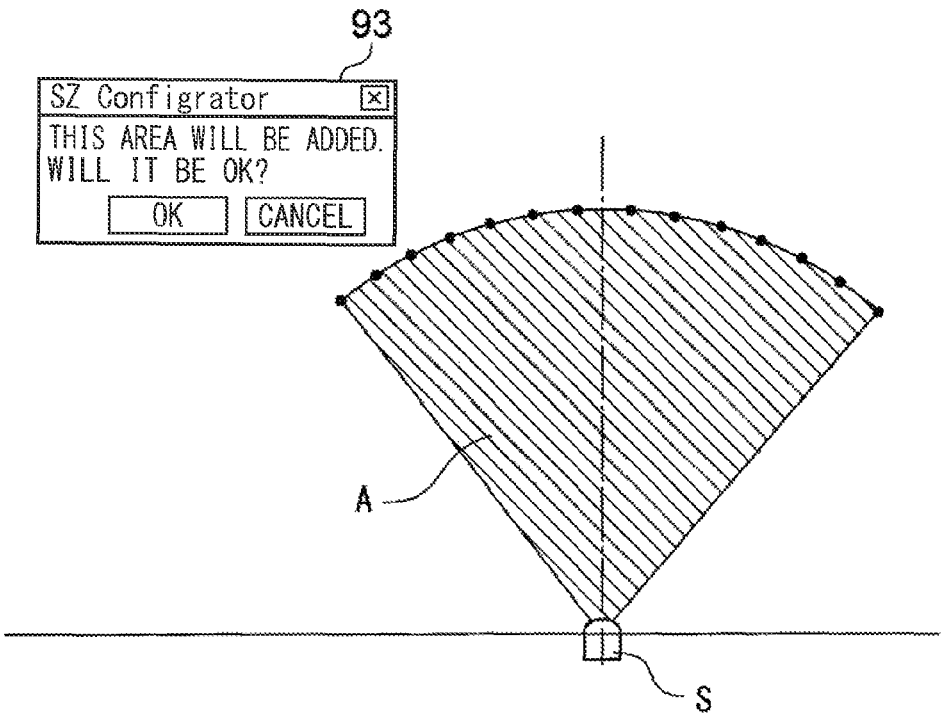
FIG. 18 is a region setting screen at the time of first setting the protection area in setting a muting area.

FIG. 18 exemplifies the case of setting a sectoral protection area A by means of the application program installed in the personal computer PC. This method for setting the protection area A is as in the foregoing description with reference to FIGS. 13 to 17, and an inquiry dialog 93 about whether or not to set the designated protection area A is displayed on the display 81 as the verification dialog. The designated protection area A is set by permission made by the user using this inquiry dialog 93.

Figure 19:
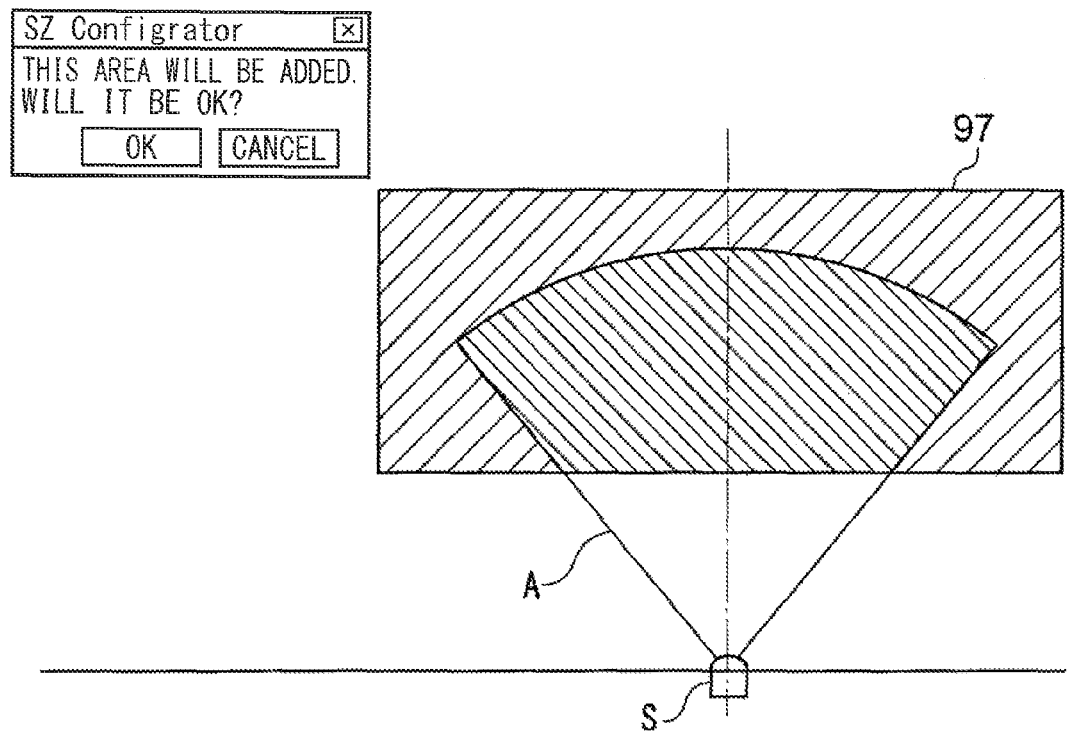
FIG. 19 is a region setting screen in an intermediate process of setting the muting area in the protection area set in FIG. 18.

FIG. 19 shows a display screen for setting the muting area by means of the setting function concerning muting in the application program used in setting of the protection area A. Reference numeral 97 denotes an area designated by the user as the muting area. It should be noted that, as understood from FIG. 19, the user has designated a rectangular area across an area apart from the optical scanning type photoelectric switch symbol S out of the protection area A. In this example of FIG. 19, this designated area 97 at least includes the end of the protection area A apart from the optical scanning type photoelectric switch symbol S out of the protection area A. When the end apart from the symbol S is not included, namely when the area is designated in the protection area A in a vertically midway portion in FIG. 19, a later-described shadow area is automatically extracted, and this shadow area is displayed. The area 97 designated by the user is displayed as superimposed on the protection area A, the protection area A and the area 97 designated by the user are displayed with different colors, and the portion where the area 97 designated by the user and the protection area A overlap is displayed with a third color as a mixed color of the first color of the protection area A and the second color of the area 97 designated by the user.

On the display 81 of the personal computer PC, an inquiry dialog 93 for inquiring about whether the designated area 97 is correct is displayed as the verification dialog, and by the user's permission, a muting area 98 is set in an area where the designated area 97 and the protection area A overlap (FIG. 20). In a state where the muting area is set, a portion protruding from the protection area A out of the forgoing area 97 designated by the user (FIG. 18) has been deleted, and the protection area A and the muting area 98 set inside this protection area A are displayed with different colors. A plurality of muting areas 98 can be set in the same protection area A in the same manner, and a condition of activating the muting function, the time when the muting function is executed, and the like can be set using a muting function setting screen shown in FIG. 21 with respect to each of the muting areas 98.

It is to be noted that a setting procedure for the muting area 98 is performed similarly to the procedure for deleting part of the protection area A. That is, when an area to be muted is designated, a shadow area which is to be added at the minimum as the muting area 98 (an area in the rear of the designated area as seen from the optical scanning type photoelectric switch 1) is automatically extracted, a verification dialog for inquiring whether or not the extracted area may be added as the muting area 98, and setting of the muting area 98 and updating thereof are executed in accordance with a permission designation.

For example when a plurality of muting areas 98 are set in the protection area A, by means of the setting screen of FIG. 21, it is possible to set the timing for starting muting, the timing for resetting muting, the time when the muting state is allowed, a time difference among a plurality of timing signals, and the like with respect to each of the muting areas 98.

Figure 22:
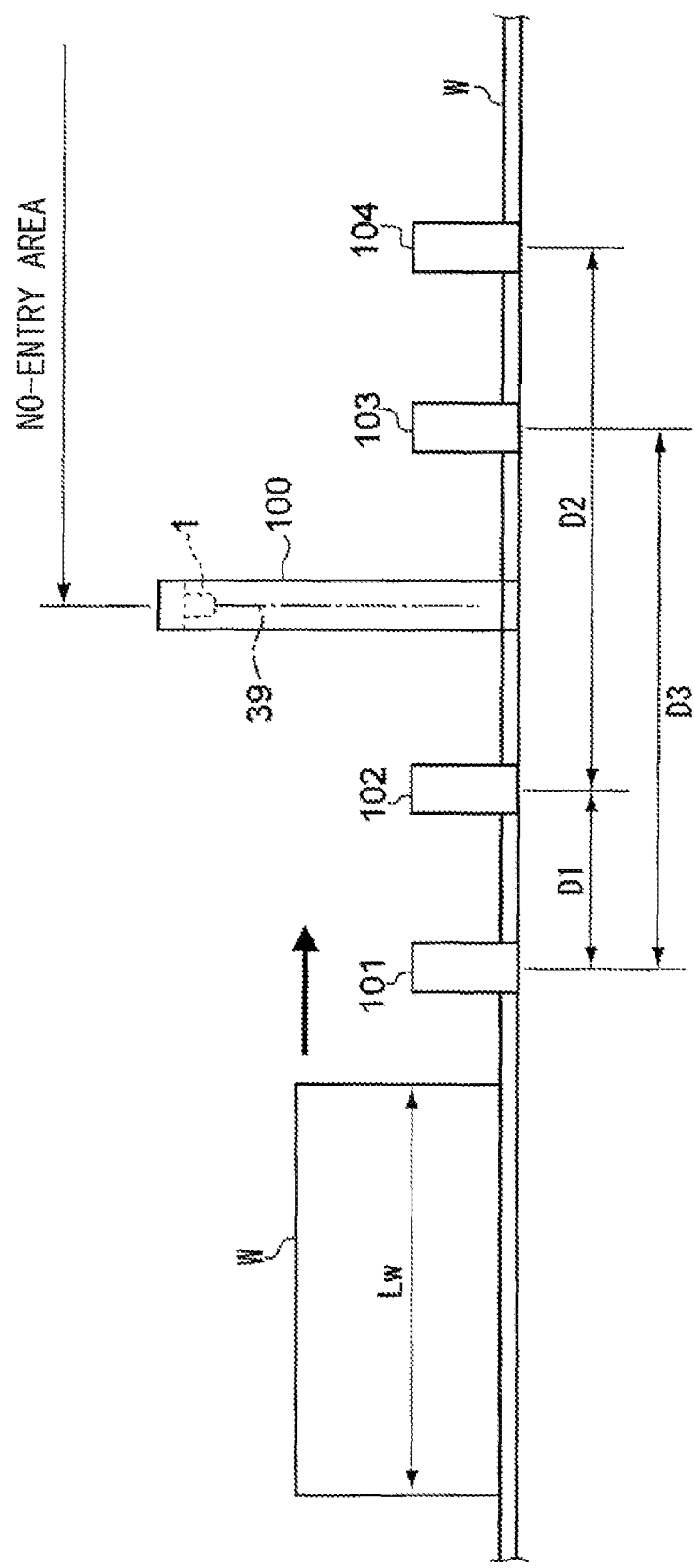
FIG. 22 is a whole constitutional view of a conveyance system with the muting area set in the optical scanning type photoelectric switch.

A specific example is described using a conveyance system for a work W with reference to FIG. 22. FIG. 22 shows a state of a conveyance apparatus (e.g. belt conveyer) V seen from its side, the conveyance apparatus V is provided with a gate 100, the optical scanning type photoelectric switch 1 is arranged at the center of a top lateral bar of the gate 100, and the optical scanning type photoelectric switch 1 is arranged such that the scanning surface 39 (FIG. 5) expands downward while agreeing with a vertical surface surrounded by the gate 100. Namely, at an opening of the gate 100, a light curtain (detection plane) is formed by the optical scanning type photoelectric switch 1 arranged at the center top of the gate 100.

In the conveyance apparatus V, mute sensors 101 to 104 constituted of photoelectric sensors or the like are arranged so as to satisfy predetermined conditions. Here, from the upstream side toward the downstream side in accordance with a conveyance direction of the conveyance apparatus V, the first and second mute sensors 101, 102 are arranged on the near side, namely on the upstream side of the gate 100, and the third and fourth mute sensors 103, 104 are arranged on the downstream side of the gate 100. The downstream of the gate 100 is a no-entry area. The first to fourth mute sensors 101 to 104 are respectively connected to the optical scanning type photoelectric switch 1 through cables outside the figure. As a modified example, output signals of the first and third mute sensors 101, 103 may be wired OR and the output signals of the second and fourth mute sensors 102, 104 may be wired OR, to be connected to the optical scanning type photoelectric switch 1. An output signal line of the first and third mute sensors 101, 103 transmits to the optical scanning type photoelectric switch 1 information that at least either one of the first and third mute sensors 101, 103 has detected the work W. An output signal line of the second and fourth mute sensors 102, 104 transmits to the optical scanning type photoelectric switch 1 information that at least either one of the second and fourth mute sensors 102, 104 has detected the work W. In the case of the mute sensor that is turned ON by detection of the work W, the output signal of the mute sensor is short-circuited so that the signal can be made a wired OR signal. Connecting the wired OR output signal lines to the optical scanning type photoelectric switch 1 can reduce the number of input signal lines of the optical scanning type photoelectric switch 1 required for the muting function from four to two. In the following, a description is given taking the case of the wired OR as an example.

An interval between the first mute sensor 101 and the second mute sensor 102 is D1. An interval between the second mute sensor 102 and the fourth mute sensor 104 is D2. An interval between the first mute sensor 101 and the third mute sensor 103 is D3. Further, a moving speed of the work W, namely a conveyance speed of the conveyance apparatus V, is V1. The foregoing conditions for setting the first to fourth mute sensors 101 to 104 are as follows:

$$Ta<\{T=D1/V1\}<Tb \qquad \text{Condition (1):}$$

$$D2<Lw \qquad \text{Condition (2)}$$

$$D3<Lw \qquad \text{Condition (3)}$$

Here, Ta and Tb are previously set fixed values, and Lw is a longitudinal length of the work W.

The condition (1) requires that the time difference from transition of the first mute sensor 101 to a detecting state by movement of the work W to transition of the second mute sensor 102 to the detecting state (T=D1/V1) is within a predetermined range. The condition (2) is a condition for preventing the second mute sensor 102 from coming into a non-detecting state before transition of the fourth mute sensor 104 to the detecting state. The condition (3) is a condition for preventing the first mute sensor 101 from coming into the non-detecting state before transition of the third mute sensor 103 to the detecting state.

By arranging the first and second mute sensors 101, 102 so as to satisfy the condition (1), it is possible to discriminate entry of the work W and entry of an entry object other than the work W from the time difference from the transition of the first mute sensor 101 to the detecting state to the transition of the second mute sensor 102 to the detecting state.

By arranging the first to fourth mute sensors 101 to 104 so as to satisfy the condition (2) and the condition (3), it is possible to discriminate entry of the work W and entry of the entry object other than the work W under the condition that the conveyance apparatus V is conveyed at constant speed, through use of different distances in the conveyance direction.

Figure 23:
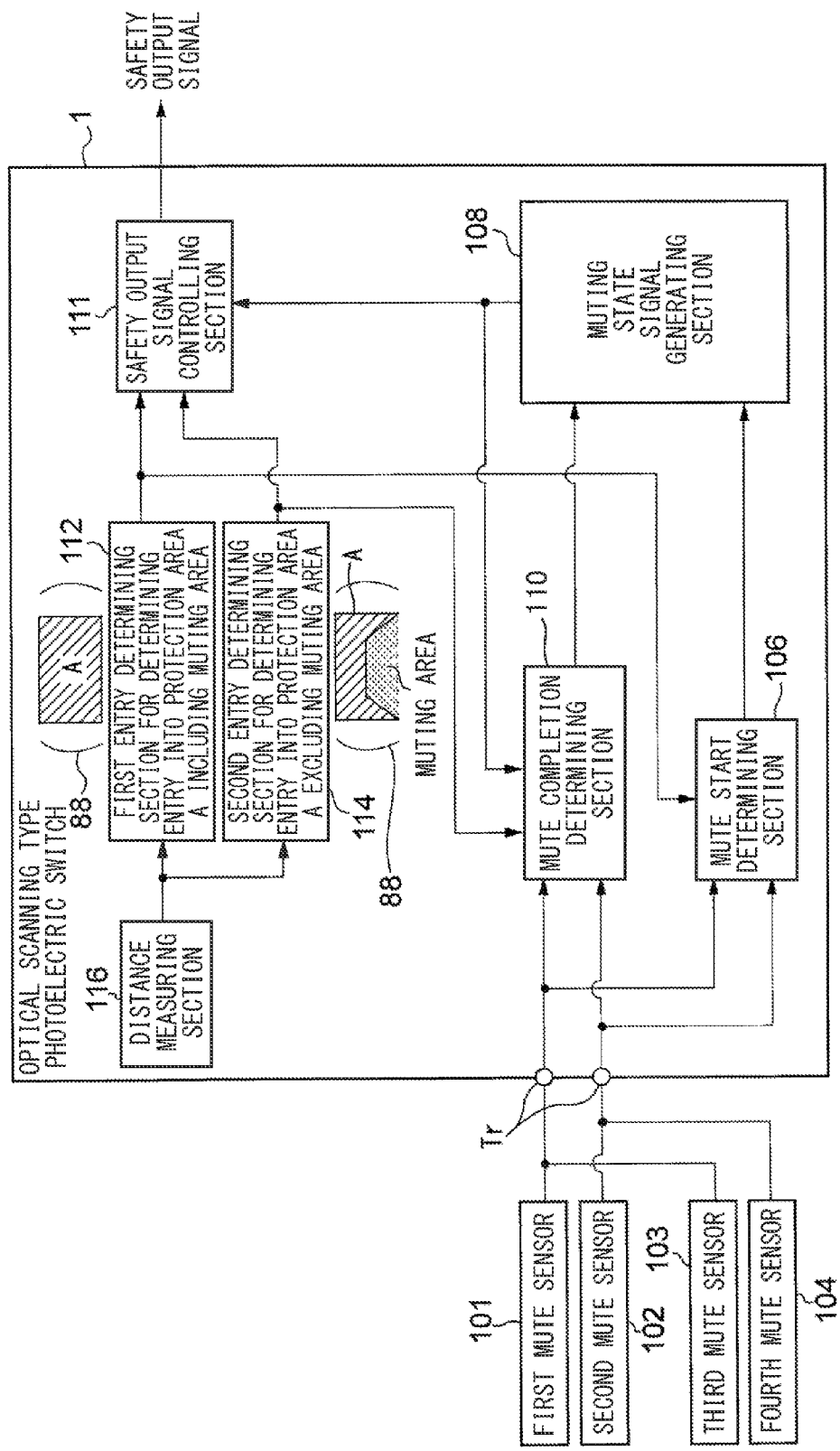
FIG. 23 is a functional block diagram of the optical scanning type photoelectric switch related to a muting function.

FIG. 23 is a functional block diagram of the optical scanning type photoelectric switch 1. In FIG. 23, reference symbol Tr denotes an external input accepting terminal that accepts an external input from each of the first to fourth mute sensors 101 to 104. The optical scanning type photoelectric switch 1 is configured of a mute start determining section 106, a muting state signal generating section 108 and a mute completion determining section 110. When an object enters the protection area A, transition is made from the non-detecting state to the detecting state, and an OFF signal (operation non-permitting signal) is outputted from the safety output signal controlling section 111.

Based upon a first entry determining section 112 for determining entry of an object (object M) into the protection area A including the muting area, an external input signal as an external input accepted from the first and third mute sensors 101, 103 through the terminal Tr, and an external input signal as an external input from the second and fourth mute sensors 102, 104 through the terminal Tr, the mute start determining section 106 determines establishment of the following conditions and outputs the establishment of muting starting conditions to the muting state signal generating section 108. The muting establishment conditions are that the first entry determining section 112 for determining entry into the protection area A including the muting area is in the non-sensing state, and that a time difference T1 from the time of transition of the first and third mute sensors 101, 103 from the non-sensing state to the sensing state to the time of transition of the second and fourth mute sensors 102, 104 from the non-sensing state to the sensing state is within a predetermined range (range satisfying Ta<T1<Tb).

Based upon a result of determination by the mute start determining section 106 and a result of determination by the mute completion determining section 110, the muting state signal generating section 108 performs an operation of generating a muting state signal with respect to the safety output signal controlling section 111 and the mute completion determining section 110.

Based upon a second entry determining section 114 for determining entry of the object (object M) into the protection area A excluding the muting area, input signals from the first and third mute sensors 101, 103, input signals from the second and fourth mute sensors 102, 104, and the muting state signal outputted by the muting state signal generating section 108, the mute completion determining section 110 determines an operation of completing muting based upon the following conditions, and outputs establishment of the muting completion condition to the muting state signal generating section 108. The muting completion condition is that the second entry determining section 114 for determining entry into the protection area A excluding the muting area transits from the non-sensing state to the sensing state, or both the first and third mute sensors 101, 103 transit to the non-sensing state, or both the second and fourth mute sensors 102, 104 transit to the non-sensing state, or a muting-state signal outputted from the muting state signal generating section 108 is in the muting state beyond predetermined time Tc. In addition, a signal is inputted into the first and second entry determining sections 112, 114 from a distance measuring section 116 for measuring a distance to the object (object M).

Based upon results of determination by the mute start determining section 106 and the mute completion determining section 110, the muting state signal generating section 108 performs an operation of generating a muting state signal for designating muting to the safety output signal controlling section 111.

A safety output signal outputted from the safety output signal controlling section 111 is used as a control signal for halting a processing machine inside the no-entry area on the downstream of the gate 100. This safety output signal controlling section 111 controls a safety output signal based upon a result of determination by the first entry determining section 112 for determining entry into the protection area A including the muting area, a result of determination by the second entry determining section 114 for determining entry into the protection area A excluding the muting, and a muting state signal outputted by the muting state signal generating section 108. More specifically, in the case of the muting state signal being non-muting, the safety output signal controlling section 111 controls the safety output to be OFF when the result of determination about entry into the protection area A by the first entry determining section 112 is the sensing state, and the safety output signal controlling section 111 controls the safety output to be ON when the result of determination is the non-sensing state. On the other hand, in the case of the muting state signal being muting, the safety output signal controlling section 111 controls the safety output to be OFF when the result of determination about entry into the protection area A by the second entry determining section 114 is the sensing state, and the safety output signal controlling section 111 controls the safety output to be ON when the result of determination is the non-sensing state.

Figure 24:
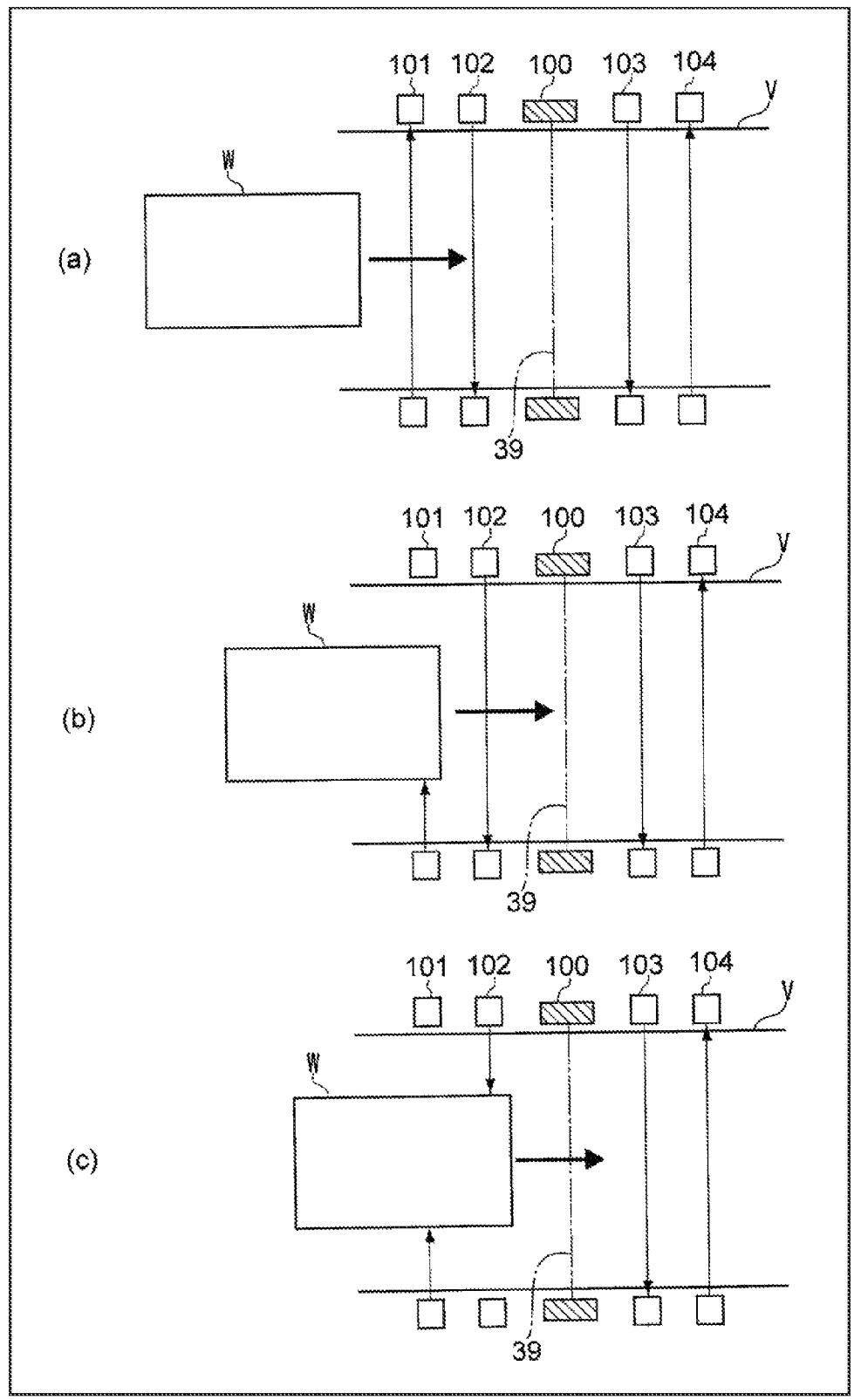
FIGS. 24A to 24C are views each for explaining the relation between a plurality of mute sensors and a work.
Figure 25:
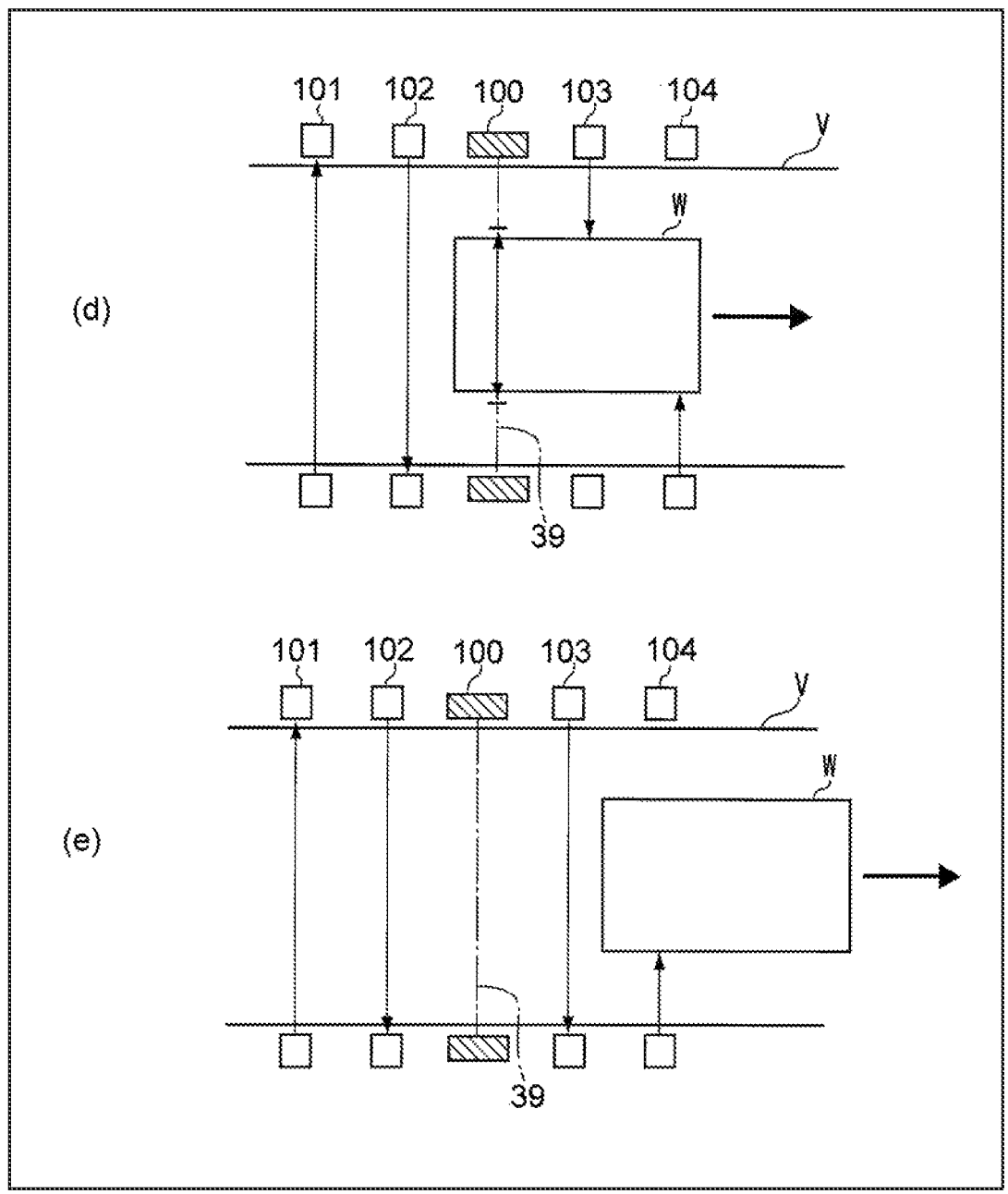
FIGS. 25D and 25E are views each for explaining the relation between the plurality of mute sensors and the work, subsequently to FIG. 24.

FIGS. 24 and 25 show examples of operations concerning conveyance of the work W by the conveyance apparatus V of FIG. 22, and FIGS. 24A to 24C and FIGS. 25D and 25E are time series. When the object M enters the protection area A of the optical scanning type photoelectric switch 1 installed on the gate 100 at a time point (FIG. 24A) when the work W does not interfere with the first mute sensor 101, an OFF signal (operation non-permitting signal) from the optical scanning type photoelectric switch 1.

FIG. 24B shows a case where the front end of the work W is located between the first mute sensor 101 and the second mute sensor 102, and the work W is interrupting light emitted from the light projecting section of the first mute sensor 101. In this case, only the first mute sensor 101 is in the detecting state.

FIG. 24C shows a case where the front end of the work W interferes with the second mute sensor 102, and the work W is interrupting light emitted from the respective light projecting sections of both the first and second mute sensors 101, 102. In this case, both the first and second mute sensors 101, 102 are in the detecting state, and by transition of the first and second mute sensors 101, 102 to the detecting state in this order, the muting function is executed in the muting area 98 in the protection area A. Therefore, even when the work W passes through the muting area 98 in the protection area A of the optical scanning type photoelectric switch 1 at the gate 100, an warning signal is not outputted.

FIG. 25D is in a state where the rear end of the work W interferes with the muting area 98 of the optical scanning type photoelectric switch 1, and the work W also interferes with the third mute sensor 103 on the downstream of the gate 100. In this case, the muting state is maintained.

FIG. 25E is in a state where the rear end of the work W interferes with the fourth mute sensor 104. By transition of the third mute sensor 103 to the non-detecting state, the muting area 98 of the optical scanning type photoelectric switch 1 is reset, and immediately upon entry of the object M into the protection area A of the optical scanning type photoelectric switch 1, an warning signal is outputted.

Figure 26:
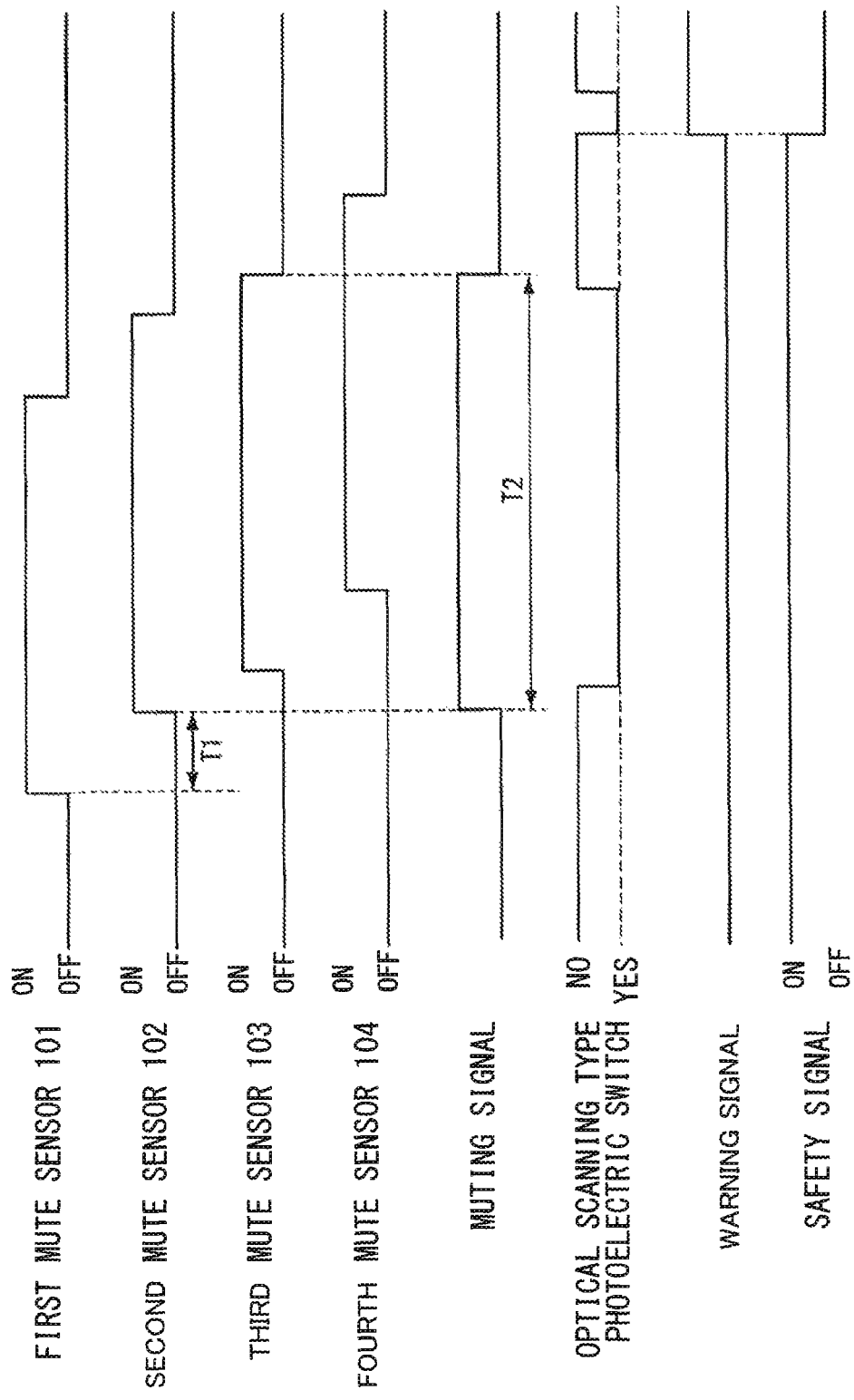
FIG. 26 is a time chart related to muting.

FIG. 26 is a time chart for the operations described in FIGS. 24 and 25. Each of the first to fourth mute sensors 101 to 104 is on a low level (OFF state) in the non-detecting state, and outputs a signal on a high level (ON state) in the detecting state.

It is to be noted that in the time chart of FIG. 26, "YES" concerning the optical scanning type photoelectric switch 1 means that there is entry of the object M into the protection area A, and "NO" means that there is no entry of the object M into the protection area A.

With the movement of the work W, the first to fourth mute sensors 101 to 104 sequentially transfer to the detecting state. When the time difference T1 from transition of the first mute sensor 101 to the detecting state to transition of the second mute sensor 102 to detecting state is within a predetermined range, a muting signal is switched to the high level in synchronous with the rise of an output signal of the second mute sensor 102, and muting starts in the muting area 98 of the optical scanning type photoelectric switch 1. Therefore, during this muting operation, the muting area 98 in the protection area A of the optical scanning type photoelectric switch 1 is practically an invalid area.

When elapsed time T2 from the start of the muting state becomes not shorter than the predetermined time Tc, and when the optical scanning type photoelectric switch 1 senses entry of the object (object M) into the protection area A excluding the muting area, the muting is forcibly terminated. When setting the predetermined time Tc, the user may set an upper limit value such as five minutes. It is to be noted that, although the description was given taking the example of the photoelectric sensors as the first to fourth mute sensors 101 to 104, a radio acoustic wave sensor, an ultrasonic sensor, or a contact type sensor may be employed as the mute sensor.

Further, when works W with different heights are conveyed with the conveyance apparatus V in conformity with a predetermined rule, the timing at which the work W passes through the gate 100 may be detected by a sensor arranged on the upstream side of the gate 100, and based upon a timing signal from this sensor, the muting area 98 may be switched to one in agreement with the height of the work W.

Figure 27:
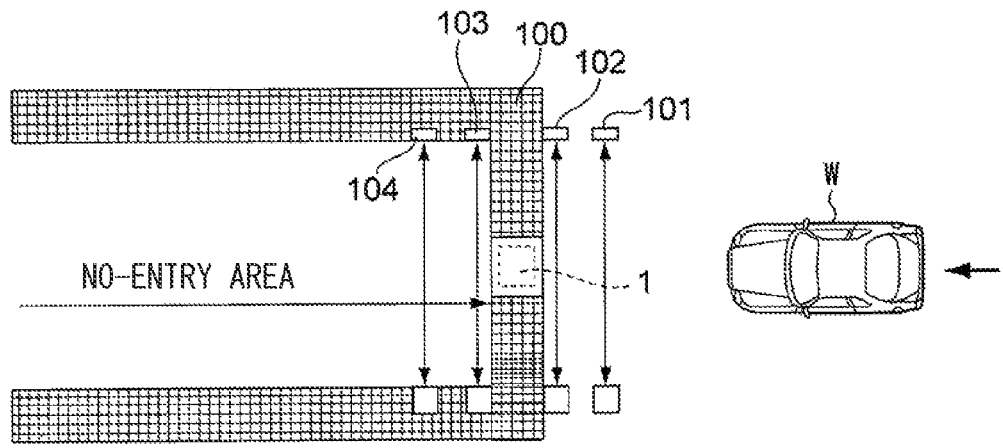
FIG. 27 is a view for explaining a gate configuration where a plurality of muting areas are set and the muting areas are switch-controlled in accordance with the kind of work.
Figure 28:
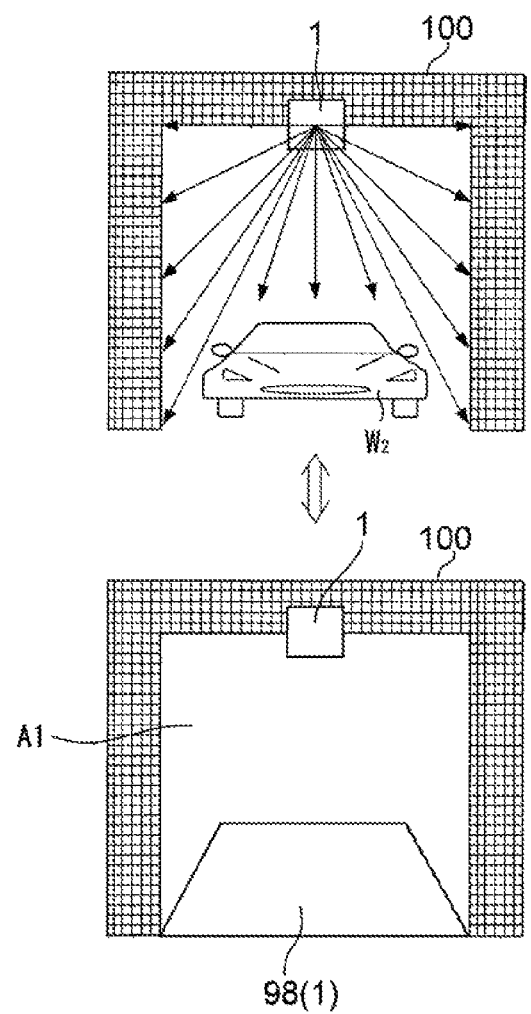
FIG. 28 is a view for explaining, in association with FIG. 27, that a relatively low muting area is set when a relatively low work passes through the gate.
Figure 29:
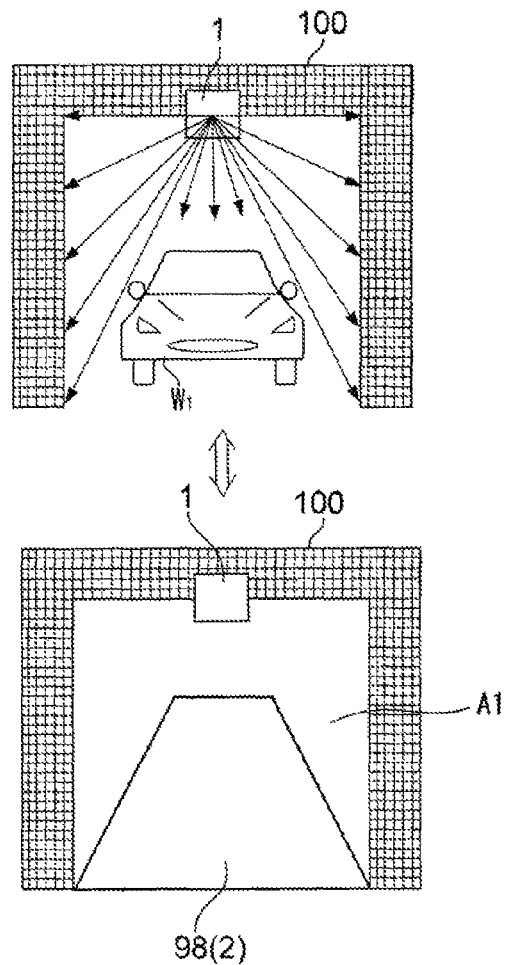
FIG. 29 is a view for explaining, in association with FIG. 27, that a relatively high muting area is set when a relatively high work passes through the gate.

FIGS. 27 to 29 are views for explaining examples of the case of setting a plurality of muting areas 98 respectively corresponding to works W with different heights and widths.

Here, when the work W is exemplarily assumed as a car, and a first type car W1 has a relatively large height and a relatively small width. As opposed to this, a second type car W2 has a relatively small height and a relatively large width. Referring to FIGS. 27 to 29, the left side out of both sides with the gate 100 placed therebetween is the non-entry area, the optical scanning type photoelectric switch 1 is arranged at the central portion of the top lateral bar of the gate 100, and the scanning surface 39 of this optical scanning type photoelectric switch 1 is set along a vertical surface surrounded by the gate 100, whereby a light curtain is formed at the opening of the gate 100 by the optical scanning type photoelectric switch 1.

Each of arrows starting from the optical scanning type photoelectric switch 1 exemplarily shows an optical axis of the optical scanning type photoelectric switch 1. In FIG. 28, a first muting area 98(1) in the shape of a relatively low trapezoid is set when the second type car W2 passes through the gate 100, and a second muting area 98(2) in the shape of a relatively high trapezoid is set when the first type car W1 through the gate 100. When the order of passage of the types of the car W through the gate 100 is previously decided, the muting area 98 corresponding to the car types is set in accordance with this order.

Figure 30:
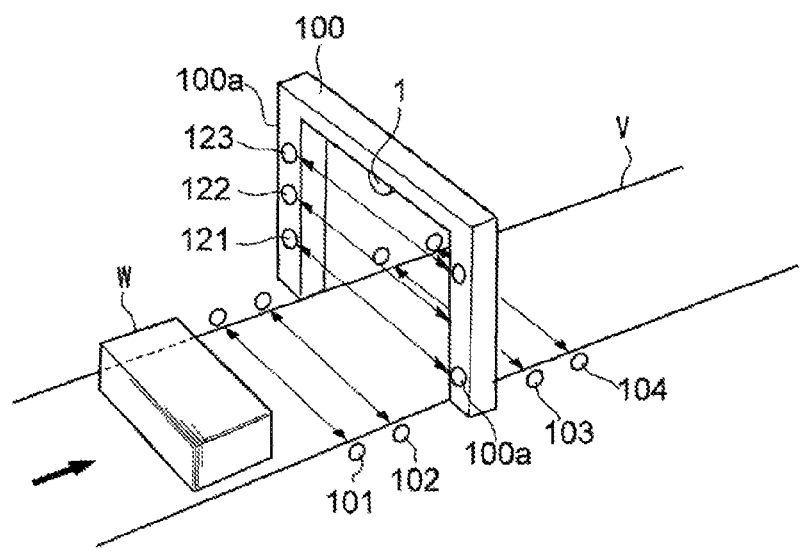
FIG. 30 is a view for explaining a gate configuration where, in order to detect the height of the work, sensors installed at different heights of three levels are prepared and the muting area is switched based upon the height of the work detected by the sensors.
Figure 31:
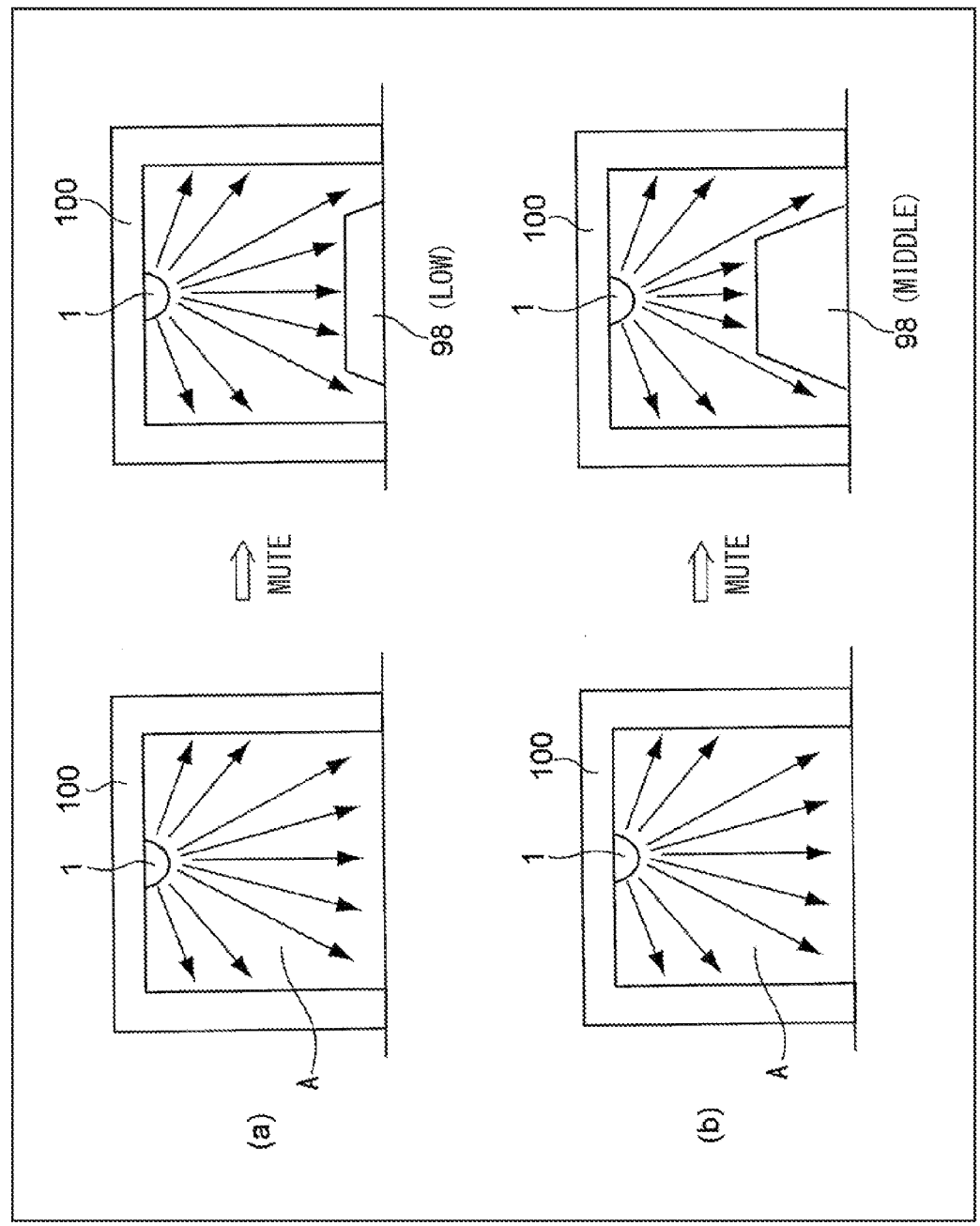
FIG. 31A is a view for explaining that a low muting area corresponding to a low work is set when the low work is detected.
FIG. 31B is a view for explaining that a moderately high muting area corresponding to a moderately high work is set when the moderately high work is detected, in association with FIG. 30.
Figure 32:
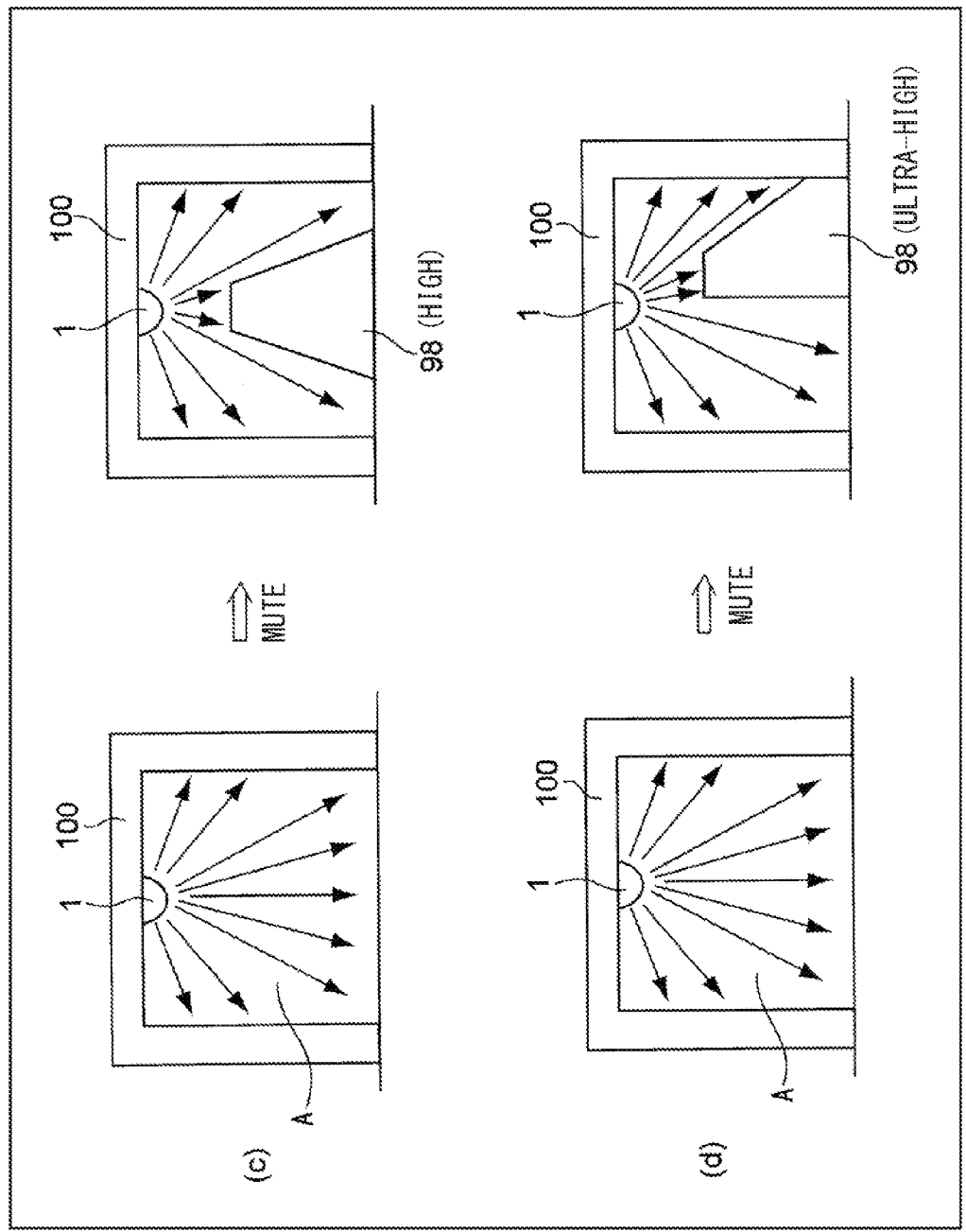
FIG. 32C is a view for explaining that a high muting area corresponding to a high work is set when the high work is detected.
FIG. 32D is a view for explaining that, when relatively the highest work is detected, a very high muting area corresponding to this very high work is set, in association with FIGS. 30 and 31.

FIGS. 30 to 32 show examples where, in the case of conveying different kinds of works W, when the height of the work W is defined by detection thereof with the sensors 121 to 123 and the type of the work W is defined based upon this height, a plurality of muting areas 98 matching respective outer edges of the different kinds of works W are set, so as to set the muting area 98 corresponding to each work W.

Referring to FIG. 30, an example of control is shown where the optical scanning type photoelectric switch 1 is arranged in a vertically downward direction at the gate 100, and a reflex light curtain is formed at the opening of the gate 100 by optical axes of this optical scanning type photoelectric switch 1. On its rising column 100a, a low-positioned sensor 121, a middle-positioned sensor 122 and a high-positioned sensor 123 are arranged in low, middle and high positions as vertically spaced thereamong. An example of control is where, before the work W enters the gate 100, namely before the work W passes through a light curtain formed by optical axes of the optical scanning type photoelectric switch 1, the height of the work W is determined by combination of ON/OFF of the low-positioned, middle-positioned and high-positioned sensors 121 to 123 and the type of the work W is determined based upon this height, to switch the muting areas 98(1) to 98(4) corresponding to the respective outer edges of the works W.

FIG. 31A shows a case where light enters each of all the sensors 121 to 123 arranged at the positions with different heights, which are the low, middle and high positions. In this case, the work W is regarded as one having a height to such an extent as not to interfere with the low-positioned sensor 121, and hence a first muting area 98 (low) which is relatively low or a first muting area 98 (low) in which the muting area is practically not present is set.

FIG. 31B shows a case where, out of the sensors 121 to 123 arranged at the positions with different heights, which are the low, middle and high positions, the low-positioned sensor 121 interferes with the work W and light is interrupted. In this case, the work W is regarded as one being higher than the arranged height of the low-positioned sensor 121 but lower than the arranged height of the middle-positioned sensor 122, and hence a second muting area 98 (middle) with a moderate height is set.

FIG. 32C shows a case where, out of the sensors 121 to 123 arranged at the positions with different heights, which are the low, middle and high positions, the low-positioned sensor 121 and the middle-positioned sensor 122 interfere with the work W and light is interrupted. In this case, the work W is one regarded as being higher than the arranged height of the middle-positioned sensor 122 but lower than the arranged height of the high-positioned sensor 123, and hence a third muting area 98 (high) which is relatively high is set.

FIG. 32D shows a case where light to each of all the sensors 121 to 123 at the low to high positions is interrupted. In this case, the work W is regarded as one being so high as to interfere with the high-positioned sensor 123, and hence a fourth muting area 98 (ultra-high) with the greatest height is set. This fourth muting area 98 (ultra-high) may be the whole of the protection area A ("full mute").

As thus described, a plurality of arbitrary muting areas 98 are prepared in the protection area A of the optical scanning type photoelectric switch 1, a suitable muting area 98 is set at a required timing for a required period of time, and when another muting area 98 is suitable, the muting area may be switched to this another muting area 98.

It is to be noted that, once an output of each of the low-positioned, middle-positioned and high-positioned sensors 121 to 123 comes into an ON state (work W sensing state=light interrupted state), transition to the OFF state is not immediately made even when light then enters, but the change to the OFF state is made after light continues to enter for a previously set predetermined period. This predetermined period is set by the user such that the output of each of the low-positioned, middle-positioned and high-positioned sensors 121 to 123 is turned OFF after the work W has completely passed through the light curtain formed by optical axes of the optical scanning type photoelectric switch 1.

In the example explained with reference to FIGS. 30 to 32, the muting area 98 is provided in the protection area A, while a plurality of areas are prepared as the muting areas 98 for switching of the muting area 98 as appropriate. As a modified example of this, for example, an area with the muting area 98 (low) of FIG. 31A removed therefrom may be set as the protection area A, and this protection area A may be added with the muting area 98 (low). Naturally, an area with the muting area 98 (middle) of FIG. 31B removed therefrom may be set as the protection area A, and this protection area A may be added with the muting area 98 (middle). Also in the case of FIG. 32C, similarly, an area with the muting area 98 (high) of FIG. 32C removed therefrom may be set as the protection area A, and this protection area A may be added with the muting area 98 (high). Also in the case of FIG. 32D, similarly, an area with the muting area 98 (ultra-high) of FIG. 32D removed therefrom may be set as the protection area A, and this protection area A may be added with the muting area 98 (ultra-high).

Further, when light enters each of all the sensors 121 to 123 arranged at the positions with different heights, which are the low, middle and high positions, the protection area A (added with the first muting area 98 (low)), which was described in relation with FIG. 31A, may be set, and when the low-positioned sensor 121 interferes with the work W and light is interrupted, the protection area A may be switched to the protection area A (added with the second muting area 98 (middle)), which was described in relation with FIG. 31B, and then set. Further, when the low-positioned sensor 121 and the middle-positioned sensor 122 interfere with the work W and light is interrupted, the protection area A may be switched to the protection area A (added with the third muting area 98 (high)) and then set, and when light to each of all the sensors 121 to 123 at low to high positions is interrupted, the protection area A may be switched to the protection area A (added with the fourth muting area 98 (ultra-high)) and then set.

Figure 33:
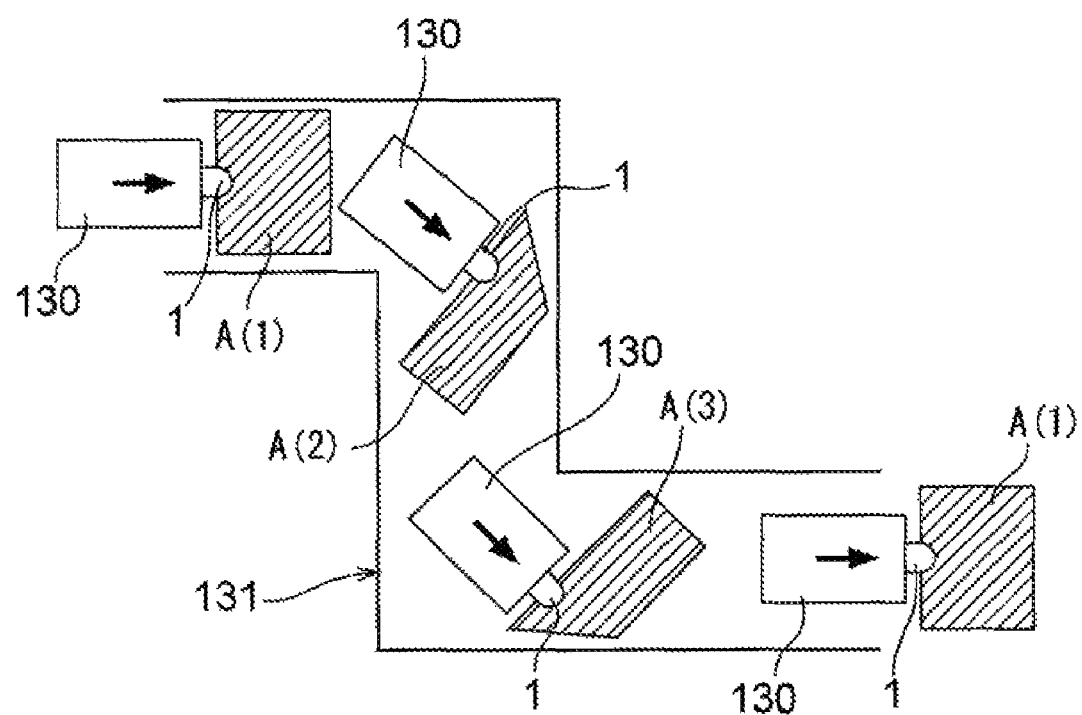
FIG. 33 is a view for explaining an example of installing the optical scanning type photoelectric switch on a traveling truck and switching the protection area in accordance with a passage along which the travelling truck is travelling.

Protection Area Switching Control:

A plurality of protection areas A(1) to A(3) may be previously set without a muting area and the protection area A may be switched in predetermined order. FIG. 33 is an example for explaining an example to which such switching is applied. The optical scanning type photoelectric switch 1 may be previously installed on the front end of a truck 130 that self-travels along a decided passage inside a factory or the like, and the protection area A(1) to A(3) are switched corresponding to the state of a passage 131. In this case, when it is assumed that three protection areas A(1) to A(3) are set, the order of switching of these protection areas A(1) to A(3) may be allowed to be previously set in concert with an input signal from the truck 130 (an operation of the truck 130). In this example of FIG. 33, the order of switching of the protection area A is set to "A(1)→A(2)→A(3)→A(1)", and this switching of the protection area A may be allowed to be set so as to be executed based upon, for example, a signal from the truck 130 in conjunction with orientations of tires of the truck 130.

Further, when stoppage of the truck 130 is involved in switching of the protection area A, a function for temporality halting emission of laser light, namely light projection halting function, may be provided. With this function, the safety output is turned OFF and hence an operation non-permitting signal is supplied to the truck 130, but since the truck 130 had stopped before the emission of the laser light was halted, it is practically not inconvenient, and meanwhile it is possible to prevent unnecessary interference of light with another photoelectric switch.

A Plurality of Output Systems:

As described above, the optical scanning type photoelectric switch 1 as a safety apparatus is provided with the muting function. While several other functions have been proposed to be provided to the optical scanning type photoelectric switch 1 similarly to the multi-optical axis photoelectric switch and a new function may also be developed in the future, an interlock function can be cited as an example. The interlock function is a function of preventing an automatic change in safety output of the optical scanning type photoelectric switch 1 from the OFF state (operation non-permitting) to the ON state (operation permitting), and this interlock function is served to prevent unintentional activation or reactivation of a machine.

Further, a start-interlock function and a restart-interlock function are prepared in the optical scanning type photoelectric switch 1. The start-interlock function is a function of holding the safety output in the OFF state at the time of turning-on of a power or recovery of power after failure thereof until the start-interlock function is manually reset. The restart-interlock function is a function of holding the safety output in the OFF state at the time when the optical scanning type photoelectric switch 1 comes into the OFF state during its operation until the restart-interlock function is manually reset. Further, whether or not these functions are validated or invalidated can be individually selected in accordance with an operational mode. For example, both interlock functions are valid in a manual-start manual-restart mode, the start-interlock function is valid while the restart-interlock function is invalid in a manual-start auto-restart mode, and both interlock functions are invalid in an auto-start auto-restart mode.

Figure 34:
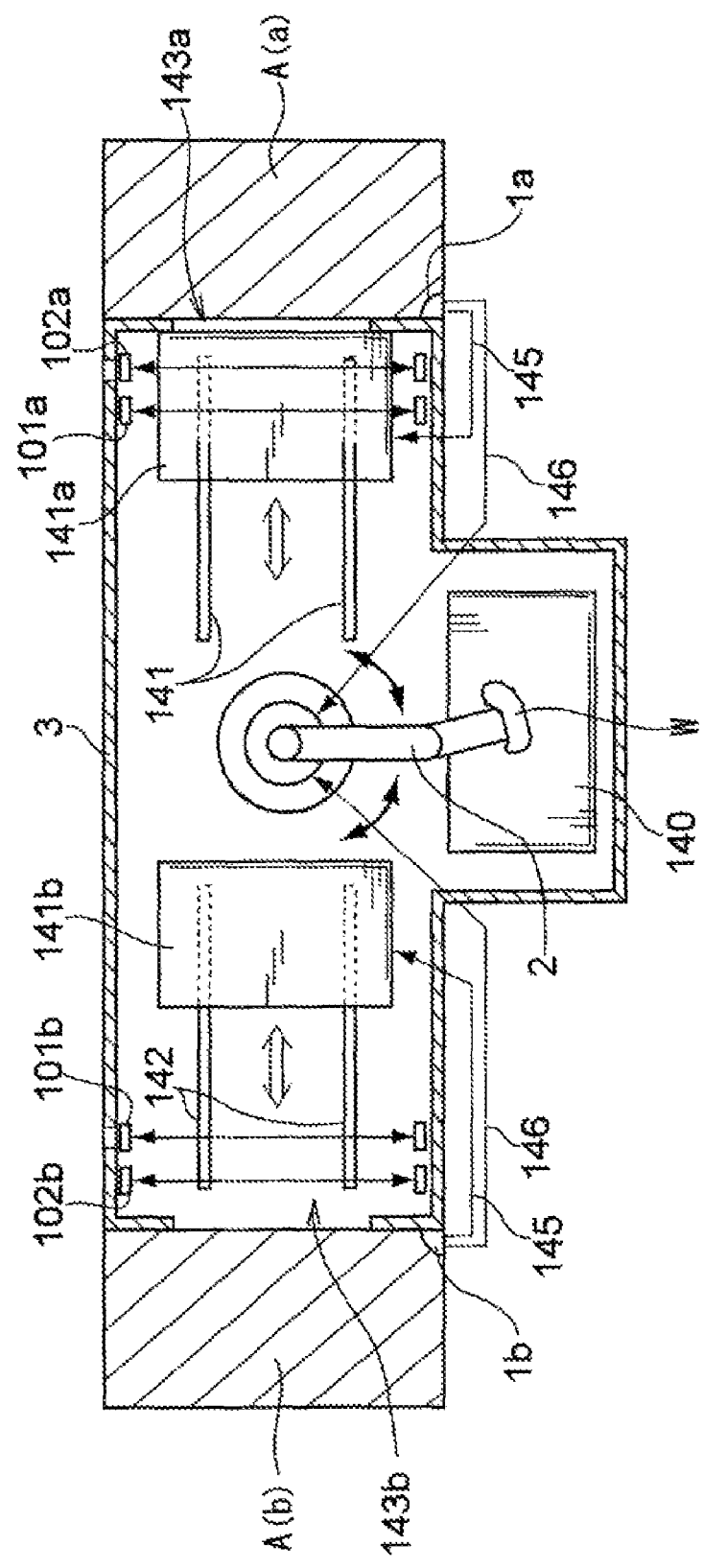
FIG. 34 is a view for explaining an example of applying an optical scanning type photoelectric switch provided with outputs of a plurality of systems.

It is preferable that the optical scanning type photoelectric switch 1 have outputs of a plurality of systems and the user be able to set a variety of safety functions, such as the muting function and the interlock function, and an operational mode with respect to the output of each system. FIG. 34 shows an example of this. The work robot 2 is installed in a danger area surrounded by the protective fence 3, and this work robot 2 performs an operation on the work W on a work table 140. This work robot 2 has work conveying tables 141a, 141b to its light and left, and each work conveying table 141a (or 141b) is guided by a rail 142a (or 141b), to self-travel backward and forward. Each work conveying table 141a (or 141b) can take a first position close to the work robot 2 and a second position close to a port 143 which is apart from the work robot 2 and can access the outside. In this second position, the operator places a work on the work conveyance bench 141a (or 141b), and the work conveying table 141a (or 141b) having received the work W moves to the first position. The work robot 2 receives the work from the work conveying table 141a (or 141b) in the first position, and processes the received work W on the work table 140.

In the vicinities of the right and left ports 143a, 143b, protection areas A(a), A(b) are respectively set by the optical scanning type photoelectric switch 1. In this optical scanning type photoelectric switch 1 inputted are signals from first and second mute sensor 101a (or 101b), 102a (or 102b) arranged in the vicinity of each port 143a (or 143b).

Figure 35:
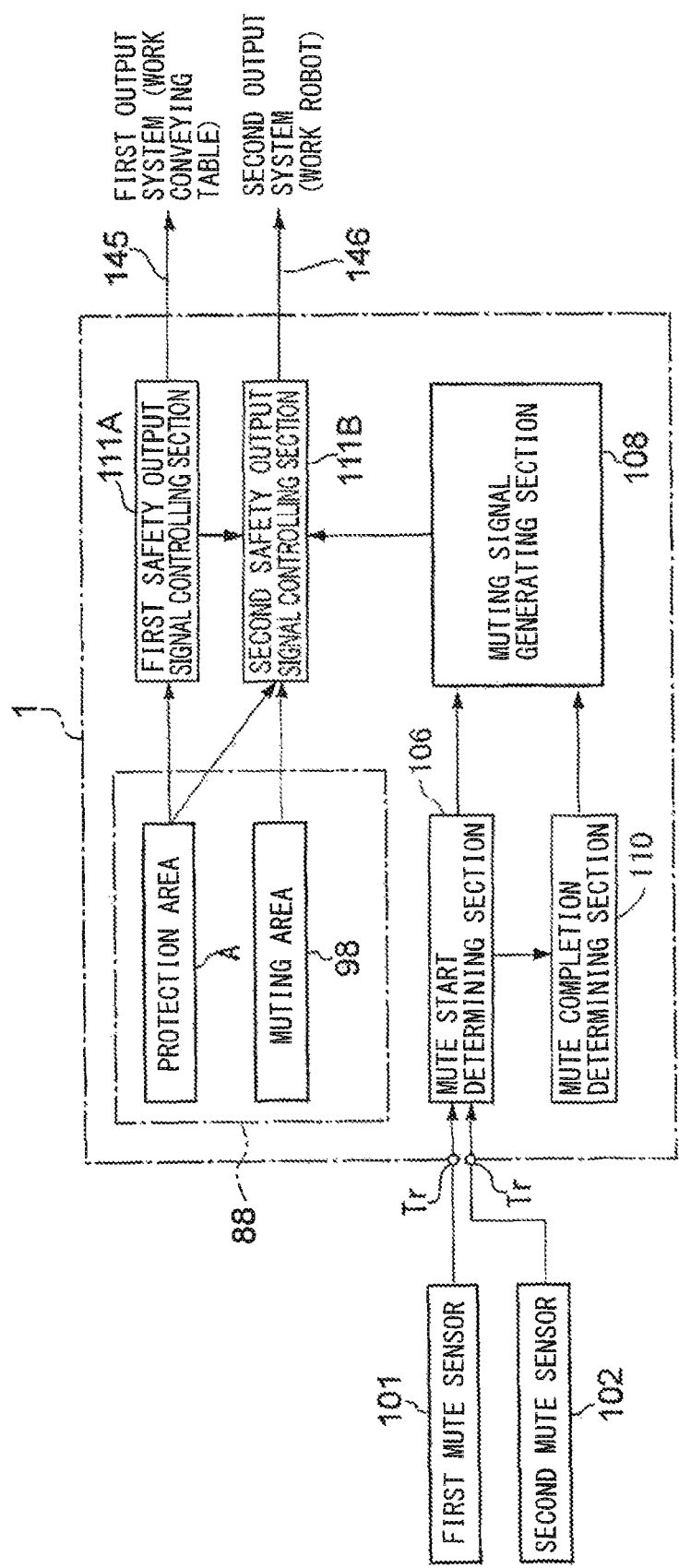
FIG. 35 is a block diagram for explaining an operation of the optical scanning type photoelectric switch provided with outputs of two systems in association with FIG. 34.

The optical scanning type photoelectric switch 1 has first and second output systems 145, 146, the first output system 145 is connected to a drive source of the work conveying table 141, and the second output system 146 is connected to a drive source of the work robot 2. The second output system 146 of the optical scanning type photoelectric switch 1 has the muting function (FIG. 35). The first output system 145 outputs an OFF signal as the safety output toward the work conveying table 141 when the object M (e.g. operator) enters the protection area A. The muting function is set in the second output system 146, and while the muting function is working, even when, for example, the operator enters the protection area A, an ON signal (safety signal) as the safety output is outputted to the work robot 2 regardless of sensing of the entry.

The muting function of the optical scanning type photoelectric switch 1 is operated when the first and second mute sensors 101a (or 101b), 102a (or 102b) sense the work conveying table 141a (or 141b), and the operation of the muting function is halted when the first and second mute sensors 101a (or 101b), 102a (or 102b) do not sense the work conveying table 141a (or 141b).

Returning to FIG. 34, FIG. 34 shows a state where the right-hand work conveying table 141a is located in the second position and the right-hand port 143a is closed by the right-hand work conveying table 141a. This right-hand work conveying table 141a brings the first and second mute sensors 101a, 102a into a light interrupting state, and thereby, the second output system 146 of the optical scanning type photoelectric switch 1 is on mute. Therefore, even when the operator enters the right-hand protection area A(a) and places the work on the right-hand work conveying table 141a or receives the already processed work W on the right-hand work conveying table 141a, the safety signal is supplied to the work robot 2 due to the second output system 146 being on mute, and the work robot 2 can perform an operation. On the other hand, the first output system 145 generates an warning signal due to the entry of the operator into the protection area A(a) and outputs the warning signal to the right-hand work conveying table 141a, thereby bringing the right-hand work conveying table 141a into an operation-halted state. Reasonably, even when the right-hand work conveying table 141a receives the warning signal from the optical scanning type photoelectric switch 1, it is not inconvenient since the state of the right-hand work conveying table 141a being in the halted state in the vicinity of the right-hand work port 143a remains unchanged, and meanwhile, it is possible to prevent an abrupt operation of the right-hand work conveying table 141a, so as to prevent an entry path toward the inside of the protective fence 3 from being created by opening of the right-hand port 143a having been closed by the work conveying table 141a.

The left-hand work conveying table 141b is located in a position adjacent to the work robot 2 and the left-hand port 143b is in an open state. Since an area in the vicinity of this left-hand port 143b has been set as the protection area A(b) by the optical scanning type photoelectric switch 1, when the operator enters this left-hand protection area A(b), warning signals are outputted to the left-hand work conveying table 141b and the work robot 2 through the first and second output systems 145, 146, and the left-hand work conveying table 141b and the work robot 2 are emergently halted.

Supposing that the optical scanning type photoelectric switch 1 only has one output system, when this output is divided and the divided outputs of the optical scanning type photoelectric switch 1 are connected to the work conveying table 141 and the work robot 2, the muting function cannot be used for preventing an abrupt operation of the work conveying table 141a, and the work robot 2 is halted while the operator enters the protection area A and performs an operation even though the operation of the work robot 2 does not pose a danger on the operator present in the protection area A, thereby decreasing an operation rate. When the optical scanning type photoelectric switch 1, for example, has first and second output systems and even when the muting is set by the optical scanning type photoelectric switch 1, it is possible to make such a setting that the muting function works only in the second output system connected to the work robot 2 and the muting function does not work in the first output system 145 connected to the work conveying table 141, so as to raise the operation rate of the work robot 2 while ensuring the safety.

Further, other than the foregoing example, for example when the work conveying tables 141a, 141b and the work robot 2 are synchronously operated and an electric cramp, not shown, for holding the work W is installed on each of the work conveying tables 141a, 141b, the foregoing first output system 145 is connected to a power source of the electric cramp and the foregoing second output system 146 is connected to the work robot 2 and the right-hand work conveying table 141*a* which are synchronously operated, thereby allowing the operator to safely receive and pass the work W from and to the electric cramp, change the work W, and remove the work W from the electric cramp, while the work robot 2 is put in operation. It is to be noted that, differently from the foregoing example, the right-hand port 143*a* having been closed by the work conveying table 141*a*, is opened due to an abrupt operation of the work conveying table 141*a*, which may cause creation of the entry path toward the inside of the protective fence 3. However, in this case, the muting state is reset since the mute sensor 101 comes into the non-sensing state (light entering state). Therefore, at the time point of resetting the muting, the work robot 2 and the work conveying table 141*a* are emergently halted, so that the safety of the operator can be ensured.

Here, the emergency halt means validation of the restart-interlock function, and the restart-interlock function has been validated on the second output system 146. In the foregoing two examples, when the second output system 146 comes into the OFF state, the right-hand port 143*a* having been closed by the work conveying table 141*a* is opened, which may cause creation of the entry path toward the inside of the protective fence 3. Therefore, after the second output system 146 has come into the OFF state due to the operator having entered the protection area A, even though the optical scanning type photoelectric switch 1 regards the operator as having left the protection area A, it cannot verify whether the operator has left for the outside of the protective fence 3 or has entered the inside of the protective fence 3 through the entry path although it can verify non-presence of the object M in the protection area A. For this reason, a machine (danger source) connected to the second output system 146 is not automatically restarted, and the optical scanning type photoelectric switch 1 determines whether or not to bring the second output system 146 into the ON state until accepting a manual resetting input after artificial safety verification by a person.

On the other hand, since the first output system 145 is in the OFF state even with the operator performing the normal operation and the entry path is closed by the work conveying table 141*a* in the normal state, when non-presence of the object M in the protection area A can be verified by the optical scanning type photoelectric switch, the operator can be regarded as having left for the outside of the protective fence 3, whereby it is preferable that the machine (danger source) connected to the first output system 145 be automatically restarted. That is, since the machine (danger source) has been normally halted, it is preferable that the machine (danger source) be automatically restarted at the stage of the operator leaving the protection area A, and an operation efficiency is also favorable. Accordingly, the first output system 145 may be set on a mode for invalidating the restart-interlock function, namely the manual-start auto-restart mode or the auto-start auto-restart mode. As opposed to this, the second output system 146 involves the emergency halt, and it is thus not desirable the machine (danger source) be automatically restarted even when the operator leaves from the protection area A. It is therefore preferable to operate the second output system 146 on the manual-start manual-restart mode by validating the restart-interlock function thereon. In addition, it may be configured such that, when any one output system on which the interlock function has been validated, out of a plurality of output systems, comes into the OFF state, it is regarded as the emergency halt and the other output systems are also brought into the OFF state. This can provide the convenience of the automatic restart in the normal operation and also brings all the output systems into the OFF state at the time of the emergency halt, and the state remains unchanged to the ON state at least until a manual resetting input is made, so that the safety can be ensured.

As describe above, concerning a variety of functions and modes settable by the user in the optical scanning type photoelectric switch 1, since the optical scanning type photoelectric switch 1 has a plurality of output systems and can be set with a function and a mode with reference to each of the output systems, a single optical scanning type photoelectric switch 1 is capable of rationally dealing with various states.

Further, although the example was shown where one protection area A(1) is set, this is not restrictive, and protection areas may be separately allocated with respect to the first and second output systems 145, 146 by the user's setting. In the case of a configuration to separately allocate the protection areas, it may be configured such that a setting of one protection area can be reflected to a setting of the other protection area so as to set the protection areas in the identical shape and position, or it may be configured such that a setting mode is provided for setting the protection areas in the identical shape and position. Further, each of the first and second output systems 145, 146 is preferably configured of two outputs (OSSD1, OSSD2, OSSD3, OSSD4) showing the identical output states (ON state/OFF state). When in the ON state, each output is superimposed with a self-diagnosis pulse, namely an inspection signal, with which the state changes from the ON state to the OFF state instantly (in such a length of time as to prevent an external device connected to each output from recognizing the change in output to the OFF state), and the failure sensing device 58 verifies whether each output can be turned OFF at any time.

Figure 36:
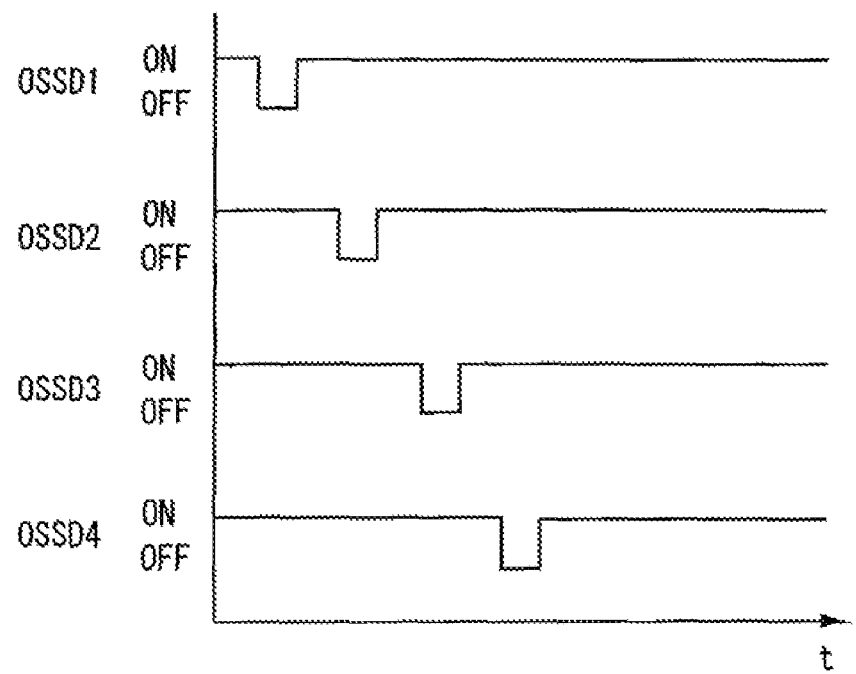
FIG. 36 is a time chart for explaining an example of providing a phase to an inspection signal in superimposition of the inspection signal on a safety signal in each of outputs of a plurality of systems.

Further, as shown in FIG. 36, a timing at which the self-diagnosis pulse as the inspection signal is superimposed is made different among each output. That is, it is preferably configured such that the superimposition at different timings in a time-division manner allows the failure sensing device 58 to verify that each output has not been shot-circuited. In other words, even in occurrence of a short circuit among the safety outputs, a failure can be sensed.

When a safety signal indicating permission of an operation is being outputted, based upon an inspection signal superimposed on this safety signal, the safety detection device using a self-diagnosis pulse determines whether or not a safety signal indicating non-permission can be outputted in units of the output device (OSSD), and when determining the signal cannot be outputted (output impossible), the safety signal indicating non-permission of the operation is outputted in place of the safety signal indicating permission of the operation, so that another output device (OSSD) in the same output system outputs the safety signal indicating non-permission of the operation to the external machine (danger source), whereby the external machine can recognize that the safety cannot be verified due to acceptance of the operation non-permitting signal or the inconsistency of the ON/OFF logic of the output devices (OSSD) in the identical output system. This ensures the safety of the optical scanning type photoelectric switch 1.

A Plurality of Output Systems and Individual Settings of Detection Capabilities:

When the optical scanning type photoelectric switch 1 includes a plurality of output systems, a detection capability including a detection sensitivity may also be made settable by the user with respect to each of the output systems. As also illustrated in FIG. 2, setting of the detection capability with respect to each output system is specifically described. It is assumed that a first protection area A1 set with a normal capability as the detection capability (normal capability) and a second protection area A2 set with a high capability while including the periphery of the first protection area A1 have been set by the user. In this case, such a setting can be made that the drive source (motor) of the machine (robot) operates at a normal speed when a second safety output corresponding to the second protection area A2 is in the ON state, and the drive source (motor) of the machine (robot) operates at a low speed when the second safety output corresponding to the second protection area A2 is in the OFF state. Meanwhile, such a setting can be made that power is supplied to the drive source (motor) of the machine (robot) when a first safety output corresponding to the first protection area A1 is in the ON state, and the power is not supplied to the drive source (motor) of the machine (robot) when the first safety output corresponding to the first protection area A1 is in the OFF state. Especially in the case of a machine that operates at a high speed or a machine with high inertial force (high inertia), since the motor cannot be suddenly halted even when the power supply to the motor is interrupted, the operation of the motor is changed to a low-speed operation upon sensing of the object (object M) in the second protection area A2 expanded farther from the first protection area A1 with respect to the machine, thereby facilitating to suddenly halt the machine (motor) at the point of sensing of the object (object M) in the first protection area A1. Accordingly, making the detection capability settable by the hand of the user with respect to each of the two output systems can accelerate the speed at which the machine performs the normal operation while the safety remains ensured.

Here, other than the detection sensitivity, examples of the settable detection capability include response time, a minimal detected object, and a light reception sensitivity. The response time is a setting condition corresponding to predetermined time or the time taken for a predetermined number of times of successive sensing of the object M inside the protection area A when the optical scanning type photoelectric switch 1 determines the presence of the object M inside the protection area A only after the lapse of the predetermined time or after the predetermined number of times of successive sensing. Therefore, the detection capability becomes high when the response time is short, and the detection capability becomes low when the response time is long. The minimal detected object is an object of the minimal size among objects of sizes reliably detectable by the optical scanning type photoelectric switch 1, and depends upon an optical axis density of the optical scanning type photoelectric switch 1. The detection capability becomes high when the set minimal detected object is small (the optical axis density is high), and the detection capability becomes low when the set minimal detected object is large (the optical axis density is low). For example, it is configured such that the number of optical axes for detecting an object in every scanning is set and the optical scanning type photoelectric switch 1 determines the presence of the object M inside the protection area A only after sensing the object M with the optical axes in the number not smaller than the set number, thereby making it possible to practically change the optical axis density, so as to change the detection capability. The light reception sensitivity means a gain of a light reception signal or a threshold with respect to the light reception signal. The detection capability increases by decreasing the gain or decreasing the threshold, and the detection capability decreases by decreasing the gain or increasing the threshold.

Although the respective relations of the detection capability and the safety function (muting function etc.) with the plurality of output systems were separately described, it goes without saying that the detection capability and the safety function can be combined and then set with respect to each output system. As for the individual setting of the detection capability with respect to each of a plurality of output systems, the setting is naturally effective not only in the optical scanning type photoelectric switch 1, but also in safety apparatuses such as the multi-optical axis photoelectric switch and the single optical axis photoelectric switch. For example, the multi-optical axis photoelectric switch is installed horizontally to the ground, one or a plurality of optical axes on the side closer to the machine (danger source) are allocated to the first safety output, and one or a plurality of optical axes on the side farther from the machine (danger source) are allocated to the second safety output, whereby, as in the above example, the first safety output can be set to have a normal detection capability and the second safety output can be set to have a relatively high detection capability. Here, it is as described above that the detection capability here means the response time, the minimal detected object, the light reception sensitivity, or the like.

On the other hand, as for the individual setting of the safety function with respect to each of a plurality of output systems, the setting is effective in a safety apparatus capable of detecting a position of the object M such as the optical scanning type photoelectric switch, and other than the optical scanning type photoelectric switch, a safety image switch can be cited. In the case of a safety image switch with an image element built therein, protection areas may be set with respect to the first and second safety outputs on a picked up two-dimensional image, or a protection space may be set with respect to a three-dimensional maximum protection space recognized from two-dimensional images picked up by one or a plurality of safety image switches, thereby to individually set the safety function with respect to each of the first and second output systems.

Although the optical scanning type photoelectric switch 1 is configured in the above example so as to set the safety function such as the muting function or the interlock function or set the detection capability such as the response time, the minimal detected object or the light reception sensitivity with respect to each of the plurality of output systems, it may further be configured such that a condition of reflecting an output state of another output system as it is and independently setting only a superposed self-diagnosis pulse with respect to each output can be selected, or such that a setting of a condition of fixing the output system to the OFF state can be selected by the user. The same also applies to the safety image switch.

Countermeasure Against Interference Between Photoelectric Switches:

As described above with reference to FIG. 33, for example in the case of mounting the optical scanning type photoelectric switch 1 on the travelling truck 130, when another optical scanning type photoelectric switch 1 is installed in the vicinity of the passage 131, there is a possibility of occurrence of interference between the optical scanning type photoelectric switch 1 on the truck 130 and another optical scanning type photoelectric switch 1 fixed in the vicinity of the passage 131 in the process of movement of the travelling truck 130. Naturally, this is a mere example, and there is also the possibility of occurrence of the interference problem between the optical scanning type photoelectric switches 1 mounted on a plurality of travelling trucks 130 when those trucks 130 mutually approach. As another example, there can also be cited a case of occurrence of the interference problem between a plurality of fixed optical scanning type photoelectric switches 1. This problem is not restricted to one between the optical scanning type photoelectric switches 1, but the interference problem may also occur even between the optical scanning type photoelectric switch 1 and another kind of photoelectric switch (synonymous with a photoelectric sensor).

Figure 37:
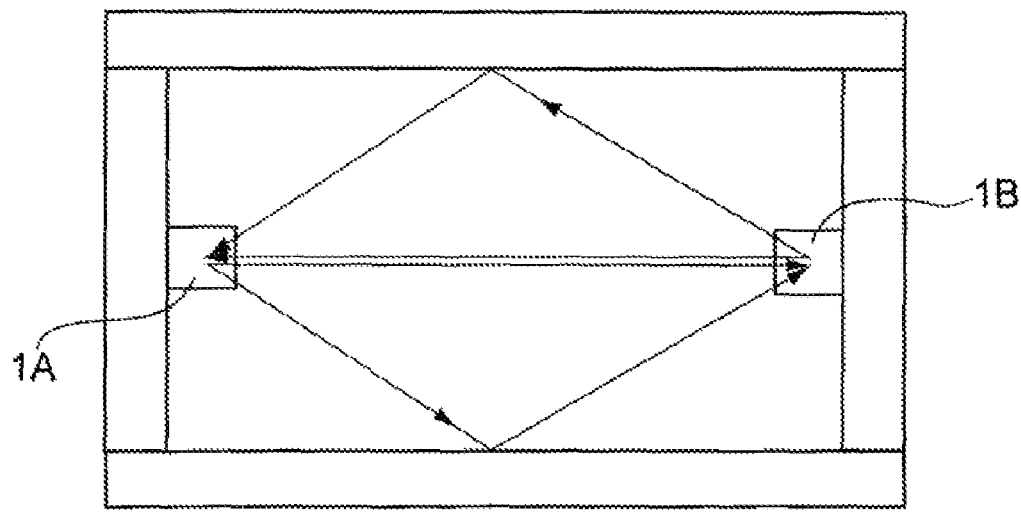
FIG. 37 is a view for explaining that a problem of interference between adjacent two optical scanning type photoelectric switches is apt to occur.
Figure 38:
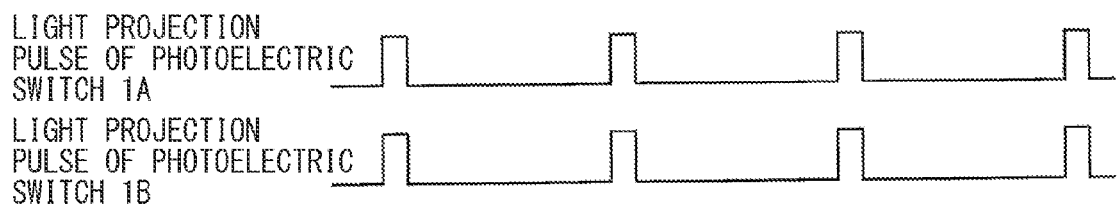
FIG. 38 is a time chart for projection light pulses when interference occurs between the two optical scanning type photoelectric switches.

FIG. 37 shows a case where light projected by each one of adjacent two optical scanning type photoelectric switches 1A, 1B enters the other to cause interference and an example where laser light reflected by a surrounding structure enters each switch to cause interference, and FIG. 38 is a time chart for projection light pulses when the adjacent optical scanning type photoelectric switches 1A, 1B interfere with each other. When the interference problem occurs between the adjacent optical scanning type photoelectric switches 1, 1, it becomes a cause of inducing a problem of preventing accurate calculation of the distance to the object (object M).

The optical scanning type photoelectric switch 1 is set so as to be operated with the following parameters:

(1) As described above, the optical scanning type photoelectric switch 1 is provided with the photoelectric rotary encoder 25 by means of the theory of light passing through a plurality of slits equally spaced in a circumferential direction, and the timing for light projection of the light projecting element LD is defined using an output of the rotary encoder 25. Therefore, an angular resolution is 0.36 degrees as described above; (2) a rotation period (scanning period) is 30 ms; and (3) a light projection period is 30 µs. Namely, when light is projected at every 0.36 degrees in a 360-degree turn, a total of 1000 times of light projection operations are executed in the 360-degree turn. When 30 ms is set as the rotation period (scanning period) in one turn, the light projection period is {300 ms/1000}, namely 30 µs. The scanning period, namely a period of one turn of the scanning mirror 14 is defined by a rotation speed of the motor 24.

Figure 39:
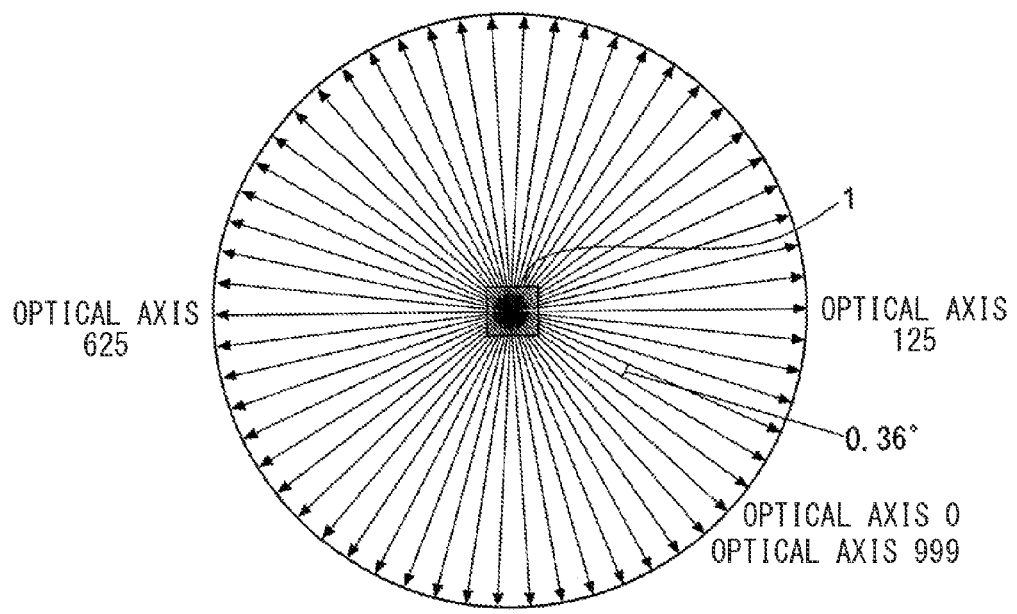
FIG. 39 is a view for explaining a condition where laser light is radially projected by rotation of a scanning mirror of the optical scanning type photoelectric switch.
Figure 40:
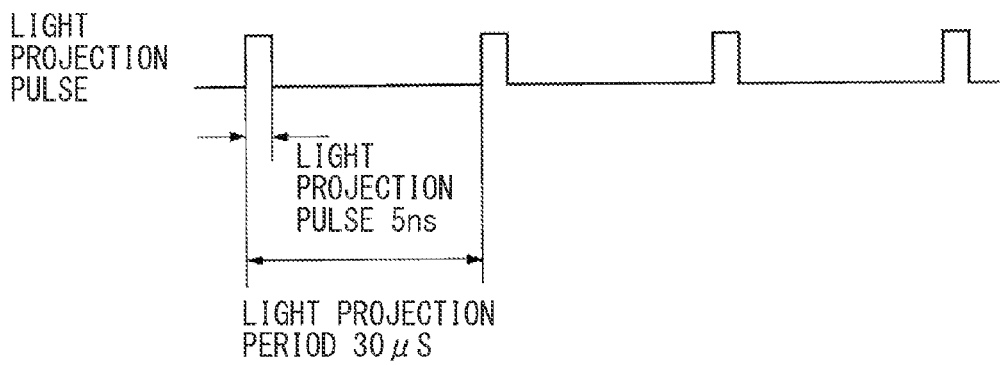
FIG. 40 is a diagram for explaining a light projection period of the light projection pulse.
Figure 41:
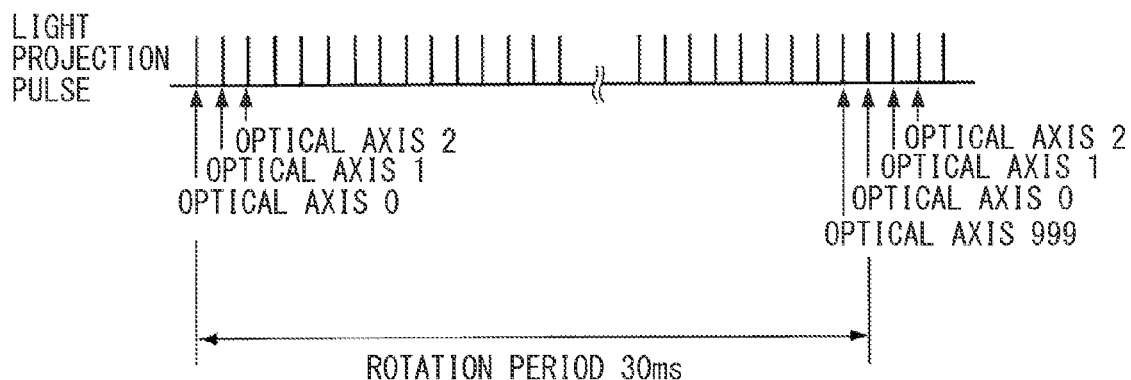
FIG. 41 is a diagram for explaining a rotation period of the scanning mirror, namely scanning period.

FIG. 39 shows a situation where the optical scanning type photoelectric switch 1 radially projects laser light from the center of the optical axis. FIG. 40 is a time chart for the light projection pulse. FIG. 41 illustrates the light projection pulses, each in the time range of FIG. 40, until the lapse of about 30 ms (one turn period).

Figure 42:
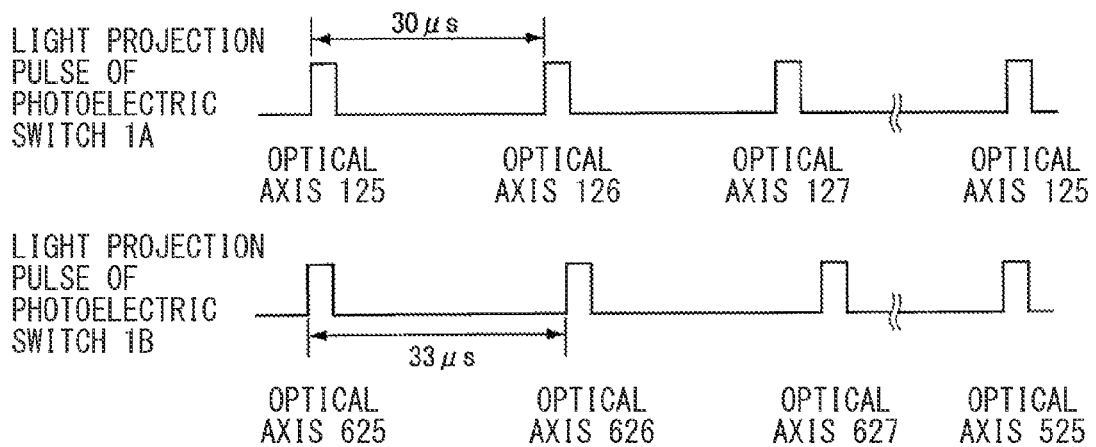
FIG. 42 is a diagram for explaining an example of control where the light projection period is made different between the adjacent optical scanning type photoelectric switches, so as to prevent interference.

One technique for avoiding interference between the optical scanning type photoelectric switch 1 and a photoelectric switch (synonymous with a photoelectric sensor) adjacent thereto is shown in FIG. 42. FIG. 42 shows a time chart for light projection pulses of first and second optical scanning type photoelectric switches 1A, 1B. As can be understood from this FIG. 42, as for light projection pulse periods of the first and second optical scanning type photoelectric switches 1A, 1B, the period is set to 30 µs in the first optical scanning type photoelectric switch 1A while the period is set to 33 µs in the second optical scanning type photoelectric switch 1B. Pulse widths of the light projection pulses of those switches are the same, and making the pulse widths the same can suppress an influence of the detection sensitivity. In this manner, by setting the light projection periods different between the first and second optical scanning type photoelectric switches 1A, 1B, even if mutual interference occurs between any optical axes, a phase difference of 36 degrees in rotation period is generated therebetween in a next scan, and hence the interference does not occur in succession in a plurality of times of scanning. In this connection, generally in the photoelectric switch, an output is changed only after a plurality of times of sensing in order to avoid an erroneous operation due to noise or a suspended matter, and therefore, setting light projection periods different between a plurality of photoelectric switches can practically prevent erroneous detection due to interference between adjacent photoelectric switches. It is to be noted that, generally in the optical scanning type photoelectric switch 1, reflected light is received on the scanning mirror 14 and the light is then collected on the light receiving lens 20 to acquire a light reception signal, and therefore, generally speaking, the interference problem does not take place so long as there is a displacement in orientation between the optical scanning type photoelectric switches 1 even when light are received at the same timing.

Figure 43:
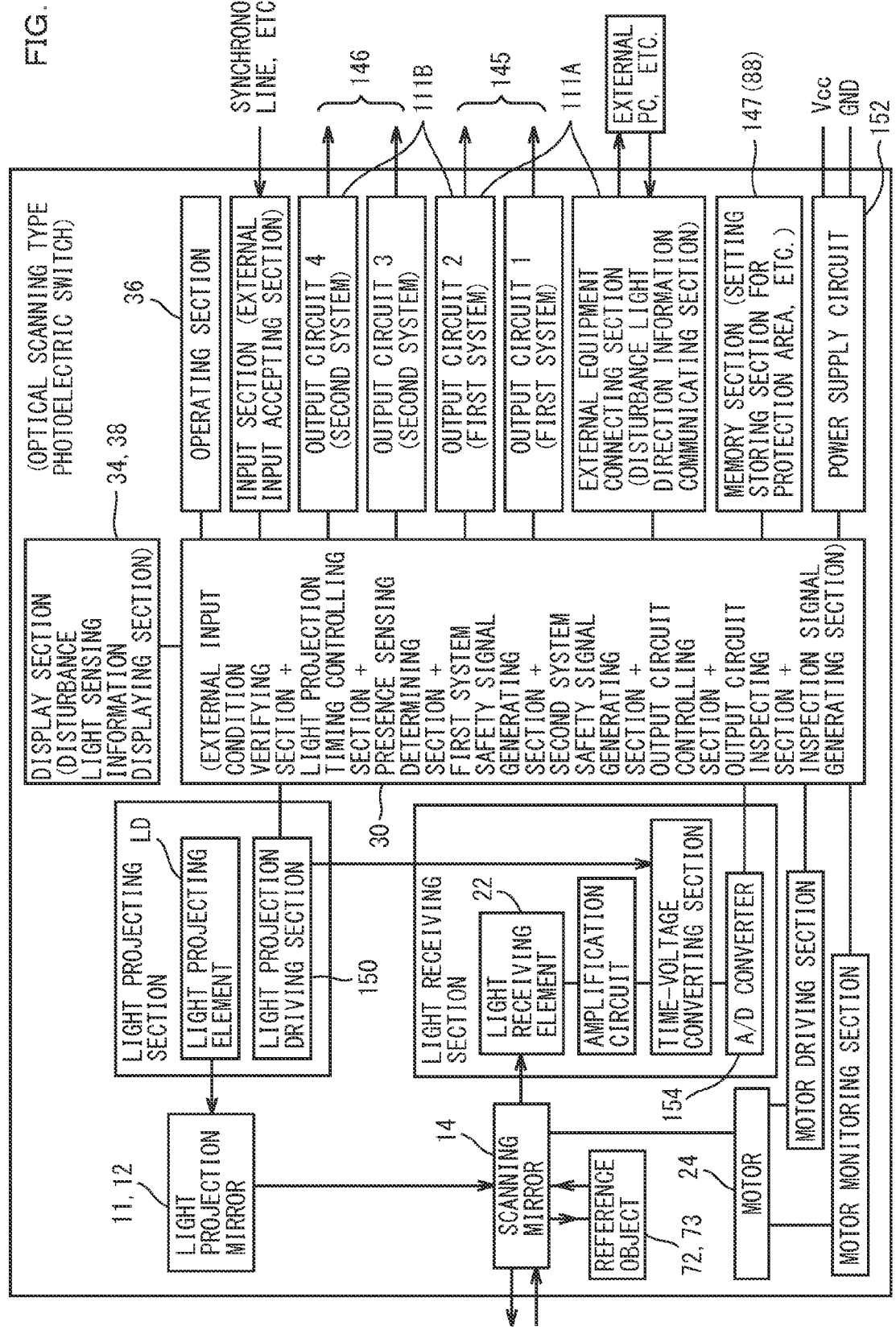
FIG. 43 is a diagram showing in the form of a block diagram a basic configuration of the optical scanning type photoelectric switch related to the present invention.

FIG. 43 shows a diagram showing in the form of a block diagram a basic configuration of the optical scanning type photoelectric switch 1, and the optical scanning type photoelectric switch 1 of this FIG. 43 is provided with the foregoing two output systems (FIG. 35). A rotation speed of the motor 24 may be set as the light projection pulse period, and for this, the light projection/reception timings of the control device 30 may be set, typically using an external PC. Naturally, the light projection/reception timings may also be made settable such that set items are displayed in the liquid crystal display section 34 of the optical scanning type photoelectric switch 1 and the user operates the operation button 36. The set light projection/reception timings, namely light projection/reception periods, are stored into an internal memory 147 along with the set protection area A and the like.

Figure 44:
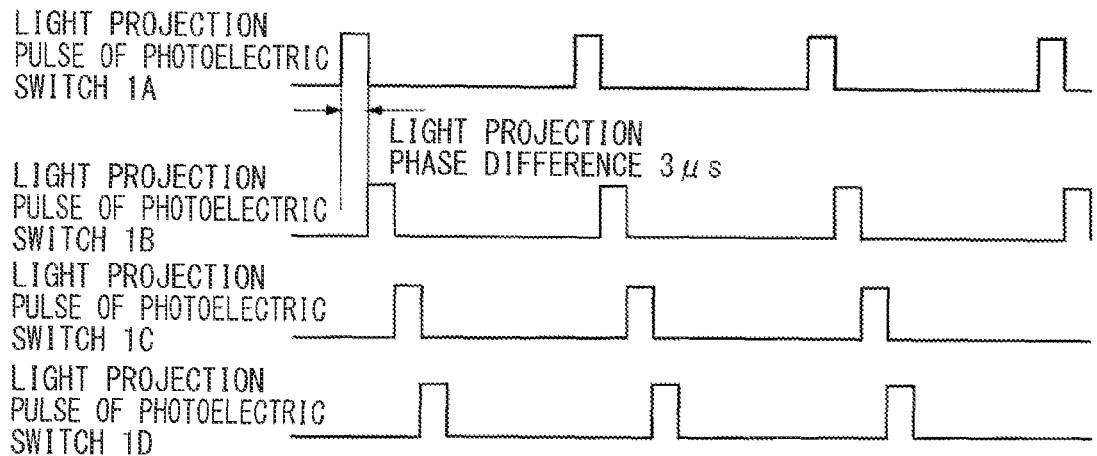
FIG. 44 is a diagram for explaining an example of control where a plurality of optical scanning type photoelectric switches are mutually connected and a phase is provided to the light projection timing, so as to prevent interference.

FIG. 44 is a diagram for explaining a second technique for avoiding interference among a plurality of photoelectric switches. This example of FIG. 44 is taken on the assumption that first to fourth optical scanning type photoelectric switches 1A to 1D are mutually connected through a synchronous line. In other words, timings of each of the first to fourth optical scanning type photoelectric switches 1A to 1D are defined by signals from the synchronous line, and setting a phase difference among light projection pulses can prevent interference among the first to fourth optical scanning type photoelectric switches 1A to 1D. When the timing for capturing a light reception signal after light projection by the optical scanning type photoelectric switch 1 is generally 2 µs, setting 3 µs as the phase difference can resolve the interference problem.

Figure 45:
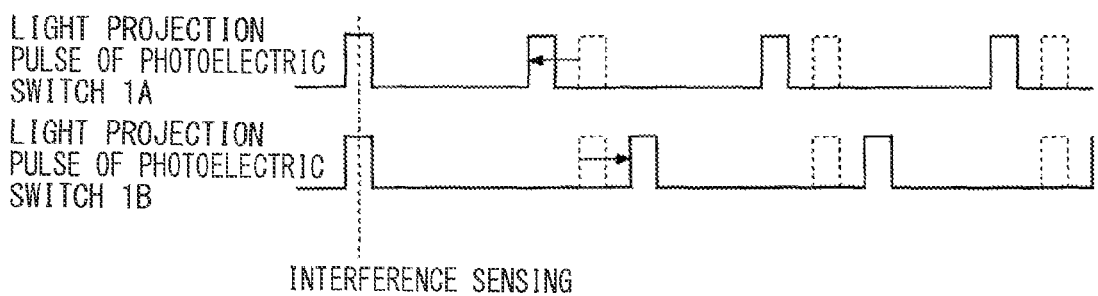
FIG. 45 is a diagram for explaining an example of control where a phase is provided to the light projection timing when interference is sensed in the adjacent optical scanning type photoelectric switches.

FIG. 45 is a diagram for explaining a third technique for avoiding interference between a plurality of photoelectric switches. This example of FIG. 45 is to propose that, when interference occurs between the adjacent two photoelectric switches 1, 1 and this is then sensed, a phase difference be set by changing light projection timings of a next optical axis or afterward of either or both of the optical scanning type photoelectric switches. As a technique for sensing the interference, for example when light reception is detected on a specific optical axis discontinuously, but not a plurality of times in succession, and a frequency of such non-detection is not smaller than a predetermined frequency, this may be considered as interference between the photoelectric switches. Naturally, as a modified example, such control may be added as to change the light projection pulse period or the light projection period (rotation speed of the motor 24), described concerning FIG. 42, upon sensing of interference. As for detection of interference, on top of the foregoing examples, such control may be added as to change the light projection pulse period or the light projection period (rotation speed of the motor 24) upon determination of the possibility of interference based upon a time difference t from light projection to light reception, as described later with reference to a flowchart of FIG. 51.

The foregoing three techniques are techniques of making the rotation speed of the motor 24 different between the adjacent optical scanning type photoelectric switches 1, 1, to make the scanning period different therebetween in order to prevent interference therebetween, and as a modified example, when the light projection timing of the optical scanning type photoelectric switch 1 is clock-controlled, the light projection timing period may be made different between the adjacent optical scanning type photoelectric switches 1, 1. Namely, such a configuration may be adopted where the light projection pulse period may be made different between the adjacent optical scanning type photoelectric switches 1, 1.

Further, concerning the change in setting of the rotation speed of the motor 24 or the light projection pulse period of the optical scanning type photoelectric switch 1, such a change may not be made by means of the external personal computer PC, but may be allowed to be made by means of the liquid crystal display section 34 and the operation button 36 of the optical scanning type photoelectric switch 1 without the external personal computer PC as described above. As described later with reference to FIG. 48, while this photoelectric switch 1 is capable of setting several parameters by means of the liquid crystal display section 34 and the operation button 36, addition of the rotation speed of the motor 24 or the light projection pulse period as one of the set items of the parameters can prevent the interference between the adjacent optical scanning type photoelectric switches 1, 1 by the user without the use of the external personal computer PC. Further, it may be configured such that a plurality of light projection pulse periods or a plurality of light projection pulse periods are previously stored into the internal memory 147 (FIG. 43) of the optical scanning type photoelectric switch 1 and a desired light projection pulse period or a plurality of light projection pulse periods may be arbitrarily selected and then set by the user out of the stored periods. Naturally, when it is determined that interference may have occurred based upon the foregoing time difference t from light projection to light reception (FIG. 51), such control may be performed as to switch the light projection pulse period or the light projection period (rotation speed of the motor 24) to another light projection pulse period or light projection period (rotation speed of the motor 24) stored in the internal memory 147.

Although the technique for resolving the problem of the interference with another photoelectric switch (photoelectric switch) was described with reference to FIGS. 37 to 45, there is a problem other than this, which is a problem due to disturbance light. When disturbance light is superimposed on reflected light of the optical scanning type photoelectric switch 1, this tends to lead to a problem of detecting erroneously positional information. In order to deal with the problem, the optical scanning type photoelectric switch 1 (1) has adopted the light transmitting cover 62 with the function of the optical filter, and (2) has adopted the filter circuit to remove a signal with a frequency component other than reflected light from the object (object M), but the problem has not been completely dealt with.

When an influence may be exerted by disturbance light, the user adjusts an angle or a height at which the optical scanning type photoelectric switch 1 is installed, and at the time of this adjustment, it is advantageous to verify from which direction the disturbance light is incident. Further, when it is verified whether or not the influence exerted by the disturbance light disappears after the adjustment, it becomes unnecessary to repeat adjustment of an installation position of the optical scanning type photoelectric switch 1 in each occurrence of erroneous operation of the optical scanning type photoelectric switch 1. As described above, since the photoelectric switch is generally set so as to change an output after sensing that values of measurement made a plurality of times, namely measured distance values, are successively inside the protection area A, even though the disturbance light does not immediately induce an erroneous operation, the optical scanning type photoelectric switch 1 may be operated with its detecting capability in a deteriorated state (with the response time in an extended state), which is not preferable for the optical scanning type photoelectric switch 1 as the safety apparatus.

Figure 46:
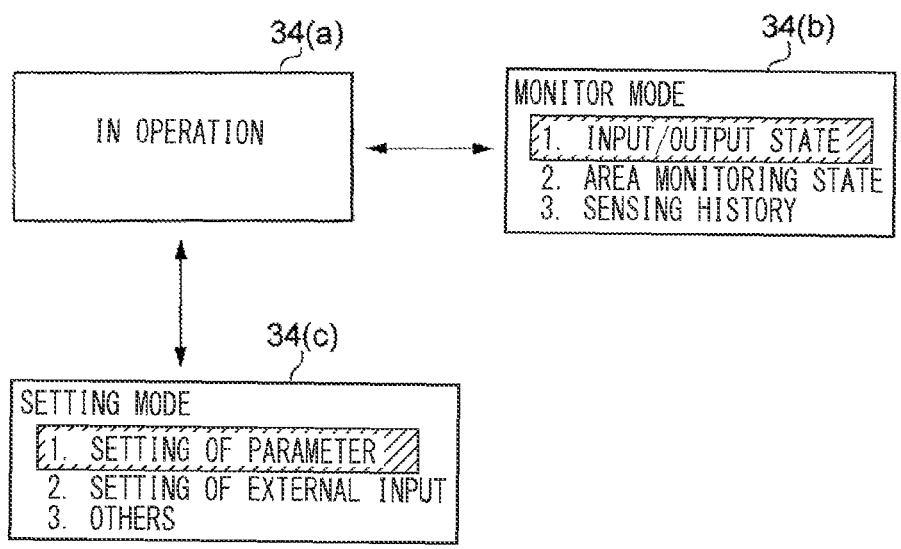
FIG. 46 is a diagram for explaining a change in display mode of a liquid crystal display section installed in the user interface section of the optical scanning type photoelectric switch to which the present invention is applied.

The optical scanning type photoelectric switch 1 has three operational modes: (1) an "operation mode"; (2) a "monitor mode"; and (3) a "setting mode". When the operational mode is switched, the display in the liquid crystal display section 34 of the optical scanning type photoelectric switch 1 is switched to a display of FIG. 46. FIG. 46 is a transition diagram for the display of the liquid crystal display section 34, where reference symbol 34(a) denotes a display during operation on the operation mode, reference symbol 34(b) denotes a menu screen of the monitoring mode, and reference symbol 34(c) denotes a menu screen of the setting mode.

Referring to foregoing FIG. 6B, in the user interface section 32, the operation buttons 36a to 36e are arranged adjacently to the liquid crystal display section 34. The upper and lower buttons 36a, 36b are keys for inputting a numerical value and switching a display screen. For example, the upper button 36a can be used as an up-key for increment. Further, the lower button 36b can be used as a down-key for decrement. Three operation buttons 36c to 36e are arranged adjacently alongside below the liquid crystal display section 34, and these operation buttons 36c to 36e are used as keys for switching the operational mode and deciding a set value. For example, the central operation button 36c can be used for switching the mode, the right operation button 36e is an enter (Enter) key, and the left operation button 36d is an escape (Esc) key.

When the "operation mode" is selected, the optical scanning type photoelectric switch 1 executes sensing of the entry object M. A shift from the "operation mode" to the "monitor mode" can be made by operating the central operation button 36c. Further, during operation on the "monitor mode", the mode can be returned to the "operation mode" by operating the left operation button 36d (Esc key).

Figure 47:
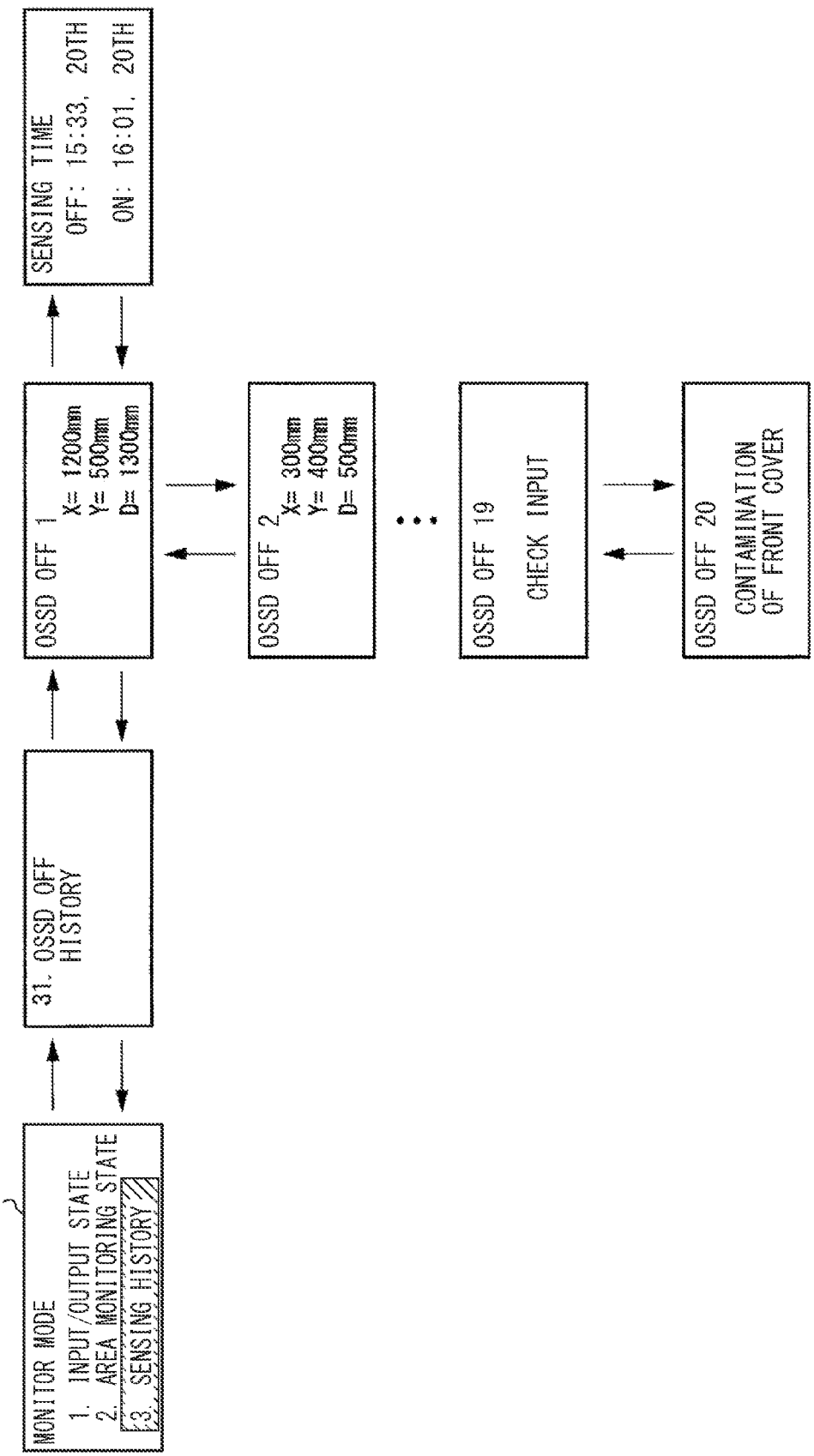
FIG. 47 is a diagram for explaining transition of display in a monitor mode of FIG. 46.

With reference to FIG. 47, the "monitor mode" is the operational mode for displaying an input/output state, an area monitoring status, sensing histories, and the like. As the input/output state, a safety output state of the optical scanning type photoelectric switch 1, an input state from an external relay circuit, and the like can be displayed in the liquid crystal display section 34 for monitoring. As the area monitoring status, a shape and a size of a set monitoring area, a distance to a sensed entry object, and the like can be monitored. As the sensing histories, a position of an entry object having become a trigger for outputting an operation non-permitting signal, the time of sensing of the object, error information and the like are held as sensing histories at the time of the safety output being OFF. In histories of the error information, the time of turning-OFF of the safety output and a factor for the turning-OFF (a cause of the turning-off of the safety output) are included, and when the safety output is turned OFF due to disturbance light, an optical axis number that defines a direction of the disturbance light is included in the error information histories.

The sensing histories can be displayed in succession from the latest one. As for such sensing histories, 20 records are held at the maximum, and the oldest sensing history is sequentially cleared every time a new one is obtained. As positional information of the entry object, for example, a numerical value indicating a position of the entry object is displayed by means of an orthogonal coordinate with the optical scanning type photoelectric switch 1 at the center. Alternatively, a numerical value indicating a distance D from the safety sensor 1 to the entry object is displayed. Further, as the error information, for example, information showing occurrence of a defect due to contamination of the light transmitting cover 62, an output short circuit, or the like is displayed. Moreover, as the history information, other than the positional information and the error information, information showing a check input from the external equipment is present. This check input is an external input for verifying whether or not the safety output is properly turned OFF.

The "setting mode" is the operational mode for performing a setting of parameters for designating the protection area A as well as a setting of an external input. A shift from the "operation mode" to the "setting mode" can be made by operating the central operation button 36c. Further, during operation on the "setting mode", the mode can be returned to the "operation mode" by operating the left operation button 36d (Esc key). In a setting start screen, selectable menu items are arranged, and a desired menu item can be selected by operating the upper and lower operation buttons 36a, 36b.

Figure 48:
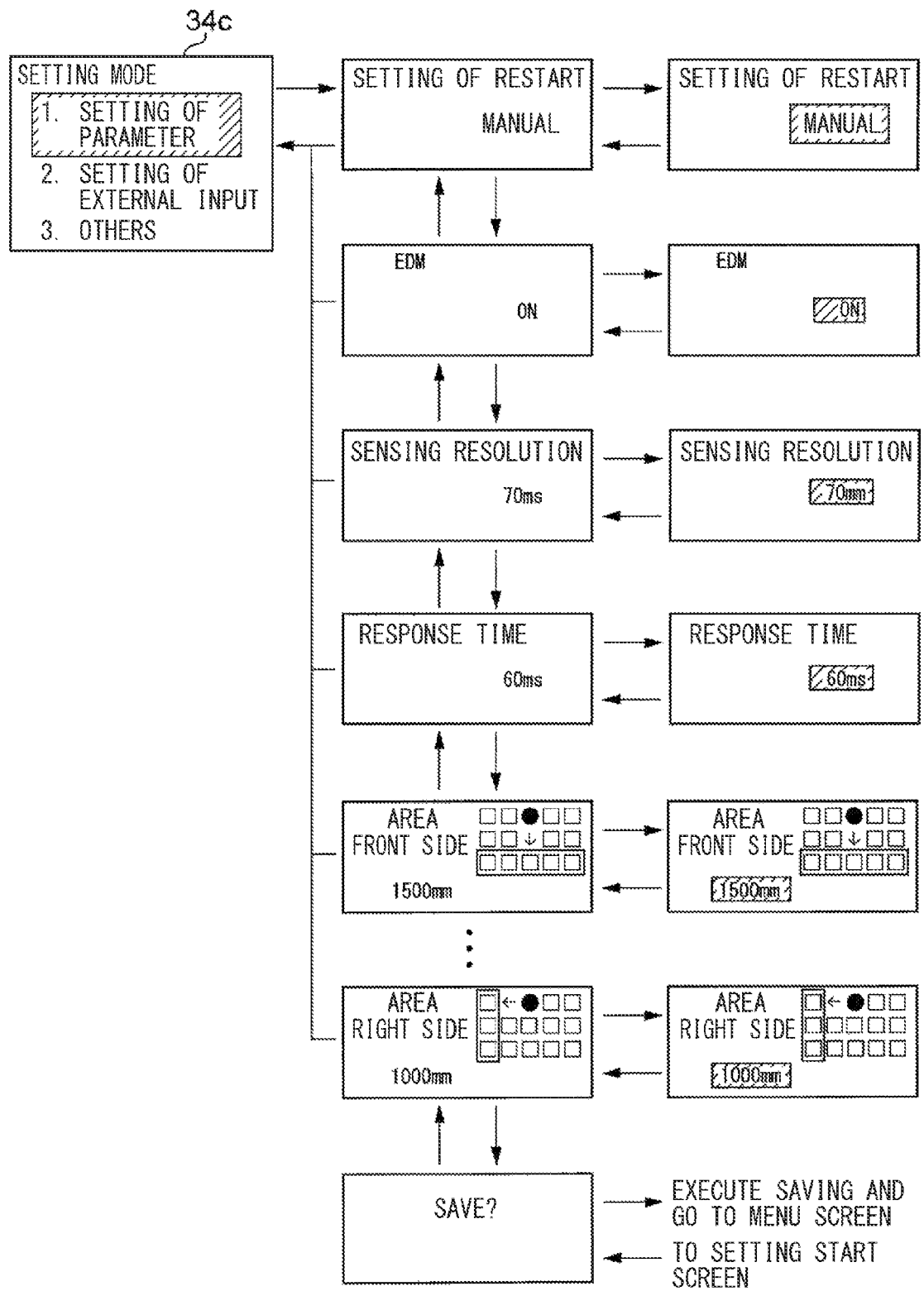
FIG. 48 is a diagram for explaining transition of display in a setting mode of FIG. 46.

FIG. 48 shows an example of a display screen concerning settings of parameters on the setting mode. Parameters whose settings are changeable include a restart setting, an EDM, a sensing resolution, a response time, and the like. As for the restart, whether the optical scanning type photoelectric switch 1 is restarted manually or automatically can be selected. As for the EDM, whether an external relay monitoring function is turned ON or OFF can be selected. The sensing resolution of the entry object (object M) can be arbitrarily designated within a predetermined range.

The histories of the error information can be verified by the external personal computer PC (FIG. 13) connected to the optical scanning type photoelectric switch 1. An application for displaying histories of error information is installed in the external personal computer PC, and using this program, the histories of the error information can be displayed on the display 81 of the personal computer PC.

Figure 49:
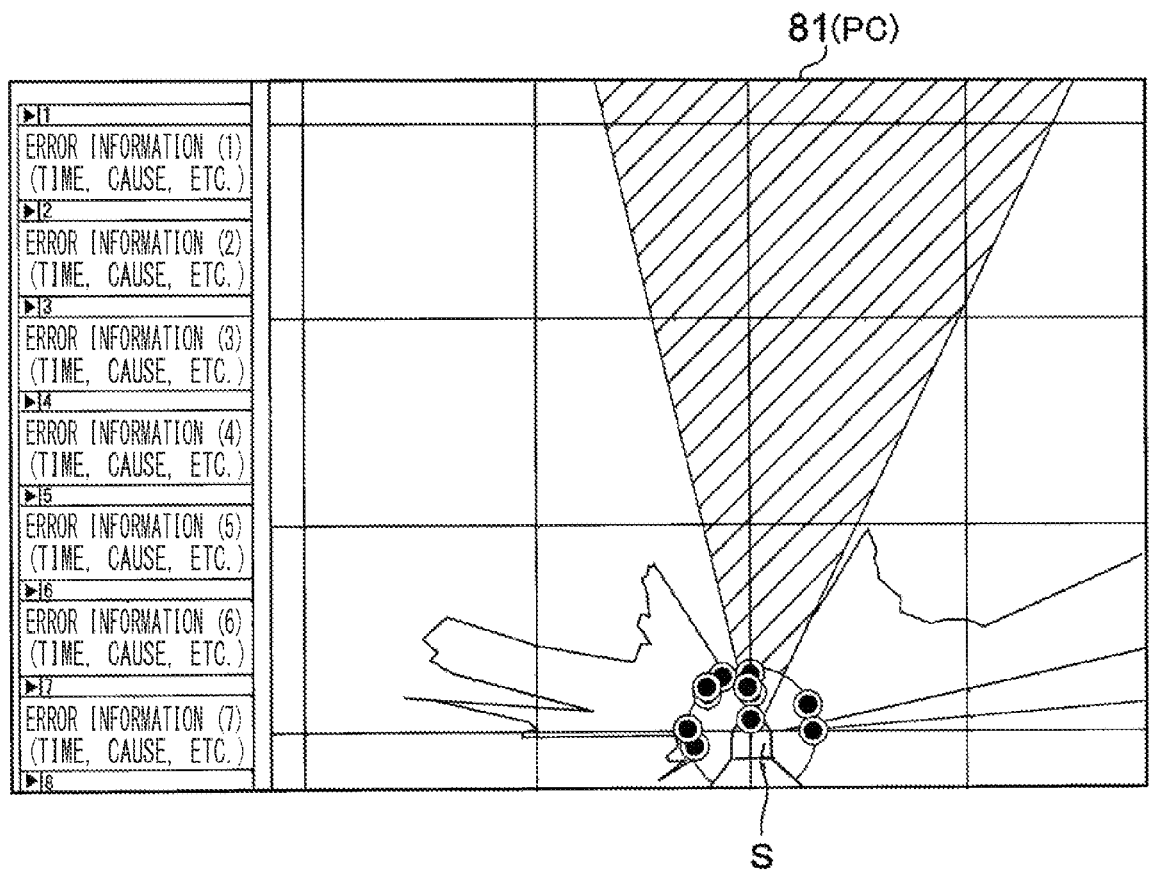
FIG. 49 is a view for explaining that, by means of a personal computer as a terminal with a display which is connected to the optical scanning type photoelectric switch, a direction of generation of disturbance light can be displayed on a display of the personal computer.

FIG. 49 shows a screen display of disturbance light included in a display of error information by means of the personal computer PC. On the display 81 of the personal computer PC, on its one side, histories of error information are displayed in a time-series manner. This list-display includes, with respect to each piece of the error information: (1) a cause of an error; (2) an error occurrence time; and (3) preferably, a number of an optical axis where the error occurred. When the user selects an arbitrary error history, a direction of disturbance light is displayed with a striking color along with a symbol S of the optical scanning type photoelectric switch 1. Whether this display concerning disturbance light is continuously displayed or it is not continuously displayed but displayed when requested by the user may be made optionally settable. FIG. 49 illustrates a display example of the display 81 of the personal computer PC when the optical scanning type photoelectric switch 1 connected with the personal computer PC is in an operating state, which is a state where the operation of the optical scanning type photoelectric switch 1 is continuously monitored by the personal computer PC. In this FIG. 49, black circles seen around the symbol S of the optical scanning type photoelectric switch 1 indicate histories of a cause location at the time when the safety output comes into the OFF state, for example, histories of a position where the object M was detected inside the protection area A. In FIG. 49, disturbance light are seen in a large number in a hatched region expanding in sectoral shape upward from the symbol S, and this disturbance light is displayed with a straight line radiating from the symbol S. Therefore, the user can see a direction of the disturbance light by looking at the straight line radiating from the symbol S.

Figure 50:
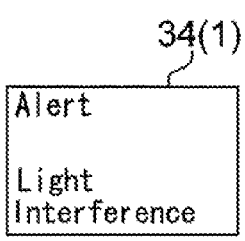
FIG. 50 is a diagram for explaining that an error due to disturbance light is displayed in the liquid crystal display section of the optical scanning type photoelectric switch.

Further, when disturbance light is detected as described next, it is preferable to display this with letters in the liquid crystal display section 34 of the optical scanning type photoelectric switch 1 as "Alert, Light Interference", as illustrated in FIG. 50.

A method for sensing disturbance light is displayed. When projected light is hit to the object (object M) and reflected thereon, the optical scanning type photoelectric switch 1 measures a distance based upon a time difference t between the light projection timing and the light reception timing, and senses a direction by means of an optical axis number of light received. Further, the optical scanning type photoelectric switch 1 is generally designed to correct the measured distance by means of a light reception intensity so as to enhance the accuracy in sensing the distance. Therefore, when the time difference t between the light projection timing and the light reception timing is within a predetermined range, the light can be regarded as light reflected by the object (object M) and as regular light. In other words, when the time difference t between the light projection timing and the light reception timing is very small, the light can be regarded as disturbance light. Further, also when the time difference t between the light projection timing and the light reception timing is very large, the light can be regarded as disturbance light. Therefore, when the time difference t between the light projection timing and the light reception timing is out of the predetermined range, namely when the time difference t is smaller than the predetermined range or the time difference t is larger than the predetermined range, it is stored into the error history, and an error display is made in the liquid crystal display section 34 of the optical scanning type photoelectric switch 1. Moreover, when the optical scanning type photoelectric switch 1 is provided with an indicator indicating a direction, a direction of disturbance light is preferably displayed with this indicator.

What is problematic in ensuring the safety is the case of the time difference t between the light projection timing and the light reception timing being smaller than the predetermined range, and in this case, in the optical scanning type photoelectric switch 1, it is preferable to execute processing of shifting the output state of the optical scanning type photoelectric switch 1 to the OFF state.

Figure 51:
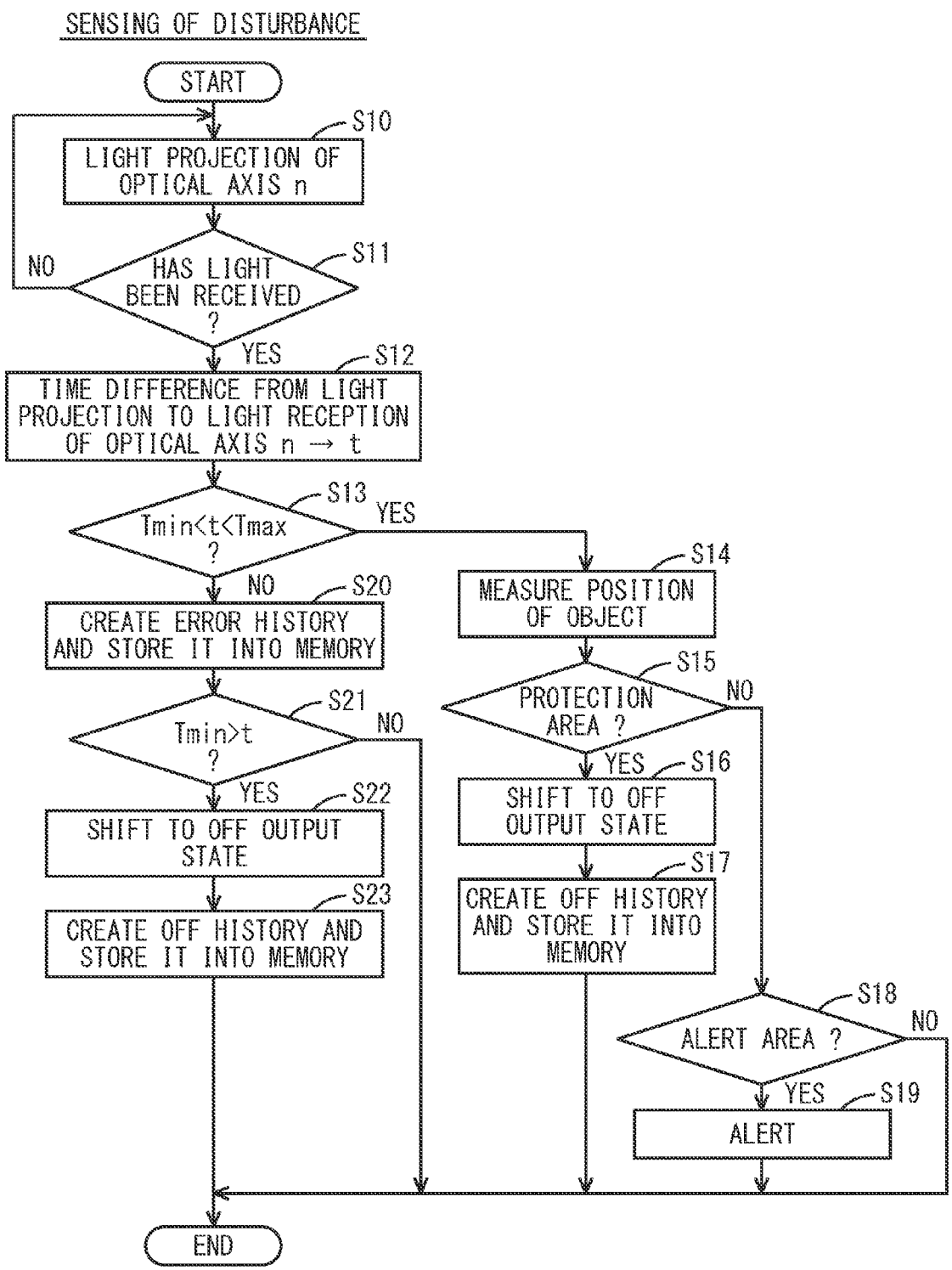
FIG. 51 is a flowchart for explaining a specific technique for sensing disturbance.

FIG. 51 is a flowchart showing an example of a specific technique for sensing disturbance. As described above, light projection is executed in a predetermined period (Step S10), and it is determined whether or not light is received with reference to each optical axis number (Step S11). When light is received, a time difference t from light projection to light reception of a corresponding optical axis number is calculated (Step S12), and it is determined whether or not this time difference t is included in a range between previously set minimum time difference Tmin and maximum time difference Tmax (Step S13). When the determination result is "YES", namely when the actual time difference t is within the predetermined range, the process goes to Step S14, and in the same manner as conventionally done, a position of (distance to) the object (object M) is measured. It is to be noted that the direction of the object (object M) can be defined by the optical axis number, namely light projection time. When the object (object M) is located in the protection area, the process moves from Step S15 to Step S16, where the output of the optical scanning type photoelectric switch 1 is shifted to the OFF state, and in Step S17, an OFF history is created and then stored into the memory 147 (FIG. 43). When the object (object M) is located in the warning area, the process moves from Step S18 to Step S19, where an alert is made to an operator having entered the warning area by, for example, lighting of a red lamp or sounding of an alarm.

In Step S13, when it is determined that the time difference t from light projection to light reception is out of the range between the minimum time difference Tmin and the maximum time difference Tmax, the abnormality is determined. That is, Step S13 constitutes an abnormality determining device, and when the abnormality is determined, the process goes to Step S20, where an error history is created and then stored into the memory 147 (FIG. 43). Further, in Step S21, when the time difference t from light projection to light reception is smaller than the minimum time difference Tmin, this can be regarded as a phenomenon in an area close to the optical scanning type photoelectric switch 1, and is thus considered as having the potential for inhibiting the safety, whereby the process goes to Step S22, where the output of the optical scanning type photoelectric switch 1 is shifted to the OFF state, and in Step S23, an OFF history is created and then stored into the memory 147 (FIG. 43). It is to be noted that in Step S13, when the abnormality is determined in Step S13, a display indicating the abnormality is made in the liquid crystal display section 34 (FIG. 50).

By referring to the error history and the OFF history, the user can determine with a sharp distinction whether a cause of occurrence of the problem is a temporary factor (e.g. dust) or a continuous factor (disturbance light). When the cause is regarded as disturbance light, the direction can be specified by displaying the OFF history and the error history as detailed disturbance information by means of the external personal computer PC, and hence an angle or a height at which the optical scanning type photoelectric switch 1 is installed can be changed, so as to deal with the problem.

Figure 52:
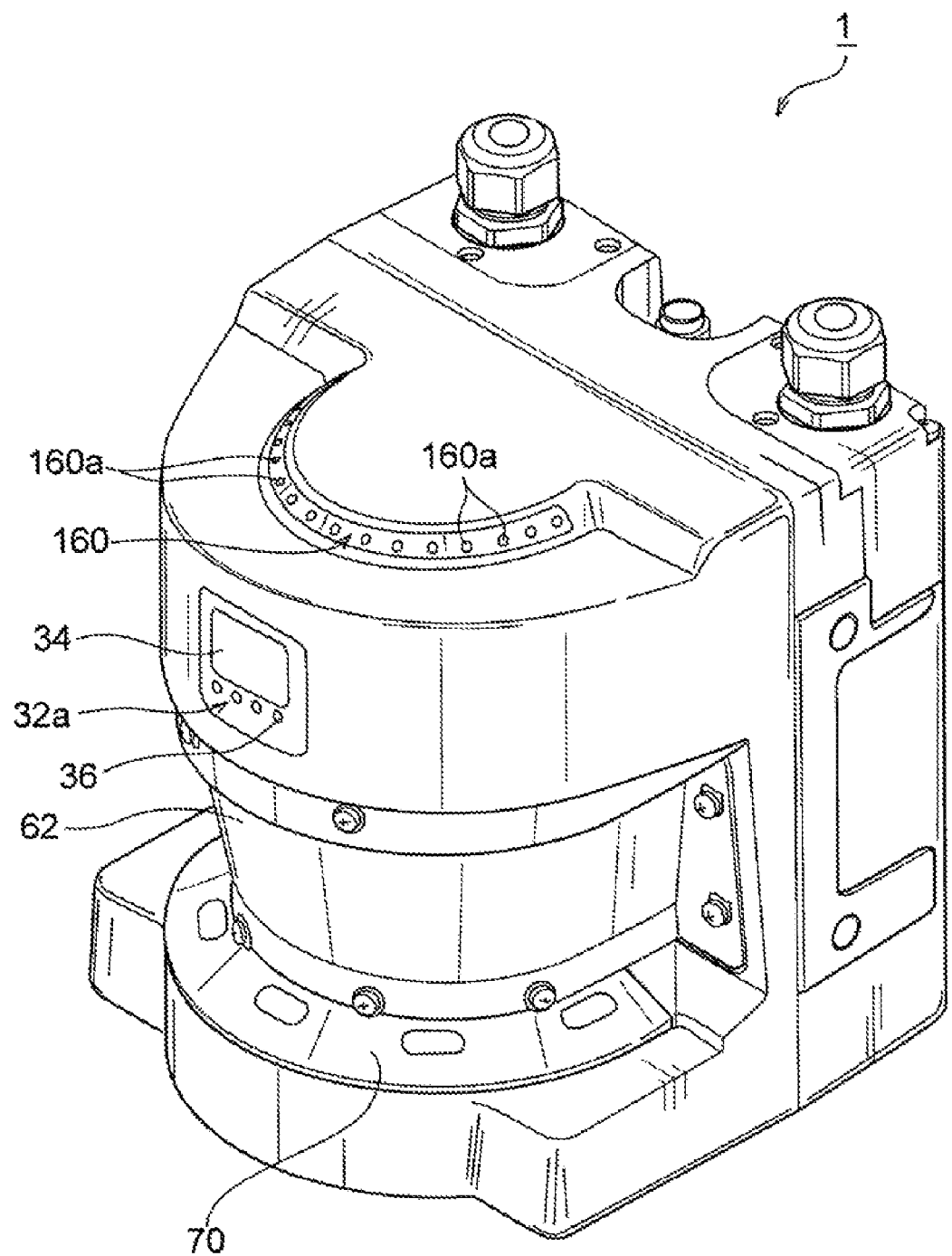
FIG. 52 is a view showing an example where an indicator indicating a direction of disturbance is installed in the optical scanning type photoelectric switch.

As described with reference to FIG. 50, with the liquid crystal display section 34 provided in the optical scanning type photoelectric switch 1, an error display can be made using the liquid crystal display section 34, and when looking at the display and finding it necessary, the user can conduct an analysis of disturbance light by means of the external personal computer PC. However, as illustrated in FIG. 52, a direction indicator 160 capable of indicating a direction is provided in the optical scanning type photoelectric switch 1, and the direction of the cause of the problem may be indicated using this direction indicator 160. In this regard, on the top of the optical scanning type photoelectric switch 1 illustrated in FIG. 52, a plurality of LEDs 160a are equally spaced in arc shape, which are capable of indicating the direction of the cause of the problem by lighting the LED indicator 160 that agrees with the direction.

Specific Adjustment Procedure for Detection Sensitivity Holding/Adjusting Mechanism of Optical Scanning Type Photoelectric Switch 1:

With reference to FIGS. 9 to 12, the foregoing detection sensitivity holding/adjusting mechanism is specifically described. This detection sensitivity holding/adjusting mechanism includes as reference objects two first and second reflection surfaces 73, 74 with different reflection factors inside the optical scanning type photoelectric switch 1. The optical scanning type photoelectric switch 1 has been adopted with such a configuration where the first and second reflection surfaces 73, 74 as the reference objects are arranged in an invalid range, namely a range other than the measurement area, in the rotation of the scanning mirror 14, and thereby a light projection path, a light reception path, a laser light source LD and a light receiving element (photoelectric conversion element) 22, which are used for scanning in the measurement area, are shared. It is therefore possible, by projecting light to the reference objects (first and second reflection surfaces 73, 74) in the invalid rotation range, other than the measurement area, of the scanning mirror 14 and monitoring light reception signal information thereby obtained, to verify deterioration in detection sensitivity of the optical scanning type photoelectric switch 1.

At the time of shipment of the optical scanning type photoelectric switch 1 from a factory, a light projection intensity and/or a light reception gain are adjusted such that an optimal detection sensitivity that can satisfy a product application is obtained when a scanning range where the light transmitting cover 62 is not sensed, namely the first and second reflection surfaces 73, 74, is scanned with pulse-shaped laser light. In a state where this adjustment has been completed, for example when a light reception intensity is "600" at the time of light projection to an optical axis number of "60" (this optical axis number "60" corresponds to an optical axis number at the time of light projection to the second reflection surface (white) 74), the light reception intensity "600" of the optical axis number 60 is stored into the memory 147 (FIG. 43). Further, for example when a light reception intensity is "100" at the time of light projection to an optical axis number of "10" (this optical axis number "10" corresponds to an optical axis number at the time of light projection to the first reflection surface (black) 73), the light reception intensity "100" of the optical axis number 10 is stored into the memory 147 (FIG. 43).

Figure 53:
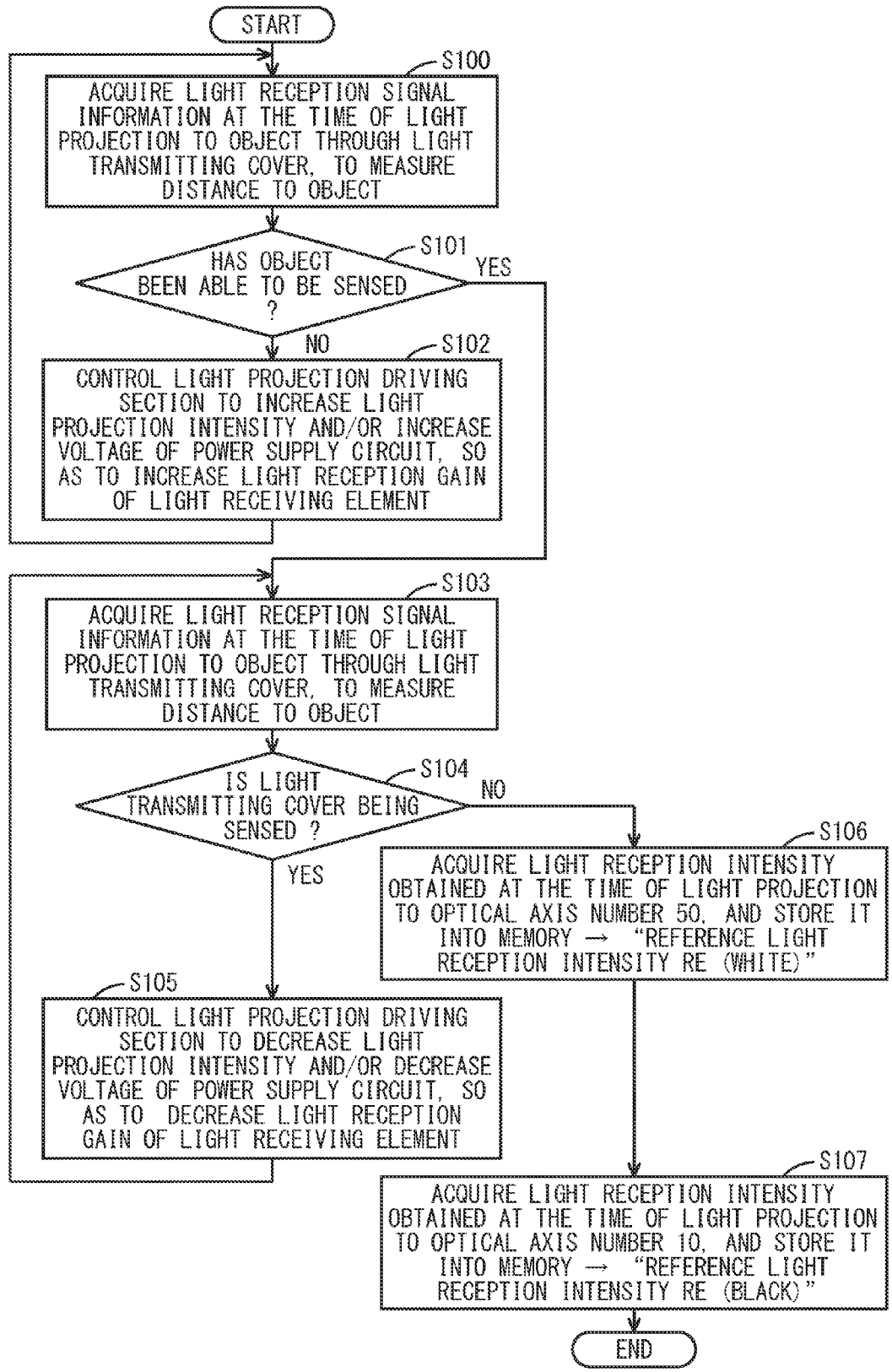
FIG. 53 is a flowchart for explaining a procedure for autonomously holding a detection sensitivity by means of a reference object built in the optical scanning type photoelectric switch, and storing a reference light reception intensity, required when contamination or the like of the reference object is regarded as a failure of the optical scanning type photoelectric switch, into a memory in factory shipment.

The above procedure at the time of factory shipment is described based upon FIG. 53. First, in Step S100, light reception signal information, which is obtained when pulse laser light is projected to an object through the light transmitting cover 62, is acquired, and the distance to the object is measured. Then in Step S101, it is determined whether or not the object can be sensed. When the determination result is "NO", the process goes to Step S102, where the light projection driving section 150 (FIG. 43) is controlled to increase a light projection intensity and/or increase a voltage of the power supply circuit 152 (FIG. 43), so as to increase a light reception gain of the light receiving element 22, and the process again goes to Step S100, where the distance to the object is measured based upon the light projection intensity and/or the light reception gain after the adjustment. When it is determined in Step S101 that the object has been sensed, the process goes to Step S103, where light reception signal information, which is obtained when pulse laser light is projected to the object through the light transmitting cover 62, is acquired, and the distance to the object is measured.

In next Step S104, it is determined whether or not the light transmitting cover 62 has been sensed, and when the determination result is "YES" in Step S104, the light projection driving section 150 (FIG. 43) is controlled to decrease the light projection intensity and/or decrease the voltage of the power supply circuit 152 (FIG. 43), so as to decrease the light reception gain of the light receiving element 22, and thereafter, the process goes to Step S103, where the distance to the object is measured based upon the light projection intensity and/or the light reception gain after the adjustment. When sensing of the light transmitting cover 62 is not recognized in Step S104, it is considered that the light projection intensity and light reception gain have been able to be adjusted to optimal values, and the process goes to Step S106, where a light reception intensity at the time of light projection to the white second reflection surface 74 (referred to as "reference light reception intensity RE (white)" is stored into the memory 147 (FIG. 43). Further, in next Step S107, a light reception intensity at the time of light projection to the black first reflection surface 73 as another reference object (referred to as "reference light reception intensity RE (black)") is stored into the memory 147 (FIG. 43).

Figure 54:
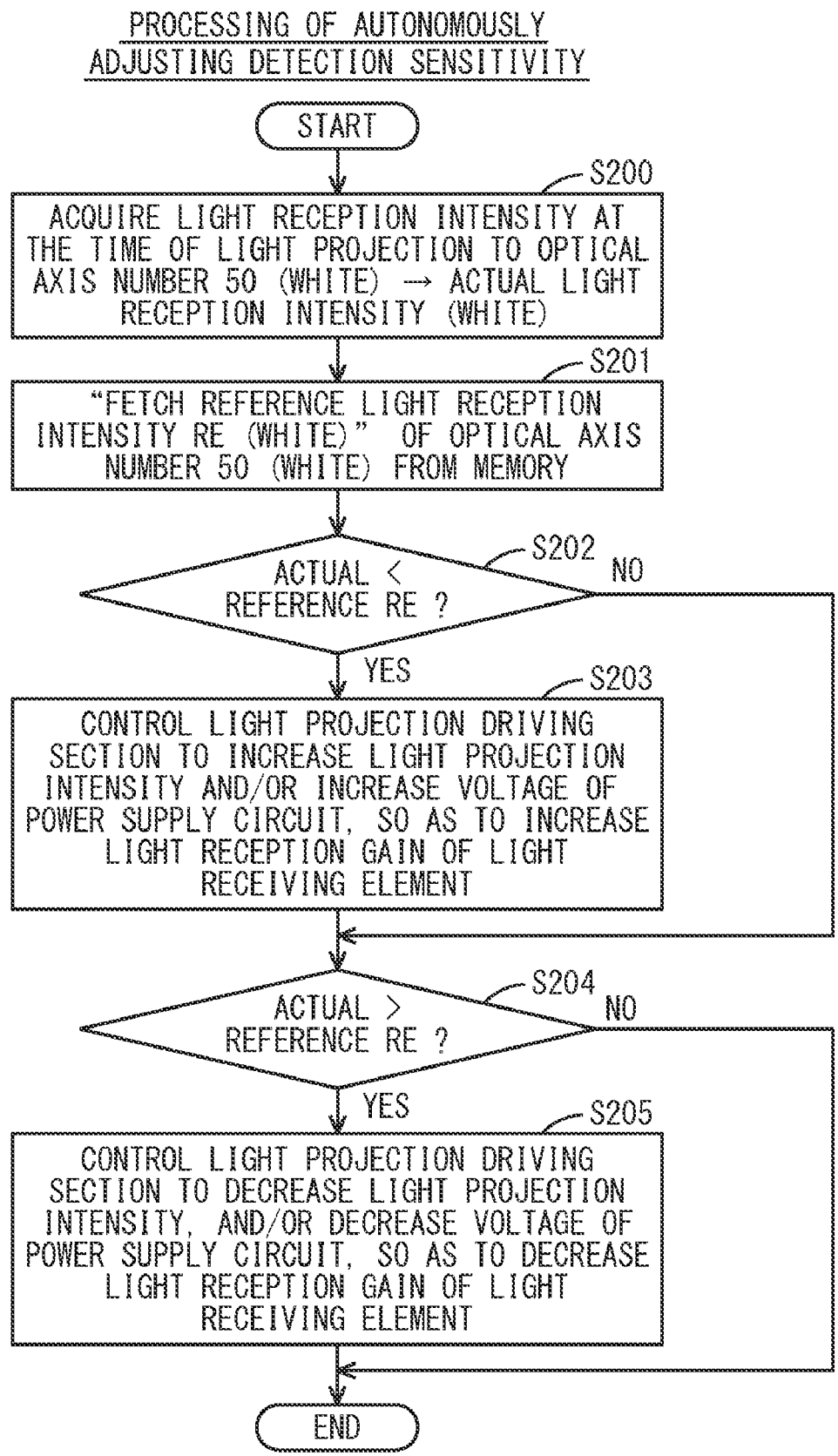
FIG. 54 is a flowchart for explaining a processing procedure for autonomously holding the detection sensitivity of the optical scanning type photoelectric switch by means of the reference light reception intensity stored into the memory by the procedure of FIG. 53.

Described above is the procedure before factory shipment. Next, a procedure for the optical scanning type photoelectric switch 1 automatically adjusting a detection sensitivity is described based upon FIG. 54. First, in Step S200, a light reception intensity, obtained at the time of light projection to an optical axis number 50 (the white second reflection surface 74 (FIG. 12)), is acquired. This light reception intensity can be acquired through an A/D converter 154 (FIG. 43) constituting a light receiving section. This acquired light reception intensity is referred to as "actual light reception intensity (white)". The "reference light reception intensity RE (white)" is then fetched from the memory section 147 (Step S201), and in next Step S202, it is determined whether or not the "actual light reception intensity (white)" is smaller than the "reference light reception intensity RE (white)". When it is discriminated as "YES" in Step S202, the "actual light reception intensity (white)" is considered to have decreased, and the process goes to Step S203, where the light projection driving section 150 (FIG. 43) is controlled to increase the light projection intensity and/or increase the voltage of the power supply circuit 152 (FIG. 43), so as to increase the light reception gain of the light receiving element 22. In next Step S204, it is determined whether or not the "actual light reception intensity (white)" is larger than the "reference light reception intensity RE (white)". When it is determined "YES", the "actual light reception intensity (white)" is considered to have become high, and the process goes to Step S205, where the light projection driving section 150 (FIG. 43) is controlled to decrease the light projection intensity and/or decrease the voltage of the power supply circuit 152 (FIG. 43), so as to decrease the light reception gain of the light receiving element 22.

Figure 55:
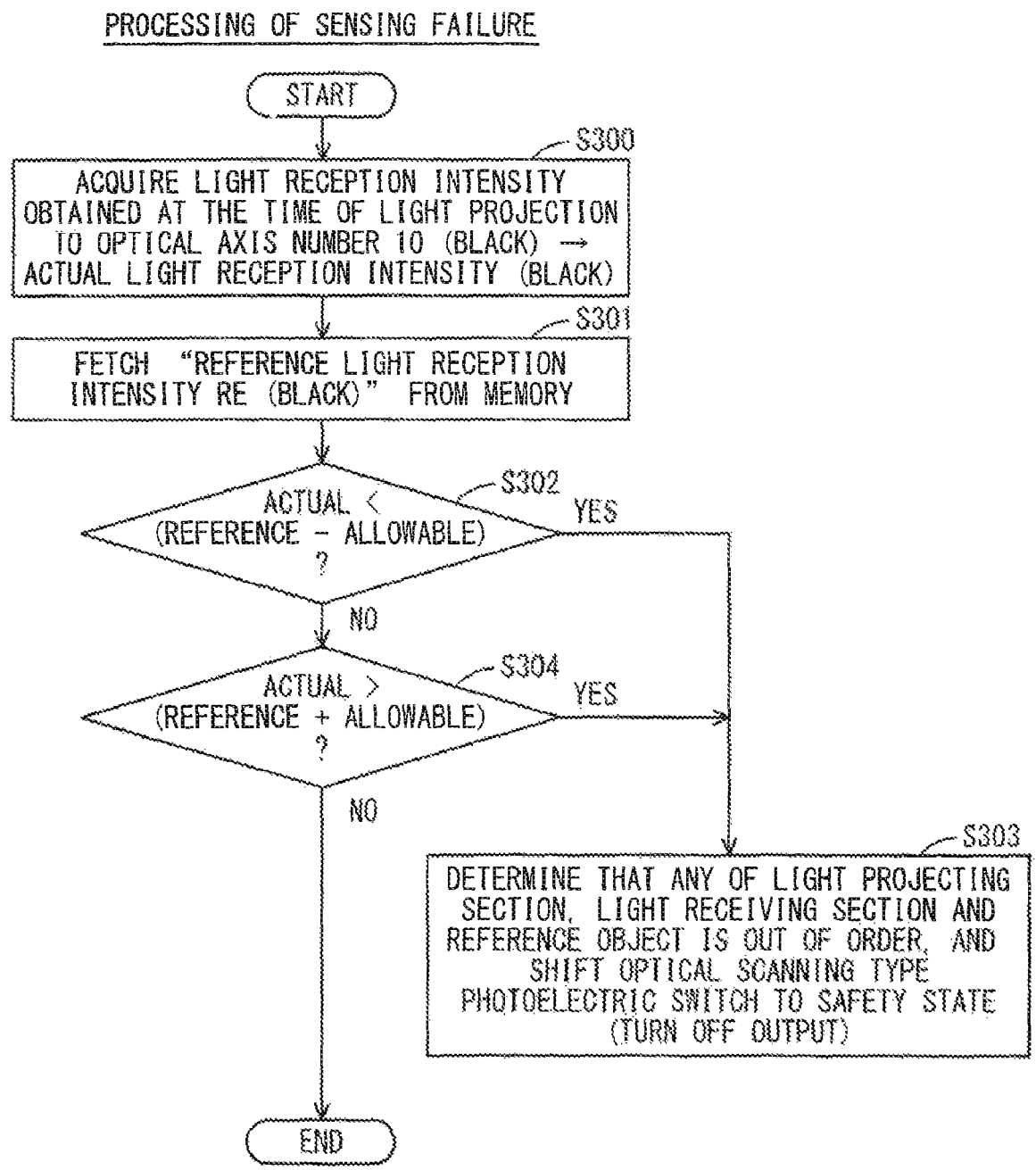

Next, a procedure for the optical scanning type photoelectric switch 1 automatically sensing a failure is described based upon FIG. 55. First, in Step S300, a light reception intensity, obtained at the time of light projection to the optical axis number 10 (the black first reflection surface 73 (FIG. 12)), is acquired. This light reception intensity can be acquired through the A/D converter 154 (FIG. 43) constituting the light receiving section. This acquired light reception intensity is referred to as "actual light reception intensity (black)". The "reference light reception intensity RE (black)" is then fetched from the memory section 147 (Step S301), and in next Step S302, it is determined whether or not the "actual light reception intensity (black)" is smaller than the "reference light reception intensity RE (black)–allowable value". When it is discriminated as "YES" in Step S302, the "actual light reception intensity (black)" is considered to have extremely decreased, and the process goes to Step S303, where the optical scanning type photoelectric switch 1 is determined to be out of order, and is thus shifted to a safety state. A typical processing for this safety state is processing of turning OFF the output of the optical scanning type photoelectric switch 1. Further, also when the "actual light reception intensity (black)" is larger than the "reference light reception intensity RE (black)+allowable value", the processing moves from Step S204 to Step S303, where the optical scanning type photoelectric switch 1 is determined to be out of order, and is thus shifted to the safety state.

What is claimed is:

1. An optical scanning type photoelectric switch, which performs two-dimensional scanning with light projection pulse to detect an object, and also measures a distance to the object to sense a two-dimensional position of the object, the switch having;
    a storage device for accepting and storing a change in a light projection period of the light projection pulse, a scanning period for scanning with the light projection pulse or a phase of the light projection pulse with respect to the light projection period;
    a light projection/reception controlling device for controlling light projection/reception based upon the light projection period or the scanning period stored in the storage device; and
    a safety signal output controlling device for switching a safety signal from a permission signal to a non-permission signal when light reflected by the object is received and it is determined that a position of the object is inside a protection area based on at least two scannings in succession.

2. The optical scanning type photoelectric switch according to claim 1, wherein the light projection pulse has a predetermined pulse width, and the light projection period or the scanning period is changed without changing the pulse width of the light projection pulse.

3. The optical scanning type photoelectric switch according to claim 1, further having
    a scanning mirror rotation speed controlling device for controlling a rotation speed of a scanning mirror for performing two-dimensional scanning with the light projection pulse,
    wherein the light projection period is changed by changing the rotation speed of the scanning mirror.

4. The optical scanning type photoelectric switch according to claim 1, further having
    an interference sensing device for sensing interference with another optical scanning type photoelectric switch,
    wherein the light projection period or the scanning period is changed when the interference is sensed by the interference sensing device.

5. The optical scanning type photoelectric switch according to claim 4, wherein the interference sensing device senses the interference with another optical scanning type photoelectric switch by determining occurrence of the interference when a time difference between a light projection timing and a light reception timing of the light projection pulse is out of a predetermined range and is smaller than a minimum value of a time difference which defines the predetermined range.

6. The optical scanning type photoelectric switch according to claim 1, wherein
    light projection periods of a plurality of light projection pulses, scanning periods for scanning with the light projection pulses or phases of the light projection pulses with respect to the light projection periods are stored into the storage device, and
    upon acceptance of an input for changing a setting from the outside, the light projection period of the light projection pulse, the scanning period for scanning with the light projection pulse or the phase of the light projection pulse with respect to the light projection period is changed.

* * * * *